(12) United States Patent
Aoki et al.

(10) Patent No.: US 6,707,529 B1
(45) Date of Patent: Mar. 16, 2004

(54) EXPOSURE METHOD AND APPARATUS

(75) Inventors: Takashi Aoki, Chiyoda-ku (JP);
Naomasa Shiraishi, Chiyoda-ku (JP);
Soichi Owa, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/913,328

(22) PCT Filed: Feb. 8, 2000

(86) PCT No.: PCT/JP00/00676
§ 371 (c)(1),
(2), (4) Date: Oct. 15, 2001

(87) PCT Pub. No.: WO00/48237
PCT Pub. Date: Aug. 17, 2000

(30) Foreign Application Priority Data

Feb. 12, 1999 (JP) ............................. 11/34897

(51) Int. Cl.⁷ ........................ G03B 27/52; G03B 27/42
(52) U.S. Cl. .......................... 355/30; 355/53
(58) Field of Search ................. 355/53, 67, 69–71, 355/30

(56) References Cited

U.S. PATENT DOCUMENTS

| | | | |
|---|---|---|---|
| 4,690,528 A | | 9/1987 | Tanimoto et al. |
| 4,825,453 A | * | 4/1989 | Kembo et al. ............... 378/34 |
| 5,425,045 A | | 6/1995 | Hamatani |
| 5,430,303 A | | 7/1995 | Matsumoto et al. |
| 5,559,584 A | * | 9/1996 | Miyaji et al. ............... 355/73 |
| 5,696,623 A | | 12/1997 | Fujie et al. |
| 6,208,406 B1 | | 3/2001 | Nakashima |
| 6,222,610 B1 | | 4/2001 | Hagiwara et al. |
| 6,252,648 B1 | * | 6/2001 | Hase et al. ............... 355/53 |
| 6,335,787 B1 | * | 1/2002 | Nishi ....................... 355/87 |
| 2002/0033943 A1 | | 3/2002 | Ishii |

FOREIGN PATENT DOCUMENTS

| | | | |
|---|---|---|---|
| JP | 61-79228 | * | 4/1986 |
| JP | 61-136227 A | | 6/1986 |
| JP | 62-286226 A | | 12/1987 |
| JP | 62-286226 | | 12/1987 |
| JP | 9-162117 A | | 6/1997 |
| JP | 9-162117 | | 6/1997 |
| JP | 10-284410 A | | 10/1998 |
| WO | WO 99/25010 A1 | | 5/1999 |

OTHER PUBLICATIONS

International Preliminary Examination Report for International Application No. PCT/JP00/00676 (Apr. 24, 2001).

* cited by examiner

Primary Examiner—Henry Hung Nguyen
(74) Attorney, Agent, or Firm—Oliff & Berridge PLC

(57) ABSTRACT

An exposure apparatus having an illumination system which applies an exposure energy beam to a mask on which a pattern for transfer is formed, and a stage system for positioning a substrate to which the pattern of the mask is transferred, is characterized in that: a gas supply apparatus for supplying a gas of a high transmittivity with respect to the exposure energy beam, and having good thermal conductivity, to at least a portion of an optical path of the exposure energy blam, and a gas recovery apparatus for recovering at least a portion of the gas after the gas is supplied to the optical path of the exposure energy beam from the gas supply apparatus, are provided.

44 Claims, 10 Drawing Sheets

EXPOSURE METHOD AND APPARATUS

TECHNOLOGICAL FIELD

The present invention relates to an exposure apparatus, an apparatus for manufacturing devices, and a method of manufacturing exposure apparatuses, which are employed in transferring a mask pattern onto a substrate in a lithography process for producing microdevices such as, for example, semiconductor elements, liquid crystal display elements, image pickup elements, or thin film magnetic heads or the like, and are preferably employed when exposure light in the ultraviolet band having a wavelength of approximately 400 nm or less, and particularly when exposure light of the vacuum ultraviolet (VUV) band having a wavelength of 200 nm or less, is employed.

BACKGROUND ART

In exposure apparatuses such as steppers or the like which are employed, for example, in the manufacture of semiconductor devices, in order to provide an increase in the degree of integration or minuteness of the semiconductor devices, an increase in resolution is particularly necessary. This resolution is essentially proportional to the wavelength of the exposure light, so that conventionally the wavelengths of the exposure light were progressively shortened. That is to say, the exposure light employed changed from the g line in the visible band of mercury lamps (wavelength 436 nm) to the i line in the ultraviolet band (wavelength 365 mn), and recently, KrF excimer laser light (wavelength 248 nm) has come to be employed. Additionally, presently, ArF excimer laser light (wavelength 193 nm), $F_2$ laser light (wavelength 157 nm) and $Ar_2$ laser light (wavelength 126 nm) are being considered for use. Furthermore, in conventional X-ray lithography research, the use of light having wavelengths of 13 nm, 11 nm, or 7 nm, which are in the so-called extreme ultraviolet (EUV or XUV) band and are close to X-rays, and the use of X-rays having a wavelength of approximately 1 nm, has been considered.

However, when wavelength bands of less than approximately that of ArF excimer lasers, that is to say, the vacuum ultraviolet band (VUV) of approximately 200 nm or less, are employed, absorption occurs as a result of the oxygen in the air, and ozone is produced, and transmittivity declines. In exposure apparatuses which employ ArF excimer laser light, for example, the majority of the gas in the optical path of the exposure light is replaced by nitrogen, so that the so-called nitrogen purge is conducted. Furthermore, at wavelength bands of less than approximately that of the $F_2$ laser, absorption occurs even with nitrogen. In this case, if the region of nitrogen passage is an extremely narrow region, the amount of absorption is slight, and no obstacle is presented to exposure; however, with a long optical path, the amount of light is reduced, and proper amounts of exposure can not be obtained. When light in a wavelength band shorter than the wavelength of the ArF excimer laser (less than approximately 190 nm) and particularly when light in the wavelength band of less than approximately the wavelength of the $F_2$ laser, is employed, then it is necessary either to replace the majority of gas of the optical path of the light with another gas which allows transmission of light (an inert gas other than nitrogen), or to provide a vacuum.

On the other hand, when the exposure light passes an illumination optical system or optical elements, such as lenses and mirrors, within a projection optical system, then there is absorption of the beat energy by these optical elements as well. When the optical elements experience thermal expansion as a result of the heat energy absorbed in this way, this leads to degradation in image formation characteristic, such as changes in magnification, focal shift displacement, or the like. In order to prevent this degradation in image formation characteristic, conventionally, waste heat treatment was conducted, in which temperature controlling gases were caused to flow in predetermined spaces between lenses, and the side surfaces of lenses or the rear surfaces of mirror or the like were subjected to air cooling or liquid cooling, Recently, requirements have also increased with respect to stability of the image formation characteristic, so that an even higher level of treatment is required with respect to this waste heat treatment as well.

As described above, in exposure apparatuses, when exposure light in a wavelength band of approximately 190 nm or less is employed, it is desirable that the gas of the majority of the optical path be replaced with a gas having an absorption ratio smaller than nitrogen, or that this be made a vacuum. However, when the latter is done and the majority of the optical path is made into a vacuum, the manufacturing costs of the exposure apparatus increase, and the throughput of the exposure apparatus declines. Furthermore, in the exposure apparatus, it is desired that the heat energy of the exposure light be more efficiently exhausted.

In order to simultaneously address these problems, a gas may be supplied to the majority of the optical path of the exposure light, which gas is inert and has a high transmittivity and has good thermal conductivity (in other words, has a low atomic weight), and which is temperature controlled. Currently, the most highly functional gas for use as this type of inert gas having good thermal conductivity, and which is moreover stable, is helium (He). However, helium is present in the earth's crust and in the atmosphere at an extremely low rate, and is high in cost, so that as the amount thereof used increases, the operational cost of the exposure apparatus rise greatly, and this is undesirable. Furthermore, because helium has a low atomic weight, it tends to leak from the gaps in the cover and the like which enclose the optical path of the exposure apparatus, and this presents a problem in that if helium is simply circulated within the cover, the amount of helium progressively decreases.

In view of these points, the present invention has as an object thereof to provide an exposure apparatus and a apparatus for manufacturing devices which, in the case in which a gas having a high transmittivity (inert) and having good thermal conductivity is supplied to at least a portion of an optical path of an exposure energy beam (exposure light), are capable of controlling the amount of this gas which is employed.

Furthermore, as described above, in the exposure apparatus, when exposure light having a wavelength of approximately 200 nm or less is employed, if the optical path of the exposure light is not made into a vacuum, it is necessary to replace the majority of the optical path of the exposure light with a gas having good transmittivity (such as nitrogen or the like). Furthermore, even where the wavelength is within a range of 250–200 nm, in order to obtain good transmittivity, it is desirable that the optical path of the exposure light be replaced with nitrogen or the like.

In connection with this, because the exposure apparatus is usually stored within a box shaped chamber having good airtightness and in order to conduct the positioning of reticles or wafers or the like in a highly precise manner in the exposure apparatus, a stage system, in which movement is conducted along a guide surface in the manner of an air bearing without contact, is provided. For this reason, when this type of stage system is employed, the compressed air sprayed along the guide surface leaks out into the chamber, and this air mixes with the gas having good transmittivity, such as nitrogen or the like, of the optical path of the exposure light, so that a problem is caused in that the transmittivity with respect to the exposure light progressively decreases. When the transmittivity decreases in this manner, the illumination intensity on the wafer decreases, so that in order to obtain the proper amount of exposure, it is necessary to lengthen the exposure period, and thus the throughput of the exposure process declines in an undesirable manner.

Furthermore, in the exposure apparatus, in addition to the stage system, equipment is provided for conducting positioning or vibration isolation or the like using air; there is also a danger that this air generated by this equipment will cause a decrease in the transmittivity of the exposure light.

In view of these points, the present invention has as an object thereof to provide an exposure apparatus which, in the case in which a predetermined gas having a high transmittivity is supplied to at least a portion of the optical path of an exposure energy beam (exposure light), is capable of guiding this exposure energy beam to the substrate which is the object of exposure such as a wafer or the like with a high use efficiency.

Furthermore, when conducting various exposure experiments by means of a projection exposure apparatus having a comparatively large field size using an excimer laser light source, the present inventors discovered a novel phenomenon, in which, by means of the application of illumination light in an ultraviolet wavelength band of, for example, 350 nm or less (a KrF exposure excimer laser having a wavelength of 248 nm, or a ArF excimer laser having a wavelength of 193 nm, or the like), the transmittivity or reflectivity of the optical elements or coating materials of the optical elements (for example, thin films such as reflection prevention films or the like) within the projection optical system varied dynamically. It has been made clear that this phenomenon of the dynamic flotation of transmittivity can be generated not merely with respect to the optical elements within the projection optical system, but also with respect to the optical elements or reticles (silica plates) themselves within the illumination optical system which illuminates the reticule or within the light transmission system which conveys the illumination light emitted from a light source positioned beneath the floor of the clean room to the illumination optical system within the exposure apparatus itself. In the present specification the term illumination optical system includes the light transmission system.

Such a phenomenon is thought to be produced when impurities contained within the gas (air, nitrogen gas, or the like) present in spaces within the projection optical path or the illumination optical path, molecules of organic matter generated by filler material or adhesives used to affix the optical elements to the barrel, or impurities (for example, water molecules, hydrocarbon molecules, or other substances which scatter the illumination light) generated from the inner wall of the barrel (the coated surface for preventing reflection or the like), are deposited on the surface of the optical elements, or enter into the illumination optical path (float). As a result a serious problem is caused in that the transmittivity or reflectivity of the projection optical system or illumination optical system can vary greatly within a comparatively short period of time.

It is an object of the present invention to provide a protection exposure apparatus which supports optical elements such as lenses or reflection mirrors or the like which comprise the projection optical system or illumination optical system without the use of adhesives or fillers.

DISCLOSURE OF THE INVENTION

The exposure apparatus in accordance with the present invention is, in an exposure apparatus having an illumination system (3, 11, 13, 14, 17–19) for applying an exposure energy beam to a mask forming a pattern for transfer, and a stage system (20–24) which positions a substrate to which the mask pattern is to be transferred, a gas supply apparatus (31, 43, 46) which supplies a gas having a high transmittivity with respect to the exposure energy beam and having good thermal conductivity to at least a portion of the optical path of the exposure energy beam, and a gas recovery apparatus (33–37, 41, 42) which recovers at least a portion of the gas dispersed after being supplied to the optical path of the exposure energy beam from the gas supply apparatus, are provided In accordance with this present invention, because it is possible to recover and reuse (recycle) a portion of the gas supplied to the optical path, it is possible to control the amount of this gas employed. Accordingly, the operational costs decrease when the gas is high in cost.

In this case, an example of the gas is helium (He). Helium is safe and has a high transmittivity even when exposure light of the wavelength band of 150 nm or less is employed, and because the thermal conductivity thereof is high, being approximately 6 times that of nitrogen ($N_2$), the cooling effect with respect to the optical element is high.

Furthermore, where the gas recovery apparatus recovers, for example, helium dispersed in the air, it is possible to separate the helium by processing the oxygen present in the mixed gas using an oxygen adsorbing material, and cooling the nitrogen, so that the remaining helium may be recovered. Alternatively, by cooling the mixed gas to the temperature of liquid air, and removing the liquid which is generated, it is easily possible to recover only the helium which remains in a gaseous state.

Furthermore, it is desirable that the gas recovery apparatus, be employed in common with a plurality of exposure apparatuses. By means of this, the equipment costs of the gas recovery apparatus are reduced.

Furthermore, it is desirable that the gas recovered by the gas recovery apparatus be recirculated to the optical path of the exposure energy beam via at least a portion (31, 43) of the gas supply apparatus.

Furthermore, the gas supply apparatus has, as one example, a concentration meter (44) for measuring the density of the gas supplied from the gas recovery system, a gas source (46) with the gas sealed therein in a gaseous state or in a liquid state, and control units (43, 45, 48) which supplement the gas supplied from the gas recovery apparatus with gas from the gas source (46) in accordance with the results of the measurement of the concentration meter. These control units supply gas from the gas source when the density of the gas measured by the concentration meter becomes lower than a predetermined allowable level. By means of this, the gas within the gas source is not used wastefully.

Furthermore, this gas supply apparatus is provided with, as an alternative example, a gas source (46) which conducts the liquid storage or high pressure storage of gas, a conversion apparatus which returns the liquid gas or high pressure gas within the gas source to a gaseous state, and an adjusting apparatus (43) which regulates the temperature and pressure of the gas from the gas source prior to its supply to the exposure apparatus. By means of this it is possible to store a large amount of the gas in a small space.

Furthermore, it is desirable that the gas recovery apparatus store the recovered gas in a liquefied or high pressure form. By means of this, it is possible to store a large amount of the gas in a small space.

Furthermore, the device manufacturing apparatus in accordance with the present invention is provided with a plurality of exposure apparatuses, including exposure apparatuses in accordance with the present invention, and using this plurality of exposure apparatuses, transfers a plurality of device patterns onto a substrate which is the object of exposure in an overlapping manner, producing microdevices. In this case, as well, the amount of gas employed can be controlled.

The exposure apparatus in accordance with the present invention is an exposure apparatus which illuminates a mask (R) with a predetermined energy beam, and transfers the pattern formed in this mask to a substrate (W), wherein a gas-controlled drive apparatus (123, 125A) which conducts predetermined operations (positioning, vibration isolation, and the like) using a first gas for control is provided, and a second gas having good transmittivity is supplied to at least a portion of the optical path of the exposure energy beam, and a gas of the same type as the second gas is employed as the first gas of the gas-controlled drive apparatus.

In accordance with this invention, the gas which is exhausted when the gas-controlled drive apparatus is driven is a gas of the same type as the second gas having good transmittivity with respect to the exposure energy beam, so that the concentration of the second gas supplied to the optical path of the exposure energy beam progressively decreases. Accordingly, the progressive decrease in the transmittivity with respect to the exposure energy beam is eliminated, and it is possible to guide the exposure energy beam to the substrate with a high efficiency of use.

In this case, an example of this gas-controlled drive apparatus is a stage apparatus (123) which makes contact with the guide surface in the form of a gas bearing system, a gas type cylinder apparatus, or a vibration isolation platform (125A) employing gas as a portion of the shock absorbing material. The exposure apparatus is normally contained within a box shaped chamber so that when a gas of a type other than the second gas is emitted from the gas-controlled drive apparatus the transmittivity of the exposure energy beam within the chamber progressively decreases; however, in accordance with the present invention a decrease in the transmittivity of the exposure energy beam within the chamber is prevented.

Furthermore, when the exposure energy beam is ultraviolet light having a wavelength of 250 nm or less, then it is desirable that the second gas be nitrogen ($N_2$) or helium (He). In particular, since the transmittivity of nitrogen is good when the wavelength is from 250 to 200 nm, it is possible to employ low cost nitrogen. Furthermore, these gases are inert, so that fogging materials or the like will not be generated on the surface of the optical elements.

Furthermore, when the exposure energy beam is ultraviolet light having a wavelength of 200 nm or less, it is desirable that the second gas be helium. Helium has high transmittivity with respect to light of such short wavelengths, and additionally has particularly good thermal conductivity, so that its ability to cool the optical elements and the like is high. Furthermore, when, as an example of the wavelength of 200 nm or less, ArF excimer laser light having a wavelength of 193 nm is employed as the exposure energy beam, and a projection optical system comprising a cata-dioptric system is employed, the cata-dioptric system has fewer lenses than a refractive system, and the distance between lenses is greater, so that it is more susceptible to effects of fluctuations in atmospheric pressure. By purging the interior of the projection optical system comprising a cata-dioptric system with helium, which has a considerably smaller degree of change in the index of refraction in response to changes in air pressure, in comparison with nitrogen, it is possible to control the amount of fluctuation in the image forming characteristics at a low level.

Furthermore, when the exposure energy beam is an X-ray (for example, a wavelength within a range of approximately 10 nm–1 nm) then examples of the second gas are nitrogen or helium. Even when X-rays are employed, if the distances are short, the amount of attenuation can be kept at a low level.

The exposure apparatus (projection exposure apparatus) of the present invention is provided with an illumination optical system which applies illumination light from an illumination light source to a mask and which has a plurality of optical elements (9A, 9B, 11 . . . (109A, 109B, 111 . . . )) which are supported by support members, and with a projection optical system (PL) which projects the image of a pattern on a mask (original plate) onto an exposed substrate, which system is provided with a plurality of optical elements (L201, L202 . . . ) which are supported by support members. Additionally, all the optical elements described above arm supported on the support members using press-attachment mechanisms without employing adhesive, and thereby, the objects described above are obtained.

Furthermore, an example of this press-attachment mechanism is a flat spring (261), one end of which is affixed to the inner circumferencial part of the support member (251), and the other end of which presses against the outer circumferencial part of the optical element (L201, L202) at the other end.

Furthermore, another example of this press-attachment mechanism is one in which screwable attachment is conducted to a screw part attached to the inner circumferencial part of the support member (252), and a screw ring (263) is screwably advanced and presses the outer circumferencial part of the optical elements (L120–L205).

Furthermore, an exposure apparatus (projection exposure apparatus) in accordance with the present invention is provided with an illumination optical system (232) which has a plurality of optical elements (204, 205, 206 . . . ) containing fly eye lenses (11, 111) which bundle a plurality of rod lenses (L260) and which applies illumination light from an illumination light source (201) to a mask, as well as with a projection optical system which is provided with a plurality of optical elements (L201, L202, . . . ) which are supported by support members and which projects the image of a pattern on a mask (original plate) onto an exposure substrate. Then, by bundling a plurality of rod lenses (L260) using a support apparatus (280) without the use of an adhesive, the objects described above arm achieve Furthermore, in a manufacturing method for exposure apparatuses in accordance with the present invention, a supply pipe for supplying a gas which reduces attenuation in the exposure energy beam is connected to a gas chamber which seals, in an essentially airtight manner, at least a portion of the optical path of the exposure energy beam, and a recovery pipe which recovers at least a portion of the gas supplied to the gas chamber is connected to at least one of the gas chamber and a housing in which the gas chamber is disposed. Then, the recovery pipe is connected to a removal apparatus which removes impurities from the recovered gas, and the removal apparatus and the supply pipe are connected. Furthermore, the optical elements which the exposure energy beam passes are assembled in the exposure apparatus by being fixed to support members without the use of adhesive. Furthermore, a gas control type drive apparatus which employs a gas having optical characteristics which are essentially the same as those of the gas which is disposed in the exposure apparatus, and a supply source for this gas, are connected.

In accordance with this invention, a portion of the gas supplied to the optical path may be recovered and reused (recycled) so that it is possible to control the amount of this gas which is employed, and it is thus possible to construct an exposure apparatus which makes possible a reduction of operational costs.

In this section disclosing the invention which explains the structure of the present invention, diagrams of the embodiments of the invention are employed in order to facilitate understanding of the present invention; however, the present invention is not limited to these embodiments of the invention.

BRIEF DESCRIPTION OF THE DIAGRAMS

FIG. 10A is a top view of the fly eye lens, while

EMBODIMENTS

Figure 1:
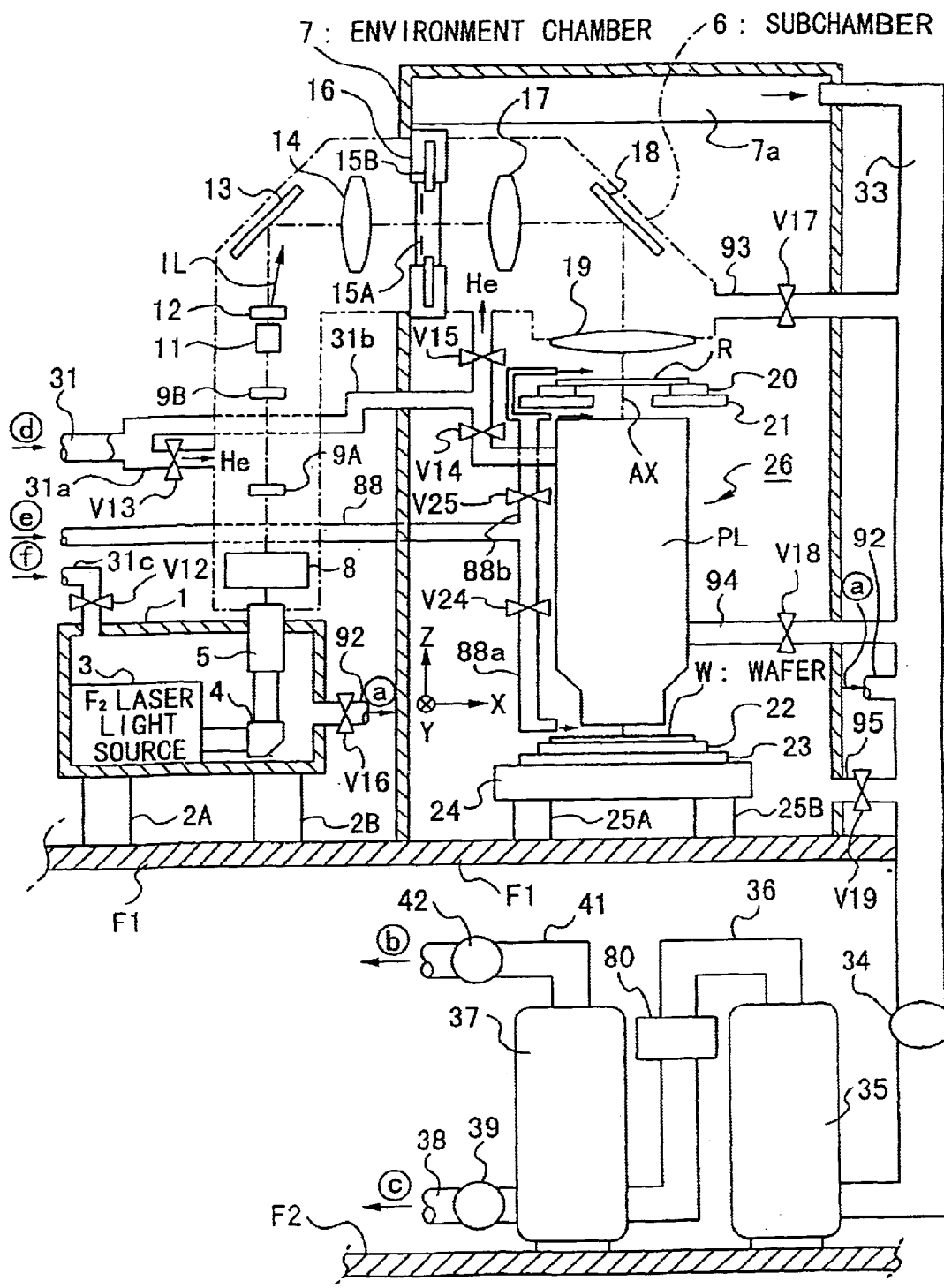
FIG. 1 is a schematic structural view of a projection exposure apparatus in accordance with a first mode of the present invention, wherein a portion has been removed, which shows a portion of the helium circulation apparatus and a portion of the nitrogen circulation apparatus.
Figure 2:
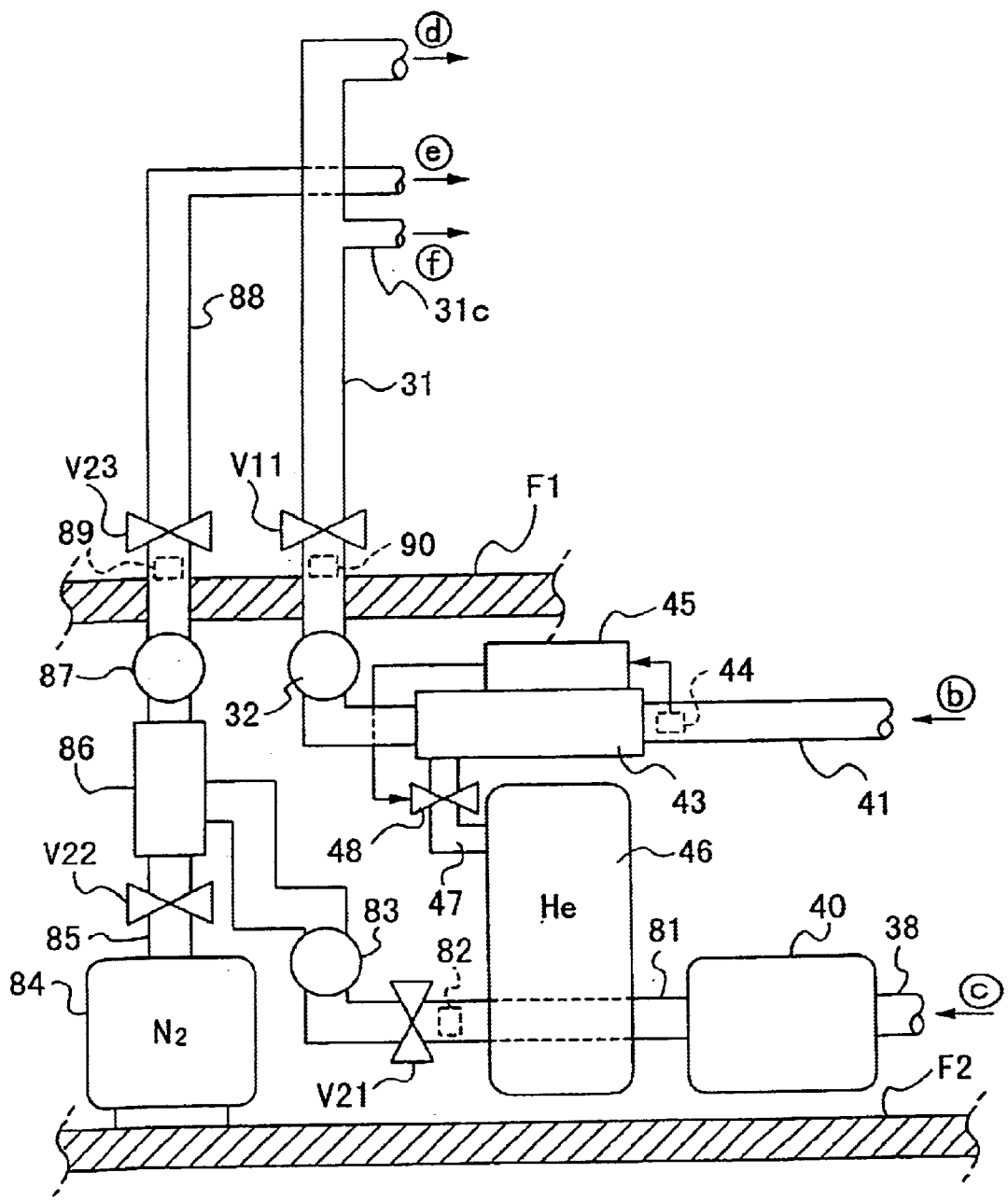
FIG. 2 is a schematic structural view in which a portion has been removed, showing the main parts of the helium circulation apparatus and the nitrogen circulation apparatus in this embodiment.

Hereinbelow, a first embodiment of the present invention will explained with reference to FIGS. 1 and 2. The embodiment is an application of the present invention to a projection exposure apparatus for semiconductor device manufacture wherein helium gas is supplied to the majority of the optical path of the exposure light FIG. 1 shows the outline of the structure of the projection exposure apparatus of this embodiment and a portion of the helium circulation apparatus, while FIG. 2 shows the outline of the structure of the main parts of this helium circulation apparatus; in FIGS. 1 and 2, a projection exposure apparatus is disposed within a clean room on a floor F1 of a certain floor of a semiconductor manufacturing plant, and a helium circulation apparatus, which supplies helium gas to the projection exposure apparatus on the upper floor and furthermore conducts recovery thereof, is installed within a machine chamber (utility space) on a floor F2 of a lower floor. In this way, the apparatus which is likely to give rise to particulate material and to be a source of vibration is installed on a different floor from that on which the projection exposure apparatus is installed, and thereby, it is possible to maintain the degree of cleanliness within the clean room in which the projection exposure apparatus is installed at an extremely high level and it is possible to reduce the effects of vibration with respect to the projection exposure apparatus to an extremely low level.

Helium gas is light and rises easily, so that the helium circulation apparatus of the present embodiment may be positioned at a higher floor than the floor in which the projection exposure apparatus is installed. Furthermore, the supply apparatus described hereinbelow within the helium circulation apparatus is disposed on floor F2, while the recovery apparatus is disposed an floor F1 or a higher floor, and in this way parts of the helium circulation apparatus may be disposed on differing floors.

First, on the floor F1 in the clean room in FIG. 1, a box shaped case 1 is installed via vibration isolation platforms 2A and 2B and a $F_2$ laser light source 3 (oscillation wavelength 157 nm), as an exposure light source, a beam matching unit (BMU) 4 containing a movable mirror for positionally matching the optical path between the exposure main parts, and a pipe 5, which is formed from an optically insulating material and through the interior of which the exposure light passes, are installed within case 1. Furthermore, next to case 1, an environment chamber 7 which is box-shaped and has good airtightness is installed, and a fixed platform 24 is installed within this environment chamber 7 via vibration isolation platforms 25A and 25B which serve to reduce vibration from the floor on floor F1, and exposure main unit 26 is installed on fixed platform 24. Furthermore, a subchamber 6 which has good airtightness and extends from pipe 5 which extends from within case 1 to the interior of environment chamber 7 is installed in a frammg manner, and the majority of the illumination optical system is stored within subchamber 6.

The $F_2$ laser light source 3 may be disposed on the lower floor F2. In this case, the surface area taken up by the projection exposure apparatus (the foot print) within the clean room on floor F1 can be reduced, and it is possible to reduce the effects of vibration to exposure main unit 26.

Furthermore, when a ArF excimer laser light (wavelength 192 nm) or KrF excimer laser light (wavelength 248 nm) or X-rays or the lice are employed as the exposure energy beam (exposure light), as well, when helium or the like is supplied to at least a portion of the optical path of the exposure energy beam, the present invention may be applied. Furthermore, the exposure main unit 26 of the present embodiment is a scanning exposure type, for example, a step and scan type, as explained hereinbelow; however, it is of course the case that the present invention may be applied even if a stepping exposure type, for example, a step and repeat type, is employed.

First, when exposure is conducted, an ultraviolet pulse light IL having a wavelength of 157 nm which serves as the exposure light emitted from the $F_2$ laser light source 3 within case 1 travels through the interior of BMU 4 and pipe 5 and reaches the subchamber 6. In subchamber 6, the ultraviolet pulse light IL passes through a beam forming optical system comprising light reducer 8 as a light attenuator and lens systems 9A and 9B, and is applied to fly eye lens 11. An illumination system aperture stop system 12 for variously altering the illumination conditions is disposed at the plane of exit of fly eye lens 11.

The ultraviolet pulse light IL which is emitted from the fly eye lens 11 and passes through a predetermined aperture diaphragm in the aperture stop system 12 passes a reflection mirror 13 and a condenser lens system 14 and is inputted into a fixed illumination field diaphragm (fixed blind) 15A having a slit shaped opening within a reticule blind mechanism 16. Furthermore, a movable blind 15B which serves to change the width in the scanning direction in the illumination field region is disposed within reticle blind mechanism 16 separately from fixed blind 15A, and by means of this moveable blind 15B, a reduction in the movement stroke in the scanning direction of the reticle stage, and a reduction in the width of the light blocked band of the reticle R, are achieved.

The ultraviolet pulse light IL which is formed in a slit shape by the fixed blind 15A of the reticule blind mechanism 16 passes image forming lens system 17, reflection mirror 18 and main condenser lens system 19, and illuminates at an equal intensity a slit shaped illumination region on the circuit pattern of reticle R. In the present embodiment, the space from the output surface of pipe 5 comprising light insulating material to the main condenser systems 19 is contained within subchamber 6, and furthermore, the space from the inner part of pipe 5 to the output surface of the $F_2$ laser light source 3 is airtight, and communicates with the space within subchamber 6. Furthermore, helium gas (He) which has a specified purity or greater and is temperature controlled is supplied from two points from the helium circulation apparatus into the space within subchamber 6 via branch pipes 31a and 31b of pipe 31. Helium has a low molecular weight and is susceptible to leaking, so that a portion of the helium which naturally leaks out of subchamber 6 rises and collects in the space 7a in the vicinity of the ceiling of the environment chamber 7.

As shown in FIG. 2, an opening and closing valve V11 is provided in pipe 31, and by controlling the opening and closing of the opening and dosing valve V11 by control system 45, it is possible to switch among the supply and cut off of the helium gas to the projection exposure apparatus. Returning to FIG. 1, an opening and closing valve V13 is provided in branch pipe 31a of pipe 31, and an opening and closing valve V14 is provided in branch pipe 31b in the space between it and the projection optical system PL, while an opening and closing valve V15 is provided in branch pipe 31b in the space between it and the illumination optical system (subchamber 6). Furthermore, the temperature controlled helium gas having a prespecified purity or greater is supplied into case 1, which contains the $F_2$ laser light source 3 and BMU 4, via another branch pipe 31c of pipe 31 (see FIG. 2) and opening and closing valve V12. Then, by independently opening and closing the opening and closing valves V12–V15 by means of the control system 45 in FIG. 2, it is possible to supply helium gas into at least one desired destination: case 1, subchamber 6 (illumination optical system) and projection optical system PL.

On the basis of ultraviolet pulse light IL, the circuit pattern within the illumination region of reticle R is illuminated onto the slit shaped exposure region of the resist layer on a wafer W via projection optical system PL. This exposure region is positioned on one shot region within a plurality of shot regions on the wafer. The projection optical system PL in the present embodiment is a dioptric system (refraction system); however, since the glass which is able to transmit ultraviolet light having this type of short wavelength is limited, the projection optical system PL may be made a cata-dioptric system or a reflection system so as to increase the transmittivity of the ultraviolet pulse light IL in the projection optical system PL. In the following, a Z axis is obtained which is parallel to the optical axis AX of the projection optical system PL, and in a plane perpendicular to the Z axis, a X axis will be established which is parallel to the paper surface of FIG. 1, and a Y axis will be established which is perpendicular to the paper surface of FIG. 1.

At this time, reticle R is supported by vacuum on the reticle stage 20, and reticle stage 20 is made moveable at a constant velocity in the X direction (the scanning direction) on reticle base 21, and is installed so as to be capable of slight movements in the X direction, the Y direction, and the rotational direction. The two dimensional position of reticle stage 20 (reticle R) and the rotational angle thereof are controlled by a drive control unit, which is not depicted in the figure, which is provided with a laser interferometer.

On the other hand, wafer W is supported by vacuum on the wafer holder 22, and the wafer holder 22 is affixed to the wafer stage 23, while the wafer stage 23 is positioned on the fixed platform 24. The wafer stage 23 controls the focus position of wafer W (the position in the Z axis) in an auto focus manner, and controls the angle of inclination, so as to bring the surface of wafer W into agreement with the image plane of the projection optical system PL, and conducts the constant velocity scanning of wafer W in the X direction, and stepping in the X and Y directions. The two dimensional position of wafer stage 23 (wafer W) and the rotational angle thereof are controlled by means of a drive control unit which is not depicted in the figure and which is provided with a laser interferometer. During scanning exposure reticle R is scanned at a velocity of Vr in the +X direction (or in the −X direction) with respect to the illumination area of the ultraviolet pulse light IL, via reticle stage 20, and synchronously therewith, this wafer W is scanned in the −X direction (or in the +X direction) at a speed of β·Vr (where β is the projection magnification from reticle R onto wafer W), with respect to the exposure region and via the wafer stage 23.

Furthermore, in the same manner as the interior of subchamber 6, temperature controlled helium gas having a predetermined concentration or greater is supplied to the entirety of the space within the barrel of the projection optical system PL of the present embodiment (the space between the plurality of lens elements), from the helium circulation apparatus in the lower floor and via branch pipe 31b of pipe 31 and opening and closing valve V14. The helium leaking from the barrel of the projection optical system PL rises and collects in the space 7a in the vicinity of the ceiling of the environment chamber 7.

Furthermore, in the present embodiment, temperature and pressure controlled nitrogen gas ($N_2$), the amount of oxygen contained in which is maintained at an extremely low level, is supplied from a nitrogen circulation apparatus (33–40, 82–87, 89, and the like) in a lower floor to the interior of environment chamber 7 via pipe 88. Then, the nitrogen gas circulating in the interior of the environment chamber 7 is recovered in pipe 33 via exhaust holes (not depicted in the figure) in the bottom surface of the environment chamber 7 and via pipe 95 which is connected to the side surface of the environment chamber 7, and the recovered nitrogen gas is returned to the nitrogen circulation apparatus as described hereinbelow. An opening and closing valve V19 is provided in the pipe 95.

In this way, in the present embodiment, helium gas which has a transmittivity with respect to light of 190 nm or less, as well, is supplied to the optical path of the ultraviolet pulse light IL from the output surface of the $F_2$ laser light source 3 to the main condenser lens system 19, as well as to the optical path of the ultraviolet pulse light IL within the projection optical system PL. Furthermore, the spaces from the main condenser lens system 19 to the plane of incidence of the protection optical system PL, and from the output surface of the projection optical system PL to the surface of the wafer W are supplied with nitrogen gas, which does not have very good transmittivity with respect to light of 190 nm or less; however, the optical path which passes through this nitrogen gas is extremely short, so that there is little absorption as a result of the nitrogen gas. Nitrogen gas has a higher transmittivity with respect to light having a wavelength within a range of approximately 200 nm–150 nm in comparison with standard air (which is chiefly oxygen), and nitrogen gas is present in large amounts in the atmosphere, so that it is cheap in comparison with helium gas, so that superior cost performance can be obtained when nitrogen gas is used in the short optical path portion. Accordingly, the ultraviolet pulse light IL which is emitted from the $F_2$ laser light source 3 reaches the surface of wafer W at an overall high transmittivity (efficiency of use), so that it is possible to reduce the exposure period (scanning exposure period) and it is possible to increase the throughput of the exposure process.

Furthermore, helium has a thermal conductivity which is approximately six times that of nitrogen, so that the heat energy which is built up as a result of the application of the ultraviolet pulse light IL at the optical elements within the $F_2$ laser light source 3, the optical elements within the illumination optical system and the optical elements within the projection optical system PL is efficiently transmitted to, respectively, the case 1, the cover of the subchamber 6, and the barrel of the projection optical system PL via the helium gas. Furthermore, the heat energy of this case 1, the cover of the subchamber 6, and the barrel of the projection optical system PL is efficiently exhausted to the exterior, such as lower floors, or like, by temperature controlled air within the clean room or by temperature controlled nitrogen gas within the environment chamber 7. Accordingly, the rise in temperature of the optical elements of the illumination optical system and the protection optical system PL can be maintained at a very low level, and it is possible to control degradation and image formation characteristics at a minimum level. Furthermore, the amount of change in the index of refraction of helium in response to changes in air pressure is very small, so that the amount of change in the index of refraction within, for example, the projection optical system PL is extremely small and for this reason, as well, it is possible to maintain stable image formation characteristics.

Next, the helium circulation apparatus of the present embodiment will be explained, in detail. In the interior of the environment chamber 7, the helium which leaks out of the subchamber 6 and the helium which leaks out of the protection optical system PL rises, since it is lighter than nitrogen, and collects in the space 7a in the vicinity of the ceiling. Here, the gas within the space 7a is a mixed gas in which are mixed, in addition to helium, nitrogen and air which enters the environment chamber 7 from the outside.

In the present embodiment a pipe 33 is connected to the space 7a from the exterior of the environment chamber 7, and this pipe 33 is connected to the helium circulation apparatus on the lower floor through a hole which is provided in floor F1. Furthermore, case 1 is connected to pipe 33 via pipe 92, and an opening and closing valve V16 is provided in pipe 92. Furthermore, the subchamber 6 which contains the illumination optical system, and the space within the projection optical system PL to which helium is supplied, are connected to pipe 33 via, respectively, pipes 93 and 94, and opening and closing valves V17 and V18, respectively, are provided in pipes 93 and 94. Accordingly, by independently opening and closing the opening and closing valves V16, V17, and V18 using the control system 45 shown in FIG. 2, it is possible to recover helium gas containing organic matter or particles or the like from at least a desired one of the following: the case 1, the subchamber 6, and the projection optical system PL, Furthermore, a suction type pump (or fan) 34 is disposed in the pipe 33 in the bottom surface side of floor F1, and the mixed gas sucked from the interior of the space 7a and the case 1 by pipe 33 and pump 34 is sent to the helium circulation apparatus of the lower level. Then, the mixed gas which is passed through pump 34 reaches the dust collecting and moisture removing apparatus 35, and here, in order to avoid later clogging of the adiabatic compression cooling passage, the fine particulate matter and moisture is removed. That is to say, in dust collecting and moisture removing apparatus 35, for example, a HEPA filter (high efficiency particulate air filter) or an ULPA filter (ultra low penetration air filter) is provided.

Furthermore, the mixed gas from which particulate matter or moisture has been removed by the dust collecting and moisture removing apparatus 35 passes through pipe 36 and reaches impurity removal apparatus 80, and here, impurities (contaminates) other than particulate matter or moisture contained in the mixed gas are removed. The impurities removed here are substances which precipitate onto the surfaces of the optical elements of the $F_2$ laser light source 3, the illumination optical system or the projection optical system PL and cause fogging, or substances which float within the optical path of the exposure light and which cause fluctuations in the transmittivity (illumination intensity) or illumination intensity distribution or the like of the illumination optical system or the projection optical system PL, or are substances which precipitate onto the surface of the wafer W (resist) and cause deformations in the pattern image after developing processing.

An activated carbon filter (for example, the Gigazobe (trade name) produced by Nitta Company), or a zeolite filter or a filter combining these, may be employed as the impurity removal apparatus 80 of the present embodiment. By means of this, silicon system impurities such as siloxane (substances having a Si—O chain as an axis) or silazane (substances having a Si—N chain as an axis), which are present within the environment chamber 7, the illumination optical system, or the projection optical system PL, may be removed.

Here, the substance known as "ring form siloxane", having a Si—O chain as an axis, which is one of the siloxanes, is contained in silicon system adhesives, sealing agents, paints, and the like, which are employed in projection exposure apparatuses, and with the passage of years, this is released as out gas. Ring form siloxane is easily deposited on the surfaces of light sensitive substrates or optical elements (lenses or the like), and oxidizes when it comes into contact with ultraviolet light, so that it becomes an $SiO_2$-system fogging substance on the surfaces of optical elements.

Furthermore, hexamethyldisilazane (hereinbelow referred to as "HMDS"), which is employed as a preprocessing agent in resist coating processes, is a silazane. HMDS is changed (hydrolyzed) into the substance silanol when it reacts with water. Silanol is easily deposited on the surfaces of light sensitive substrates or optical elements or the like, and oxidizes when it comes into contact with ultraviolet light, forming an $SiO_2$-system fogging substance on the surfaces of the optical elements. Silazane generates ammonia as a result of the hydrolysis described above; when such ammonia is present together with siloxane, the surfaces of optical elements are even more likely to be fogged.

The organic materials (for example, hydrocarbons) which are deposited on the surfaces of the optical elements of the illumination optical system or the projection optical system PL or the like are broken down by light cleaning, and become admixed into the helium gas; however, these hydrocarbons are also removed by the impurity removal apparatus 80 in the present embodiment. Furthermore, it is not the case that only the silicon system organic materials described above are generated; plasticizers (phthulates and the like) and flame retardants (phosphoric acid, and carbon system materials) may be generated as outgasses of the wiring or plastic within the environment chamber 7, but these plasticizers and flame retardants are also removed by the impurity removal apparatus 80 in the present embodiment. Even if ammonium ions or sulfuric acid ions or the like which float within the clean room enter into the environment chamber 7, these ions are also removed by the impurity removal apparatus 80. Furthermore, in the present embodiment, the impurity removal apparatus 80 is provided at the downstream side of the dust collection and moisture removal apparatus 35; however, this may also be provided at the upstream side of the dust collection and moisture removal apparatus 35, or alternatively, the HEPA filter or ULPA filter within the dust collection and moisture removal apparatus may be made unitary with the activated carbon filter within the impurity removal apparatus.

The mixed gas passing through the impurity removal apparatus 80 reaches the refrigerating apparatus 37 via pipe 36 and here, this is cooled to the temperature of liquid nitrogen by adiabatic compression cooling. By means of this, the nitrogen and air components are liquefied, and it is a simple matter to separate the gaseous helium from the liquefied air components containing nitrogen. The air components comprising chiefly nitrogen ($N_2$) liquefied within the refrigerating apparatus 37 are recovered in cylinder 40 of FIG. 2 via pipe 38 and the suction type pump 39 disposed therein. The air components such as nitrogen and the like which are vaporized in the cylinder 40 may be reused (recycled). The helium which is present in the form of a gas within the refrigerating apparatus 37 of FIG. 1 is sent to the first inflow port of the mixing and temperature adjustment apparatus 43 in FIG. 2 via pipe 41 and a suction pump (or fan) 42 which is disposed therein.

In FIG. 2, highly pure helium gas is supplied from cylinder 46, which is filled with highly pure helium gas at high pressure, to the second inflow port of mixing and temperature adjustment apparatus 43 via pipe 47 and opening and closing valve 48. Liquefied helium may be stored within cylinder 46. Furthermore a helium concentration meter 44 for measuring the concentration (or purity) of the helium within the pipe 41 through which the helium recovered by the refrigerating apparatus 37 in FIG. 1 passes is provided in the vicinity of the inflow port with respect to the mixing and temperature adjustment apparatus 43, and the measurement data thereof are supplied to the control system 45 which comprises a computer. When the concentration of the recovered helium measured by the helium concentration meter 44 reaches a predetermined allowable level, the control system 45 opens the opening and closing valve 48, and adds highly pure helium from the cylinder 46 into the mixing and temperature adjustment apparatus 43. Additionally, when the helium concentration as measured by the helium concentration meter 44 exceeds the allowable value, the control system 45 shuts the opening and closing valve 48. Furthermore, the opening and closing valve 48 is shut even when the exposure operation is not being conducted. It is possible to employ a sensor which detects the oxygen concentration in place of the helium concentration meter, and to close the opening and closing valve 48 when the oxygen concentration is at or below an allowable level.

Furthermore, mixing and temperature regulator apparatus 43 first mixes the recovered helium with helium from cylinder 46 within a predetermined pressure range and controls the temperature and humidity at a predetermined level and supplies the helium having controlled temperature, pressure, and humidity to pipe 31. The helium circulation apparatus of the present embodiment comprises from dust collection and moisture removal apparatus 35 to mixing and temperature adjusting apparatus 43. Furthermore, pipe 31 passes through an opening provided in the floor F1 of the upper level and reaches into the interior of the clean room, and a blowing pump (or fan) 32 is installed in the middle of pipe 31 at the bottom surface side of floor F1 and an opening and closing valve V11 is provided at the upper surface side of floor F1. Then, the helium gas which is placed within a predetermined pressure range, is at a predetermined concentration or greater, and the temperature, pressure, and humidity whereof are controlled at predetermined levels by mixing and temperature adjusting apparatus 43, is supplied to pipe 31, and then, while being blown by pump 32, is supplied to the interior of the subchamber 6 of the projection exposure apparatus on floor F1 of FIG. 1, to the interior of the projection optical system PL, and the interior of case 1, via branch pipes 31a, 31b, and 31c of pipe 31.

Furthermore, in FIG. 2, an impurity concentration meter 90 which detects the concentration of impurities (including the silicon system organic materials described above and the like) which enter into the helium gas is installed in pipe 31 at the upstream of the opening and closing valve V11 (the side of pump 32), and based on the values measured, control system 45 conducts the opening and closing of opening and closing valve V11, or in other words, the supply and cut off of helium. When the impurity concentration as measured by the impurity concentration meter 90 is in excess of a predetermined allowable level, then opening and closing valve V11 closes and the supply of helium to the projection exposure apparatus is cut off and, for example, the exchange of the filter of the impurity removal apparatus 80 of FIG. 1 is conducted. Alternatively, the recovered helium may be sent to the helium circulation apparatus together with the impurities. After this, opening and closing valve V11 is opened and the supply of helium is reinitiated, and the opening and closing valves V12–V18 of FIG. 1 are opened and helium is circulated. Then, at a point in time at which, as an example, the impurity concentration is found to be at a level below the allowable level, the opening and closing valves V16–V18 are closed. Furthermore, when the concentration of helium within the case 1, the subchamber 6, and the projection optical system PL reaches, respectively, predetermined values, opening and closing valves V12–V15 are successively closed.

Next, using the light detector (not depicted in the figure) provided in the wafer stage 23 of FIG. 1, the transmittivity with respect to the exposure light (ultraviolet pulse light IL) of projection optical system PL (or the illumination intensity on wafer W), and the illumination intensity distribution on reticle R or wafer W are detected, and based on the results of this detection, the exposure of wafer W is initiated. In place of the exchange of the filters or sending of the recovered helium described above, it is also possible to exchange the cylinder which serves to store to recovered helium (corresponding to the cylinder 50 in FIG. 3 described hereinbelow) with another cylinder, and to increase the purity thereof at a separate regeneration facility, and to supply the helium of high purity within cylinder 46 to environment chamber 7. Furthermore, impurity concentration meter 90 may be installed at a position other than within the pipe 31, so that it may be installed within pipe 41 or pipe 36 at a point downstream from the impurity removal apparatus 80.

Furthermore, when the work of the projection exposure apparatus of the present embodiment is started up, or when the work is restarted after a long period of stoppage, or when the light cleaning of the projection optical system PL is initiated, or after this is completed, the opening and closing valve V11 in pipe 31 is closed by the control system 45 in FIG. 2, and in the state in which the opening and closing valves V16–V18 of pipes 92–94 in FIG. 1 are opened, the gas within the case 1, the subchamber 6, and the projection optical system PL (helium or the like) is auctioned out by pump 34. At this time, so that the mixed gas within the upper space 7a of environment chamber 7 does not flow into the pipe 33, an opening and closing valve (not depicted in the figure) provided in the vicinity of the inflow port of pipe 33 should be closed. After this, the opening and closing valves V16–V18 are closed, and the opening and closing valve V11 is opened, and helium is thus supplied to case 1, subchamber 6, and projection optical system PL, and when the interior parts thereof reach a predetermined helium concentration value, the corresponding opening and closing valves V12–V15 are closed in order, and once all the opening and closing valves V12–V15 have been closed, valve V11 is closed. By means of this, it is possible to initiate the exposure operation of wafer W, or to initiate the preparatory operations thereof.

Although not depicted in the figure, helium concentration meters and oxygen concentration meters are provided within the case 1, the subchamber 6, and projection optical system PL, and control system 45 controls the opening and closing of opening and closing valves V12–V15 based on the output from these concentration meters. At this time, until the helium concentration in the case 1, subchamber 6, and the projection optical system PL, respectively, reach permitted values, or until the oxygen concentration is at a permitted value or below, the oscilation of the $F_2$ laser light source 3, that is to say, the exposure of the wafer W, is prohibited. Within the environment chamber 7, in particular, between the illumination optical system (condenser lens 19) and the projection optical system PL, and between the projection optical system PL and the wafer W, respectively, a nitrogen concentration meter and an oxygen concentration meter are disposed, and furthermore, the output of these concentration meters may be employed in common in the manner described above and the oscillation of the $F_2$ laser light source 3 may be controlled. Furthermore, when the helium concentration within at least one of the case 1, subchamber 6, and the projection optical system PL, for example, the helium concentration within the projection optical system PL, goes below a predetermined value during the operation of the projection optical apparatus, the opening and closing valves V11 and V14 are opened and helium is supplied. At this time, within the projection optical system PL, in particular so as not to change the pressure between the optical elements, the flow rate and pressure or the like of the helium gas supplied by the mixing and temperature adjustment apparatus 43 or the pump 32 or the like is adjusted. This is so as to prevent changes in the image forming characteristics of the projection optical system PL as a result of changes in pressure, and to prevent changes in the illumination intensity at the reticle R or the wafer W, or changes in the distribution thereof. Although not depicted in the figure, pressure sensors arm disposed within the illumination optical system (subchamber 6) and the projection optical system PL, and control system 45 controls the flow rate and pressure of the helium gas based on the values measured by these pressure sensors. Temperature sensors and humidity sensors may further be disposed within the illumination optical system and projection optical system PL, and using the values measured by the sensors, the temperature or humidity of the helium gas may be precisely controlled.

In this way, in the present embodiment, the majority of the helium gas supplied so as to flow into the majority of the optical path of the exposure light (ultraviolet pulse light IL) of the projection exposure apparatus is directly recovered via the upper space 7a of the environment chamber 7 or from the case 1, subchamber 6, and the projection optical system PL, passing through pipe 33 to the helium circulation apparatus of the lower level, so that the amount of high cost helium employed can be reduced. It is possible to increase the transmittivity with respect to the exposure light, and to increase the cooling efficiency of the optical elements, and it is also possible to reduce the operating costs of the projection exposure apparatus.

In the embodiment described above, a cylinder (corresponding, for example, to the cylinder 50 of FIG. 3 described hereinbelow) for storing recovered helium may be provided between the refrigerating apparatus 37 and the mixing and temperature adjustment apparatus 43 in FIG. 1. In this case, in order to be able to store large amounts, the helium should be compressed using a compressor to 100 to 200 atmospheres, and stored in the cylinder. By means of this, the volume is reduced to a range of approximately $1/100$th to $1/200$th. Furthermore, the helium may be liquefied by means of a liquefier employing a turbine or the like and stored. By means of liquefaction, the volume of the helium may be reduced to approximately $1/700$th. When helium highly compressed or liquefied in this manner is reused, for example, when it is returned to state of approximately one atmosphere, the temperature decreases as a result of expansion, so that it is necessary to employ heating temperature management using a heater or the like. Furthermore, a buffer space for maintaining a constant pressure is desirably provided. Furthermore, an opening and closing valve may be provided on the upstream side of the mixing and temperature adjustment apparatus 43 (the side of pump 42), and the amount of helium obtained from the cylinder which stores the recovered helium may be regulated, or the opening and closing of the flow path (pipe 41) may be controlled. By employing this opening and closing valve together with the opening and closing valve 48 of the pipe 47, it is possible to more easily conduct the regulation of the concentration of helium sent to pipe 31.

In the embodiment described above, the helium gas is supplied in such a manner as to flow through the majority of the optical path of the exposure light; however, in order to cover the entirety of the optical path, and to increase the cooling efficiency of the reticle stage 20 and the wafer stage 23, helium gas may be supplied to the entirety of the interior of the environment chamber 7. In this case, as well, the majority of the helium may be recovered, so that the increase in operating costs is slight.

Furthermore, in the embodiment described above, the helium recovered by the mixing and temperature adjusting apparatus 43 is mixed with highly pure helium; however, when the concentration (purity) of the recovered helium is low, there is a danger that simply by mixing it will be impossible to rapidly increase the concentration of the helium supplied to the projection exposure apparatus to allowable ranges. In such cases, the recovered helium may be stored in a separate cylinder, and the purity thereof may be increased at a separate regeneration facility, and the highly pure helium within cylinder 46 may be supplied to the projection exposure apparatus.

In the projection exposure apparatus of FIG. 1, using the opening and closing valves V11–V18, helium was filled (sealed) within the case 1, the subchamber 6, and the projection optical system PL; however, in the present embodiment, a helium circulation apparatus is provided, so that in the state in which the opening and closing valves V16–V18 are closed, the helium leaking out of the case 1, the subchamber 6, and the projection optical system PL may be replenished, and a constant supply may be carried out while regulating the flow rate of the helium. Alternatively, the helium may be constantly supplied at a predetermined flow rate while keeping the opening and closing valves V11–V18 open. Using the latter method, the opening and dosing valves V11–V18 need not be provided. At this time, based on the values measured by pressure sensors (not depicted in the figure) provided within, respectively, the illumination optical system and the projection optical system PL, the flow rate and pressure and the like of the helium supplied may be controlled so as to maintain the interior pressure at a constant value.

Here, when the helium is constantly supplied as described above, the opening and closing valve V11 closes at the point in time at which the predetermined permitted value of the impurity concentration measured by the impurity concentration meter is reached; however, at this time, the main control system (not depicted in the Figure) which controls the operations of the entire projection exposure apparatus confirms the operation in the main part of the exposure apparatus, and when, for example, the exposure process of the wafer is in progress, this control system sends a directive so as to delay the operation closing the opening and closing valve V11 (closing) until the completion of the exposure processing, with respect to the control system 45. Alternatively, immediately prior to reaching the permitted value of the impurity concentration, the main control system may dose the opening and closing valve V11 without initiating the subsequent wafer exposure process and may initiate operations which reduce the impurity concentration below a predetermined value as described above.

Furthermore, taking into account the admixture of impurities as described above in the present embodiment, in order to exchange the helium within the case 1, the subchamber 6, and the projection optical system PL, or in order to circulate the helium, the case 1, subchamber 6, and the projection optical system PL are connected with pipe 33 via pipes 92–94. However, if the recovered helium can be cleaned so as achieve good purity (purified), the admixture of impurities is at a level that can be ignored, or the state is such that the impurities are essentially not generated within the illumination optical system or projection optical system PL, then it is not necessary to provide these pipes 92–94 (and opening and closing valves V16–V18). At this time, opening and closing valves V11–V15 also need not be provided. In this case, helium leaks out from the case 1, the subchamber 6, and the projection optical system PL, so that helium may be supplied either constantly or when needed (or at regular intervals) so as to replenish the helium and to maintain the helium concentration at a permitted value or above.

Furthermore, in the present embodiment, the $F_2$ laser light source 3 and the BMU 4 were contained in case 1 of FIG. 1; however, the BMU 4 and the like may be contained in a housing separately from the $F_2$ laser light source 3, and helium may be supplied respectively to the $F_2$ laser light source 3 and to this housing. At this time, the $F_2$ laser light source 3 and this housing may be mechanically connected, and a glass plate may be provided which allows the transmission of a $F_2$ laser as a dividing plate between the two.

Next, the nitrogen circulation apparatus of the present embodiment will be explained in detail. In the present embodiment, nitrogen gas ($N_2$) is supplied within the environment chamber 7 of FIG. 1 via the pipe 88 of FIG. 2, and nitrogen is recovered from the environment chamber 7 via pipes 95 and 33, so that in other words, nitrogen is circulated within the environment chamber 7.

The nitrogen which is separated from the helium and the like by the refrigerating apparatus 37 of FIG. 1 is suctioned away by pump 39 and passes through pipe 38 and is recovered in cylinder 40 of FIG. 2. Furthermore, the nitrogen within the cylinder 40 is suctioned by pump 83 and passes through pipe 81 and is sent to the temperature adjusting apparatus 86. An opening and closing valve V21 is provided in pipe 81, and nitrogen concentration meter, or oxygen concentration meter, 82 which measures the concentration of nitrogen sent to the temperature adjusting apparatus 86 is provided, and the values measured by this concentration meter arm supplied to the control system 45. When the nitrogen concentration as measured by the concentration meter 82 reaches a predetermined value, the control system 45 opens the opening and closing valve V22 of the pipe 85 connecting the nitrogen cylinder 84 and the temperature adjusting apparatus 86, supplying highly pure nitrogen from cylinder 84 to temperature adjusting apparatus 86. On the other hand, when the nitrogen concentration is at the predetermined value or above, the control system 45 maintains the opening and closing valve V22 in a closed state. When the nitrogen concentration measured by the concentration meter 82 is extremely low, the opening and closing valve V21 may be closed and a flow of nitrogen from only the nitrogen cylinder 84 may be sent to the temperature adjusting apparatus 86. Then, when the nitrogen concentration as measured by the concentration meter 82 reaches a permitted value (a value smaller than the predetermined value desk above), the opening and closing valve V21 may be opened.

Furthermore, temperature adjusting apparatus 86 mixes the recovered add cleaned nitrogen and the nitrogen from the nitrogen cylinder 84 and controls the temperature, pressure, and humidity thereof at predetermined levels, and supplies this nitrogen gas having controlled temperature, pressure, and humidity to a pipe 88 which passes through floor F1. A blowing pump (or fan) 87 is provided in the bottom side surface of floor F1 in pipe 88, and the nitrogen is supplied to the interior of the environment chamber 7 by this pump 87 via the branch pipes 88a and 88b of pipe 88 of FIG. 1. Branch pipe 88a blows nitrogen gas in the direction of the optical path of the exposure light between the projection optical system PL and the wafer W, while branch pipe 88b blows nitrogen gas in the direction of the optical path of the exposure light between the subchamber 6 and the projection optical system PL (the space above and below the reticle R).

Furthermore, an opening andclosing valve V23 is provided in pipe 88 at the side of the upper surface of floor F1, and an impurity concentration meter 89 which detects the concentration of impurities (including the silicon system organic materials or the like described above) which are mixed into the nitrogen is provided in the pipe 88 at the upstream side of the opening and closing valve V23 (the side of pump 87). When the impurity concentration as measured by this impurity concentration meter 89 is at or above predetermined allowable levels, then control system 45 closes the opening and closing valve V23 and halts the supply of nitrogen to the projection exposure apparatus, and the exchange of the filter of impurity removal apparatus 80, for example, is conducted. Alternatively, the recovered nitrogen may be sent out of the nitrogen circulation apparatus together with the impurities. After this, the opening and closing valve V23 (and the opening and closing valves V24 and V25) is opened, and the supply of nitrogen is resumed and the opening and closing valve V19 of pipe 95 in FIG. 1 is opened, and nitrogen is circulated. Then, when it is confirmed that the impurity concentration is lower than an allowed value, the opening and closing valve V19 is closed. Furthermore, when the nitrogen concentration within the environment chamber 7 reaches a predetermined value, the opening and closing valves V24 and V25 are successively closed. The using a light detector (not depicted in the figure) provided at wafer stage 23, the transmittivity of the projection optical system PL (or the illumination intensity on wafer W) is detected, and furthermore, the illumination intensity distribution on reticle R or wafer W is detected, and based on these detection values, the exposure of the wafer W is initiated.

In the embodiment described above, when the nitrogen concentration within the environment chamber 7 reaches a predetermined value, the supply of nitrogen is halted, and the opening and closing valve V23 (or the valves V24 and V25) and the opening and closing valve V19, respectively, of the pipe 88 (or the branch pipes 88a and 88b) and the pipe 95 are closed, and when the nitrogen concentration within the environment chamber 7 drops below the predetermined value, the opening and closing valve V23 (or the opening andclosing valves V24 and V25) may be opened and nitrogen supplied.

Furthermore, in place of the filter exchange or the discharge of the recovered nitrogen described above, the cylinder 40 storing the recovered nitrogen may be exchanged with another cylinder, and the purity thereof may be increased at a separate regeneration facility, and the highly pure nitrogen within the nitrogen cylinder 84 may be supplied to the environment chamber 7. Furthermore, the impurity concentration meter 89 may be disposed at a position other than within the pipe 88, so that for example, it may be disposed within pipe 81 or within pipe 36 at a position downstream from the impurity removal apparatus 80. In particular, with the latter distribution, it is no longer necessary to provide the impurity concentration meter 90 described above; that is to say, the helium supply apparatus and nitrogen supply apparatus may commonly employ a single impurity concentration meter.

Furthermore, although it is not depicted in the figure, a nitrogen concentration meter or an oxygen concentration meter may be provided within environment chamber 7, and control system 45 may control the opening and closing of opening and closing valves V23–V25 based on the outputs of these concentration meters so that the nitrogen concentration within the environment chamber 7 does not drop below a predetermined permitted value. Furthermore, temperature sensors, pressure sensors, and humidity sensors (not depicted in the figure) are disposed within the environment chamber 7, and based on the measured values of the sensors, the control system 45 regulates the flow rate, temperature, pressure, and humidity of the nitrogen supplied using temperature adjusting apparatus 86 and pump 87 and the like so as to maintain at an essentially fixed value the temperature, pressure, and humidity within the environment chamber 7.

In the present embodiment, in FIG. 1, an exhaust port of a first branch pipe 88a of pipe 88 is disposed in the vicinity of projection optical system PL and wafer W, and nitrogen flows to the space between the projection optical system PL and the wafer W. On the other hand, the second branch pipe 88b of the pipe 88 further branches in two, and one exhaust port is disposed in the vicinity between condenser lens 19 and reticle R, while the other exhaust port is positioned between the reticle R and the protection optical system PL. The opening and closing of opening and closing valve V19 may be controlled and nitrogen caused to circulate within the environment chamber 7 so as to constantly blow nitrogen from branch pipes 88a and 88b. In this case, it is possible to supply nitrogen having a high degree of purity in a prioritized manner between the illumination optical system (condenser lens 19) and the projection optical system PL, and between the projection optical system PL and the wafer W, so that even if the nitrogen concentration within the environment chamber 7 decreases as a result of opening this chamber during the exchange of reticles R or wafer W, after the completion of the exchange operation, it is possible to rapidly initiate an exposure operation or a preparatory operation, so that it is possible to restrict the decline in throughput to the minimum possible period. Furthermore, in comparison with the case in which nitrogen is circulated by simply connecting pipe 88 to the environment chamber 7 without providing branch pipes 88a and 88b, it is possible to reduce the amount of nitrogen employed. Furthermore, it is possible to greatly reduce the deposition of scattered particles (particulate matter), generated from the wafer W (resist surface) during illumination with exposure light, onto the projection optical system PL (surfaces of the optical elements closest to the wafer side). When nitrogen is circulated within the environment chamber 7, the contaminant substances are exhausted to the outside together with the nitrogen so that it is possible to improve the cleanliness within the environment chamber 7.

In the present embodiment, the interior of environment chamber 7 was made a nitrogen atmosphere; however, air from which impurities have been removed may be supplied to environment chamber 7, and as described above, nitrogen may be supplied between the illumination optical system and the projection optical system PL, and between the projection optical system PL and the wafer W, and thus only these two spaces may be given nitrogen atmospheres. At this time, helium may be supplied in place of nitrogen, and in such a case, it is no longer necessary to provide a nitrogen circulation apparatus, so that, for example, the helium may be supplied to the spaces described above by connecting pipe 31 with branch pipes 88a and 88b. Furthermore, chemically clean dry air (having a humidity of 5% or less) from which the organic materials described above have been removed may be employed as the air which is supplied to the environment chamber 7. Such a structure is particularly effective for projection exposure apparatuses which employ a ArF excimer laser as the exposure light source, and in this cases nitrogen may be supplied to the case 1, the subchamber 6, and the projection optical system PL, or alternatively, nitrogen may be supplied to the case 1, and to subchamber 6, while helium is supplied to the projection optical system PL.

Furthermore, in the present embodiment, nitrogen (or helium) or the like was supplied to the interior of the environment chamber 7; however, depending on the wavelength band of the exposure illumination light, temperature controlled air which is chemically clean (the dry air described above) may solely be supplied to the interior of the environment chamber 7. For example, if the exposure wavelength is approximately 190 nm or greater, the interior of the environment chamber 7 may be given an air atmosphere. In this case, in the same way as with the circulation apparatus for recovering helium or nitrogen or the like which was supplied to the case 1, the subchamber 6, and the projection optical system PL, a dry air circulation apparatus for recovering the dry air supplied to the environment chamber 7 may be provided, and the environment chamber 7 and the dry air circulation apparatus may be connected solely by means of pipe 95 without interposing a pipe 33.

Furthermore, in the same way as the helium circulation apparatus described above, the recovered nitrogen may be compressed using a compressor to 100–200 atmospheres, or alternatively, this may be liquefied using a liquefier employing a turbine or the like and stored in cylinder 40. The opening and closing valves V24 and V25 which are provided in, respectively, branch pipes 88a and 88b, make it possible to supply nitrogen to only one of the spaces between the illumination optical system and the projection optical system PL, or between the projection optical system PL and wafer W, and when nitrogen is simultaneously supplied to both places, the opening and closing valves V24 and V25 need not be provided.

Furthermore, in the present embodiment, nitrogen is caused to flow between the illumination optical system and the projection optical system PL, and between a projection optical system PL and the wafer W; however, the environment chamber 7 may simply be connected to the pipe 88 without providing branch pipes 88a and 88b, and when the nitrogen concentration within the environment chamber 7 reaches a predetermined value or greater, the opening and closing valve V23 may be closed. Furthermore, irrespective of the existence of the branch pipes 88a and 88b, nitrogen may be supplied at a predetermined flow rate while the opening and closing valves V23 and V19 are opened, and nitrogen may thus be caused to circulate in the environment chamber 7. In this case, it is not particularly necessary to provide the opening and closing valves V23 and V19.

Furthermore, in the present embodiment, the majority of the illumination optical system was contained in the subchamber 6, and a portion of subchamber 6 was disposed within the environment chamber 7; however, the entirety of the subchamber 6 may be disposed within the environment chamber 7. In this case, it is possible to increase the recovery ratio of helium leaking from the subchamber 6. Furthermore, in order to also recover the helium leaking from that portion of the subchamber 6 which is disposed outside the environment chamber 7, the subchamber 6 outside the environment chamber 7 may be covered by a predetermined housing, and another inflow port of pipe 33 may be connected to the upper part of this housing.

Furthermore, in the present embodiment, only a single gas (nitrogen or helium) was supplied to the case 1, subchamber 6, and the projection optical system PL, respectively; however, it is also possible to supply a gas consisting of a mixture of nitrogen and helium at predetermined proportions. In this case, the pipe 88 of the nitrogen circulation apparatus may be connected to the pipe 31 of the helium circulation apparatus at the downstream side of the opening and closing valve V11. The mixed gas is not restricted to a combination of nitrogen and helium; neon, hydrogen, or the like may be combined. Furthermore, the gas supplied to the environment chamber 7 may also be the mixed gas described above.

Next, a second embodiment of the present invention will be explained with reference to FIG. 3. This embodiment is one in which helium from a plurality of projection exposure apparatuses is recovered by a single helium recovery parts corresponding to those in FIGS. 1 and 2 are given identical reference numbers, and a detailed description thereof is omitted. The pipes 92–94 which connect the case 1, subchamber 6, and projection optical system PL shown in FIGS. 1 and 2 with the pipe 33, respectively, and the pipe 95, which connects the environment chamber 7 and the pipe 33, are not depicted in the figure.

Figure 3:
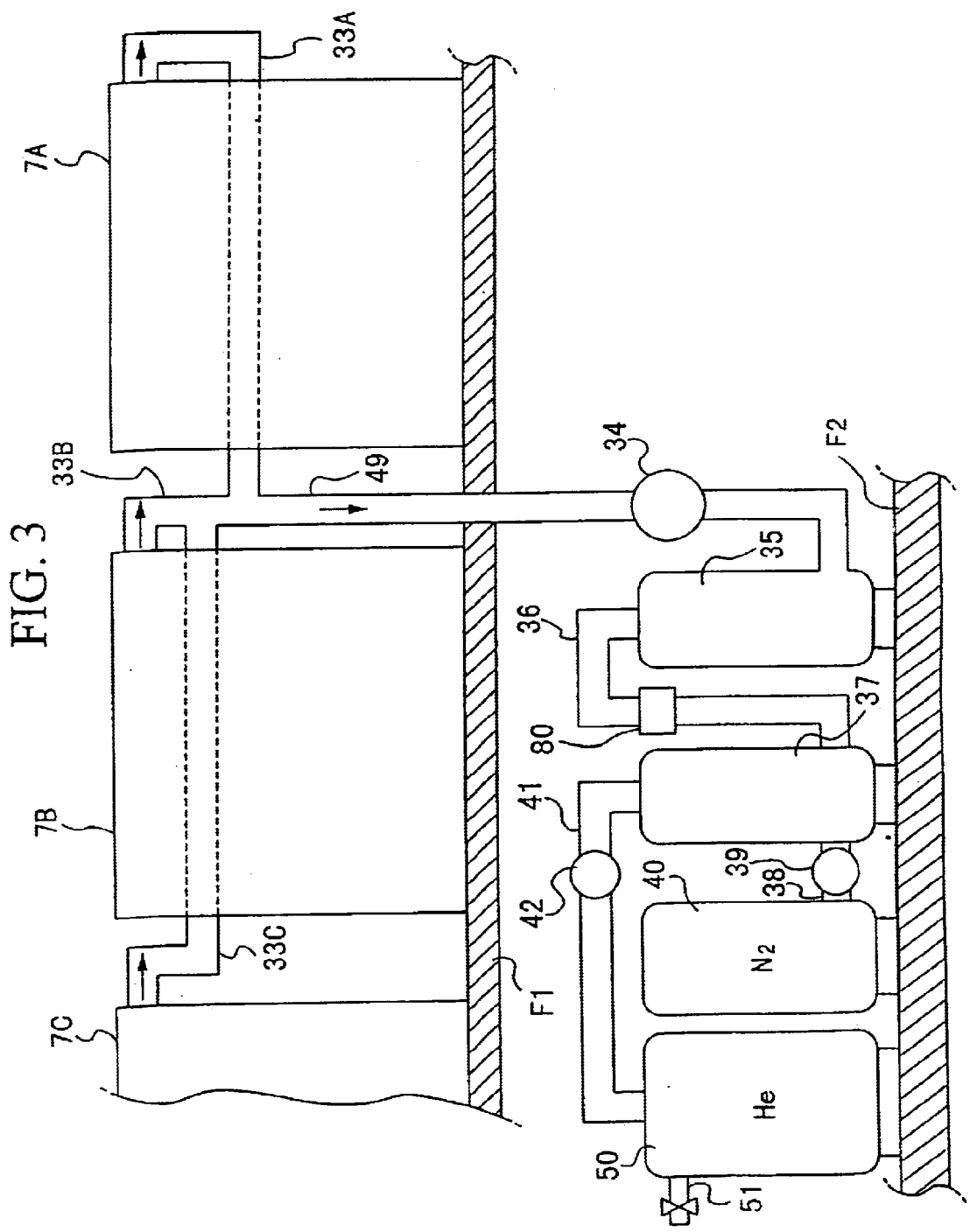
FIG. 3 is a schematic structural diagram in which a portion has been rendered in cross sectional view, showing a plurality of projection exposure apparatuses and a single helium recovery apparatus in a second embodiment of the present invention.

FIG. 3 is a cross sectional view showing a plurality of projection exposure apparatuses and a single helium recovery apparatus in accordance with this embodiment; in FIG. 3, environment chambers 7A, 7B, and 7C are disposed on floor F1, and exposure main units identical to the exposure main unit 26 of FIG. 1 are installed in each of the environment chambers 7A, 7B, and 7C, and exposure light sources which are not depicted in the figure are disposed in close proximity. Helium gas having a predetermined purity or greater is supplied to environment chambers 7A, 7B, and 7C from a helium supply apparatus on the lower floor which is not depicted in the figure. Then, the mixed gas of helium, nitrogen, and air which is supplied to the environment chambers 7A, 7B and 7C rises to the space in the vicinity of the ceiling of the interior thereof and is supplied via pipes 33A, 33B, and 33C to the common pipe 49. Common pipe 49 passes through an opening in floor F1 and travels to the helium recovery apparatus on floor F2 of the lower level. A suction pump 34 is installed in common pipe 49 at the bottom surface of floor F1.

In the helium recovery apparatus of the lower level, the mixed gas of helium, nitrogen, and air recovered via common pipe 49 and the suction pump 34 travels through the dust collecting and moisture removing apparatus 35, the impurity removal apparatus 80 and the pipe 36 and reaches the refrigerating apparatus 37, and the nitrogen liquefied at the refrigerating apparatus 37 is recovered in cylinder 40. The helium which is not liquefied by the refrigerating apparatus 37 is stored, for example under compression at high pressures, in the cylinder 50 for storing the helium via pipe 41 and suction pump 42. The recovered helium is supplied via the pipe 51 provided in the cylinder 50 to a regeneration facility for increasing the purity thereof or to the helium supply apparatus shown in FIG. 1.

As explained in the first embodiment (FIGS. 1 and 2) described above, the helium recovery apparatus (33A through 33C, 34–42, 49, 50) in FIG. 3 is combined with a nitrogen recovery apparatus. A plurality of projection exposure apparatuses may be connected with a single nitrogen supply apparatus (the parts in FIG. 2 from pipe 81 to pipe 88), and the nitrogen stored in the cylinder 40 may be supplied to the plurality of projection exposure apparatuses via this nitrogen supply apparatus. By means of this, it is possible to employ a single nitrogen circulation apparatus for a plurality of projection exposure apparatuses.

In this way, in the present embodiment, a single helium recovery apparatus and nitrogen circulation apparatus corresponds to a plurality of exposure apparatuses, so that recovery costs are reduced.

Next, a modification of the projection exposure apparatus of the first embodiment shown in FIGS. 1 and 2 will be explained with reference to FIG. 4. In this embodiment, the reticle stage 20 and wafer stage 23 which are disposed within environment chamber 7 are contained in subchamber CH1 and CH2; in FIG. 4, those parts which correspond to parts in FIG. 1 are given identical reference numbers and a detailed explanation thereof is omitted.

Figure 4:
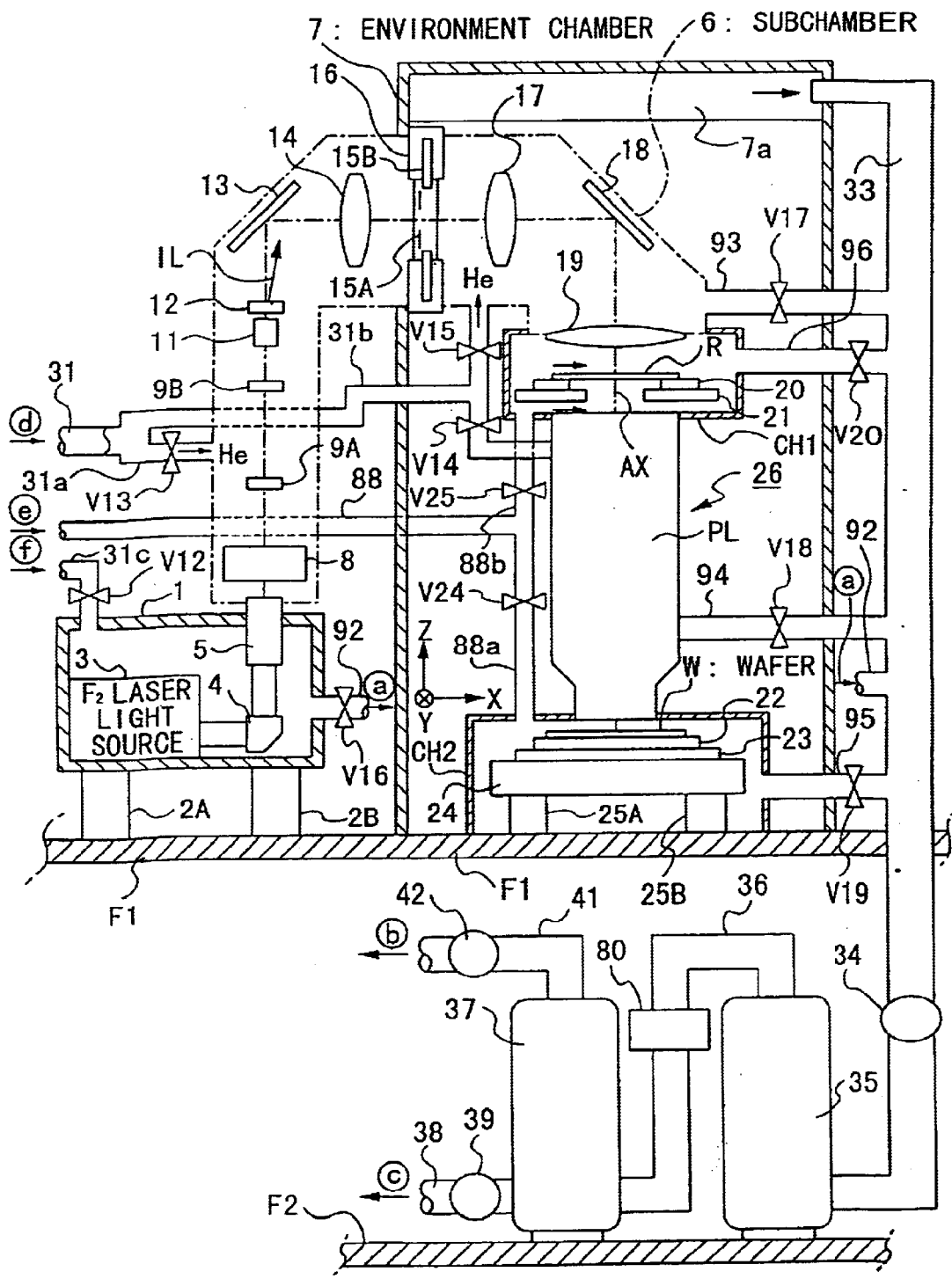
FIG. 4 is a schematic structural view in which a portion has been rendered in cross sectional view, showing a modification of the projection exposure apparatus of the first embodiment of the present invention.

In FIG. 4, so as not to expose the optical path between the illumination optical system (condenser lens 19) and the projection optical system PL to the air, subchamber CH1 encloses the space therebetween and is given a nitrogen atmosphere, and is connected to a branch pipe 88b of pipe 88 and pipe 96 which is connected to pipe 33, and an opening and closing valve V20 is provided in pipe 96. In FIG. 41 subchamber CH1 is connected with projection optical system PL; however, in actuality, a structure is formed such that the vibration of subchamber CH1 is not communicated to the projection optical system PL. Subchamber CH1 may be formed so as to be integral with the subchamber 6, and furthermore, subchamber CH1 may be affixed on floor F1 via a frame which is different than the fame which affixes the projection optical system PL.

Subchamber CH2 is affixed on floor F1 (actually, on the base plate on which the exposure apparatus main body is installed), and, so that the optical path between the projection optical system PL (the optical elements closest to the wafer side) and the wafer W is not exposed to air, subchamber CH2 seals this space and is given a nitrogen atmosphere and is connected to the branch pipe 88a of pipe 88 and to pipe 95. Furthermore, as in the subchamber CH1, CH2 has a structure such that the vibration thereof is not communicated to the projection optical system PL.

In subchamber CH1 and CH2 at the point in time at which the nitrogen concentration of the interior thereof reaches a predetermined level or above, the opening and closing valves before and after (opening and closing valves V25 and V20, or opening and closing valves V24 and V19) may be closed, or alternatively, nitrogen may be circulated at a constant flow rate while these opening and closing valves are opened Furthermore, branch pipes of the pipe 31 are connected to subchambers CH1 and CH2, and helium may be supplied in place of nitrogen.

Although not depicted in the Figure, at least one of the following is installed in subchamber CH2: a laser interferometer for detecting the positionally data of wafer stage 23, an off axis type alignment optical system for detecting the alignment marks and the like on wafer W, or a oblique incidence light type positionally detecting optical system for detecting the surface position of wafer W. It is preferable that the light source of the alignment optical system or the positionally detecting optical system, as well as the detector and the like, be disposed outside subchamber CH2. Furthermore, laser interferometers (not depicted in the figure) used in the control of the position of reticle stage 20 and wafer stage 23 arm disposed in, respectively, subchambers CH1 and CH2.

Furthermore, in the present embodiment, an air conditioner (not depicted in the figure) is connected to circulation chamber 7, and air from which the impurities described above (organic matter and the like) have been removed and which has controlled temperature, pressure, and humidity, is circulated in the spaces other than the subchambers 6, CH1, and CH2, and thus the environment (temperature and the like) within the environment chamber 7 is maintained in an essentially constant manner. The pressure within subchambers CH1 and CH2 should be set so as to be higher than the pressure within the environment chamber 7 so that the air within the environment chamber 7 does not mix into the subchamber CH1 and CH2.

In this way, in the present embodiment, it is possible to prevent attenuation of the exposure light (ultraviolet pulse light IL) between the illumination optical system and the projection optical system PL, as well as between the projection optical system PL and the wafer W, and in comparison with the case in which a nitrogen atmosphere is provided in all the interior spaces of the environment chamber 7, the amount of nitrogen supplied (amount used) is comparatively small, and it is possible to efficiently exhaust, to the exterior of subchamber CH2, the contaminant substances generated at the surface of the resist by the application of the exposure light. The structure of this embodiment is identical to that of FIG. 1 with the exception of subchambers CH1 and CH2 and the air conditioner described above, and the modifications described in the first and second embodiments may also be applied here For example, it is possible to extend the branch pipe 88a within the subchamber CH2, and blow (flow) nitrogen between the projection optical system PL and the wafer W in the same way as in FIG. 1, and by means of this, it is possible to reduce the amount of contaminant materials which adhere to the projection optical system PL, and it is possible to efficiently conduct the recovery (exhaust) of these contaminant materials. In the present embodiment, nitrogen or helium was respectively supplied to the subchambers CH1 and CH2; however, other inert gases (neon, hydrogen, or the like) or mixed gases representing combinations thereof may be supplied, or alternatively, depending on the wavelength of the exposure light (for example, when the wavelength is approximately 190 nm or greater), the chemically clean dry air described above may be supplied. Furthermore, in place of supplying nitrogen or the like to subchambers CH1 and CH2, the interior thereof may be made into a vacuum.

In the projection exposure apparatuses shown in FIGS. 1 through 4, neither an alignment optical system or a oblique incidence light type focal point detection optical system is depicted; however, in the same way as with the subchamber 6 which contains the majority of the illumination optical system, these may be contained within a housing corresponding to at least a portion of the alignment optical system or the focal point detection optical system, and nitrogen or helium may be supplied to the interior of this housing. In this case, the housing may be connected to branch pipes of pipe 31 or pipe 88, and furthermore, where necessary, the housing may be connected with the pipe 33.

Furthermore, the reticle loader which transports the reticle R to the reticle stage 20, and the wafer loader which transports the wafer W to the wafer stage 23, are not depicted; however, the reticle loader and the wafer loader are independently contained in the subchambers, and these subchambers are connected to the environment chamber 7 (in the example shown in FIG. 4, the subchambers CH1 and CH2). In this case, for example, branch pipes of the pipe 88 may connected to the subchambers so as to supply nitrogen, or dry air or the like, to the interior of the subchambers in which the reticle loader and the wafer loader arm disposed or alterenatively, air which has the impurities thereof described above removed therefrom and the temperature and the like of which is controlled may be supplied to the interior of the chambers. In the former option, the structure may be such as to permit the circulation of nitrogen by connecting the subchambers with pipe 33, while with the latter option, when nitrogen, helium, or dry air or the like is supplied to, in particular, the environment chamber 7 (subchambers CH1 and CH2), the pressure within the environment chamber 7 (or the subchambers CH1 and CH2) should be set higher than the pressure within the subchambers so that air does not flow into the subchambers in which the reticle holder and wafer holder are disposed.

Furthermore in the embodiment described above, nitrogen or helium is supplied to environment chamber 7 or to subchambers CH1 and CH2, so that when the measured value of the oxygen concentration meter disposed in the interior goes below a predetermined value (for example, the approximate oxygen concentration in air), the doors of the environment chamber 7, or of the subchambers CH1 and CH2, are locked so that they can not be opened by the operator. Furthermore, when the supply of electrical power is halted or the like, the supply of nitrogen or helium is automatically halted, and the opening and closing valves (normally closed valves) of the exhaust ducts connected to environment chamber 7 or subchambers CH1 and CH2 separately from the recovery pipe 95 are opened, and the concentration of nitrogen or helium in the interior decreases. Furthermore, when the operator opens environment chamber 7 or subchambers CH1 and CH2, the supply of nitrogen or helium is halted, and an oxygen cylinder is connected so as to supply oxygen to the interior thereof. By means of this, it is possible to shorten the time required to reach the predetermined value of the oxygen concentration described above. Here, the stoppage of the supply of the inert gas described above (nitrogen or helium or the like) is conducted when the environment chamber 7, the subchamber 6, CH1, CH2 or the case 1 is opened, or in other words, when maintenance is performed on the exposure apparatus (for example, the $F_2$ laser light source 3, the illumination optical system, the projection optical system PL, the reticle stage 20, and the wafer stage 23 or the like), or when the wafer cassette or reticle case is exchanged, and when the supply of electrical power to the exposure apparatus is cut off. At this time, simultaneous with the stoppage and supply of the inert gas, the chemically clean dry air described above is supplied to, respectively, the case 1, the subchamber 6, and the projection optical system PL, and it is desirable that the occurrence of fogging at the surfaces of the optical elements which accompany a stoppage in the supply of inert gases thus be prevented.

The exhaust duct described above which is connected to the environment chamber 7 separately from the pipe 95 has a much larger exhaust capacity in comparison with the pipe 95, in order to rapidly increase the oxygen concentration within the environment chamber 7 to the predetermined value described above or above this value. Furthermore, the other end of this exhaust duct may open to the outside of the clean room (the semiconductor facility), that is to say, to the atmosphere; however, it is desirable that it be connected to a large capacity tank or the like and that the inert gas be recovered. The inert gas recovered in this tank may be sent to the helium recovery apparatus described above through pipes, or the purity thereof may be increased by a regeneration apparatus.

Furthermore, in the embodiment of the present invention described above, helium gas is employed as the gas having high transmittivity with respect to the exposure energy beam (is inert) and which has good thermal conductivity; however, the present invention may be applied even when gases other than helium (for example, neon (Ne), hydrogen ($H_2$), or a mixed gas of helium and nitrogen or the like) are used as this gas. Furthermore, in exposure apparatuses employing exposure light having a wavelength of, for example, 190 nm or more, it is possible to employ nitrogen (particularly of higher purity) as the gas supplied to the projection optical system PL; however, the present invention may be applied in these cases as well.

Furthermore, in the embodiment of the present invention described above, a $F_2$ laser was employed as an exposure light source; however, a KrF excimer laser (wavelength 248 nm), a ArF excimer laser (wavelength 193 nm), a $Kr_2$ laser (wavelength 147 nm) or $Ar_2$ laser (wavelength 126 mm) or the like may be employed, and the present invention may be applied with respect to exposure apparatuses provided with such light sources, as well. However, in exposure apparatuses employing, for example, KrF excimer lasers, it is not necessary to exchange the air within the projection optical system for nitrogen or helium or the like, and only the air of the KrF excimer laser source and the air within the illumination optical system need be replaced with nitrogen or the like. Furthermore, it is not necessary that the gas supplied to the environment chamber 7 be nitrogen or the like; it is possible to use the air from which impurities have bean removed which is described above. The present invention may be applied even in the case of a exposure apparatus which supplies nitrogen or the like only to the light source and the illumination optical system, or only to the illumination optical system. In this type of exposure apparatus, in place of nitrogen, it is possible to employ the chemically clean dry air described above; however, it is possible to apply the present invention to exposure apparatuses which employ dry air as well.

Furthermore, the present invention is also applicable to the case in which, in place of the excimer laser, a wavelength of, for example, 248 nm, 193 nm, or 157 nm, or the higher harmonics of a solid state laser such as a YAG laser having an oscillation spectrum in the vicinity thereof, is used as the excitation light. Furthermore, the present invention is even applicable in the case in which a single wavelength laser in the inferred band or in the visible band oscillating from, for example, an DFB semiconductor laser or fiber laser is amplified by a fiber amplifier which is doped, with, for example, erbium (Er) (or both erbium and ytterbium (Yb)), and the higher harmonics resulting from wavelength conversion to ultraviolet light using a non-linear optical cystal is employed as the excitation light.

Concretely, when the excitation wavelength of the single wavelength laser is set within a range of 1.51–1.59 $\mu$m, then the 8-fold higher harmonic having a generated wavelength within a range of 189–199 nm or the 10-fold higher harmonic having a generated wavelength within a range of 151–159 nm is outputted. In particular, when the oscillation wavelength is within a range of 1.544–1.553 micrometers, then the 8-fold higher harmonic within a range of 193–194 nm, that is to say, ultraviolet light having approximately the same wavelength as that of a ArF excimer laser, is obtained, while when the oscillation wavelength is within a range of 1.57–1.58 micrometers, then the 10-fold higher harmonic within a range of 157–158 nm, that is to say, ultraviolet light having essentially the same wavelength as that of a $F_2$ laser, is obtained.

Furthermore, when the oscillation wavelength is set within a range of 1.03–1.12 micrometers, then the 7-fold higher harmonic having a generated wavelength within a range of 147–160 nm is outputted, and in particular, when the oscillation wavelength is within a range of 1.099–1.106 micrometers, then the 7-fold higher harmonic having a generated wavelength within a range of 157–158 nm, that is to say, ultraviolet light having essentially the same wavelength as that of the $F_2$ laser, is obtained. It is possible to use a ytterbium doped fiber laser or the like as the single wavelength oscillating laser.

Furthermore, the exposure apparatus to which the present invention is applied may be either a stepping exposure type (for example, a step and repeat type) or a scanning exposure type (for example, a step and scan type). Furthermore, the present invention can be applied to exposure apparatuses of the mirror projection type or the proximity type. When a projection optical system is employed, this optical system may be a refraction system, a reflection system, or a catadioptric system; furthermore, a reduction system, a magnification system, or an enlargement may be employed.

Furthermore, the present invention is applicable not merely to exposure apparatuses which are used in the manufacture of microdevices such as semiconductor elements, liquid crystal elements (display devices), thin film magnetic heads, or image acquisition elements (CCD), but may also be applied to exposure apparatuses which transfer a circuit pattern onto a glass substrate or a silicon wafer or the like in order to produce a reticle or a mask. Here, a transmission type reticle is commonly employed in exposure apparatuses which employ DUV (distant ultraviolet) light or VUV (vacuum ultraviolet) light or the like, and silica glass, fluorine doped silica glass, quartz, magnesium fluoride, or quartz crystals or the like are employed as the reticle substrate. Furthermore, reflective masks are employed in exposure apparatuses which employ EUV (extreme ultraviolet) light as the exposure energy beam, and transmission type masks (stencil masks, membrane masks) are employed in proximity type X-ray exposure apparatuses or electron beam exposure apparatuses or the like, and silicon wafers are commonly employed as these mask substrates.

Illumination optical systems and projection optical systems comprising a plurality of optical elements are combined with an exposure apparatus main body and optical adjustment is conducted, a reticle stage or wafer stage comprising a plurality of physical parts is attached to the exposure apparatus main body and wires or pipes are connected, and the case 1, exposure optical system (subchamber 6), projection optical system PL, and environment chamber 7, respectively, are connected with the helium circulation apparatus or nitrogen circulation apparatus or the like, and furthermore, by conducting overall adjustment (electrical adjustment, operational adjustment, or the like), it is possible to conduct an exposure apparatus of the embodiments described above. It is desirable that the manufacture of the exposure apparatus be conducted in a clean room in which the temperature and degree of cleanliness are controlled.

Furthermore, semiconductor devices are produced via a step in which the qualities and characteristic of the device are designed, a step in which, based on the design step, the reticle is produced, a step in which a wafer is produced from a silicon material, a step in which the pattern of the reticle is exposed onto the wafer by means of an exposure apparatus of the embodiments described above, a step in which the device is assembled (including a dicing procedure, a bonding procedure, and a packaging procedure), and a testing step and the like.

Next, an example of the third embodiment of the present invention will be explained with reference to the figures. This embodiment is one in which the present invention is applied to a step and scan type projection exposure apparatus for the production of semiconductor devices in which helium gas is supplied to the majority of the optical path of the exposure light.

Figure 5:
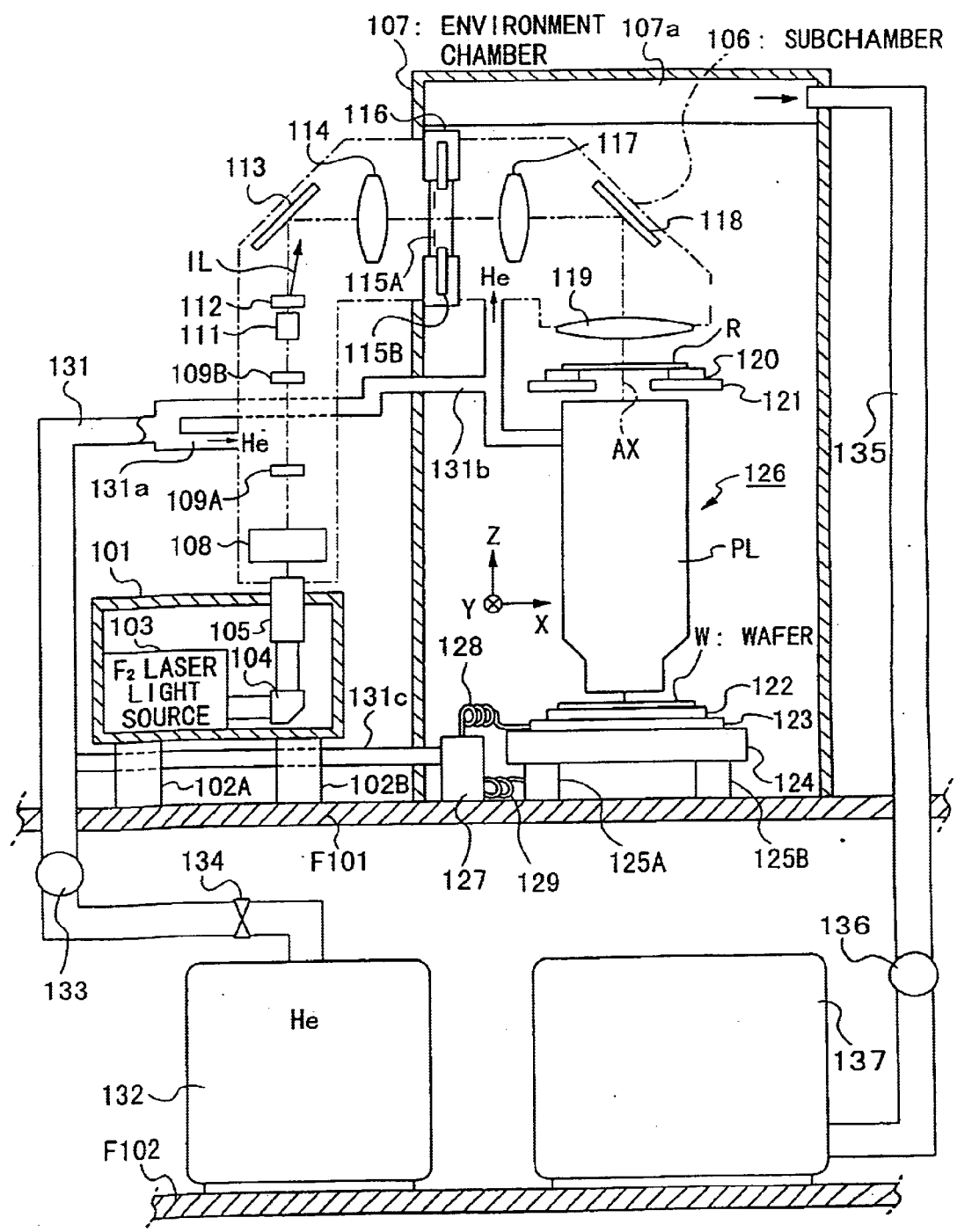
FIG. 5 is a schematic structural view in which a portion has been rendered in cross section, showing the projection exposure apparatuses and helium supply apparatus of an example of the third embodiment of the present invention.

FIG. 5 shows the outlines of the structure of the projection exposure apparatus of the present embodiment and the hydrogen supply apparatus; in this FIG. 5, the projection exposure apparatus is disposed within a clean room on a floor F101 of a semiconductor manufacturing facility, and a hydrogen supply apparatus for supplying helium gas to the projection exposure apparatus, and a recovery apparatus for recovering a portion of the helium gas, are disposed within an equipment chamber (utility space) on a floor F102 on a lower floor. In this way, the apparatuses which are likely to give rise to particulate matter and to be sources of vibration are disposed on a floor which is different than the floor on which the projection exposure apparatus is installed, and thereby, it is possible to set the interior of the clean room in which the projection exposure apparatus is installed to an extremely high degree of cleanliness, and to reduce the effects of vibration on the projection exposure apparatus.

First, a cylinder 132 which stores compressed helium gas is installed on floor F102, and helium, the temperature of which is controlled and is at a predetermined pressure, is supplied from this cylinder 132 to a pipe 131 which passes through a passage hole provided in floor F101 of the upper level. An electromagnetic type opening and closing valve 134 and blowing fan 133 are installed in pipe 131 at the side of bottom surface of the floor F101, and by means of this, the amount of helium supplied can be controlled.

Next, in the clean room on floor F101, a box shaped case 1 is installed via vibration isolation platforms 102A and 102B, and in this case 101, a $F_2$ laser light source 103 (with an oscillation wavelength of 157 nm) is installed as a exposure light source, and a beam matching unit (BMU) 104 containing movable mirrors and the like for positionally matching the optical path with the exposure main unit, and a light isolating pipe 105 through the interior of which the exposure light passes, are also installed. KrF or ArF excimer laser light sources or the like may be employed as the exposure light sources. Furthermore, an environment chamber 107 which is box shaped and which has good airtightness is disposed next to case 101, and within environment chamber 107, a fixed platform 124 is installed on floor F101 via vibration isolation platforms 125A and 125B for reducing the vibration from the floor, and exposure main unit 126 is disposed on fixed platform 124. Furthermore, a subchamber 106 having good airtightness is disposed in a framing manner from the pipe 105 which projects from within the case 101 to the interior of environment chamber 107, and the majority of the illumination optical system is contained in the subchamber 106.

In FIG. 5, during exposure, an ultraviolet pulse light IL having a wavelength of 157 nm reaches the interior of subchamber 106 via BMU 104 and the interior of pipe 105 as exposure light emitted from the $F_2$ laser light source 103 within case 101. In subchamber 106, the ultraviolet pulse light IL enters into a fly eye lens 111 via a beam forming optical system comprising, as an optical attenuator, a variable light reducer 108, and lens systems 109A and 109B. An aperture stop system 112 of the illumination system which serves to variously modify the illumination conditions is disposed at the output surface of the fly eye lens 111.

The ultraviolet pulse light IL which is emitted from the fly eye lens 111 and passes through a predetermined aperture diaphragm in the aperture stop system 112 passes a reflection mirror 113 and a condenser lens system 114 and is inputted into a fixed illumination field diaphragm (fixed blind) 115A having a slit shaped opening within a reticle blind mechanism 116. Furthermore, a movable blind 115B which serves to change the width in the scanning direction in the illumination field region is disposed within reticle blind mechanism 116 separately from fixed blind 115A, and by means of this moveable blind 115B, a reduction in the movement stroke in the scanning direction of the reticle stage, and a reduction in the width of the light blocked band of the reticle R, are achieved.

The ultraviolet pulse light IL which is formed in a slit shape by the fixed blind 115A of the reticle blind mechanism 116 passes image forming lens system 117, reflection mirror 118 and main condenser lens system 119, and illuminates at an equal intensity a slit shaped illumination region on the circuit pattern of reticle R. In the present embodiment, the space from the output surface of light-insulating pipe 105 to the main condenser systems 119 is contained within subchamber 106, and furthermore, the space from the inner part of pipe 105 to the output surface of the $F_2$ laser light source 103 is airtight, and communicates with the space within subchamber 106. Furthermore, helium gas which has a specified purity or greater and is temperature controlled is supplied from two points from the helium circulation apparatus into the space within subchamber 106 via branch pipes 131a and 131b of pipe 131. Helium has a low molecular weight and is susceptible to leaking, so that a portion of the helium which naturally leaks out of subchamber 106 rises and collects in the space 107a in the vicinity of the ceiling of the environment chamber 107.

On the basis of ultraviolet pulse light IL, the circuit pattern within the illumination region of reticle R is illuminated onto the slit shaped exposure region of the resist layer on a wafer W via projection optical system PL. This exposure region is positioned on one shot region within a plurality of shot regions on the wafer. The projection optical system PL in the present embodiment is a dioptric system (refraction system); however, since the glass which is able to transmit ultraviolet light having this type of short wavelength is limited, the projection optical system PL may be made a cata-dioptric system or a reflection system so as to increase the transmittivity of the ultraviolet pulse light IL in the projection optical system PL.

Furthermore, in the same manner as the interior of subchamber 106, temperature controlled helium gas having a predetermined concentration or greater is supplied to the entirety of the space within the barrel of the projection optical system PL of the present embodiment (the space between the plurality of lens elements), from the helium circulation apparatus in the lower floor and via branch pipe 131b of pipe 131. The helium leaking from the barrel of the projection optical system PL rises and collects in the space 107a in the vicinity of the ceiling of the environment chamber 107. In the following, a Z axis is obtained which is parallel to the optical axis AX of the projection optical system PL, and in a plane perpendicular to the Z axis, a X axis will be established which is parallel to the paper surface of FIG. 5, and a Y axis will be established which is perpendicular to the paper surface of FIG. 1.

At this time, reticle R is supported by vacuum on the reticle stage 120, and reticle stage 120 is made moveable at a constant velocity in the X direction (the scanning direction) on reticle base 121, and is installed so as to be capable of slight movements in the X direction, the Y direction, and the rotational direction. The two dimensional position of reticle stage 120 (reticle R) and the rotational angle thereof are controlled by a drive control unit, which is not depicted in the figure, which is provided with a laser interferometer.

On the other band, wafer W is supported by vacuum on a wafer holder not depicted in the figure, and the wafer holder is affixed to the sample platform 122, while the sample platform 122 is positioned on the XY stage 123, and the XY stage 123 is placed on fixed platform 124. The wafer stage comprises sample platform 122, the XY stage 123, and guide members not depicted in the figure, and sample platform 122 controls the focus position of wafer W (the position in the Z axis) in an auto focus manner, and controls the angle of inclination, so as to bring the surface of wafer W into agreement with the image plane of the projection optical system PL. Furthermore, XY stage 123 conducts the constant velocity scanning of wafer W in the X direction, and stepping in the X and Y directions. The two dimensional position of XY stage 123 (wafer W) and the rotational angle thereof are controlled by means of a drive control unit which is not depicted in the figure and which is provided with a laser interferometer. During scanning exposure, reticle R is scanned at a velocity of Vr in the +X direction (or in the −X direction) with respect to the illumination area of the ultraviolet pulse light IL, via reticle stage 120, and synchronously therewith, this wafer W is scanned in the −X direction (or in the +X direction) at a speed of β·Vr (where β is the projection magnification from reticle R onto wafer W), with respect to the exposure region and via the XY stage 123.

Furthermore, the XY stage 123 in the wafer stage of the present embodiment is of a type which moves in a non-contacting manner along a guide surface by the static pressure gas bearing method, and the same helium which is supplied to the optical path of the ultraviolet pulse light IL may be employed as the gas of this static pressure gas bearing. Furthermore, the vibration isolation platforms 125A and 125B which support the fixed platform 124 employ the gas spring method, and helium is used as the gas of this gas spring. For this reason, a temporary storage cylinder is disposed within environment chamber 107, and helium is supplied from the hydrogen supply apparatus of the lower floor to the temporary storage cylinder 127 via branch pipe 131c of pipe 131, and helium is supplied to the XY stage 123 from the temporary storage cylinder 127 via a highly flexible pipe 128 (which comprises a plurality of pipes in actuality), and in parallel with this, helium is supplied to vibration isolation platforms 125A and 125B as well via highly flexible pipe 129 (in actuality comprising a plurality of pipes). The static pressure gas bearing mechanism of the XY stage 123 will be discussed hereinbelow.

Furthermore, in the present embodiment, nitrogen gas ($N_2$), which is temperature controlled, and the amount of oxygen contained in which is suppressed at an extremely low level, is supplied to the interior of the environment chamber 107 from a nitrogen circulation apparatus on the lower floor which is not depicted in the figure. Then, the nitrogen gas circulating in the environment chamber 107 returns from, for example, an exhaust hole (not depicted in the figure) in the lower surface side of the environment chamber 107 to the nitrogen circulation apparatus. In place of the nitrogen gas, helium may be circulated to the entirety of the interior of the environment chamber 107.

Next, within environment chamber 107, the helium which leaks from the subchamber 106 and the helium which leaks from the projection optical system PL and the XY stage 123 and the like is lighter than the air or nitrogen which becomes mixed in from the exterior of the environment chamber 107, so that it rises and collects in the space 107a in vicinity of the ceiling. In the present embodiment, a pipe 135 is connected to this space 107a from the exterior of the environment chamber 107, and the pipe 135 passes through an opening provided in floor F101 and communicates with the helium recovery apparatus in the lower floor. A suction fan 136 is installed in the pipe 135 at the bottom surface side of floor. F101, and the gas which is sucked from the space 107a by the pipe 135 and the fan 136 is recovered in recovery cylinder 137 on the floor F102 of the lower floor. A dust collecting and moisture removing apparatus, and a separation apparatus for separating the helium from the other gases, are provided within the cylinder 137, and the separated helium is stored, and where necessary, is supplied to a process for increasing the purity thereof.

Next, the static pressure gas bearing mechanism of the XY stage 123 on the wafer stage side of the present embodiment will be explained with reference to FIG. 6.

Figure 6:
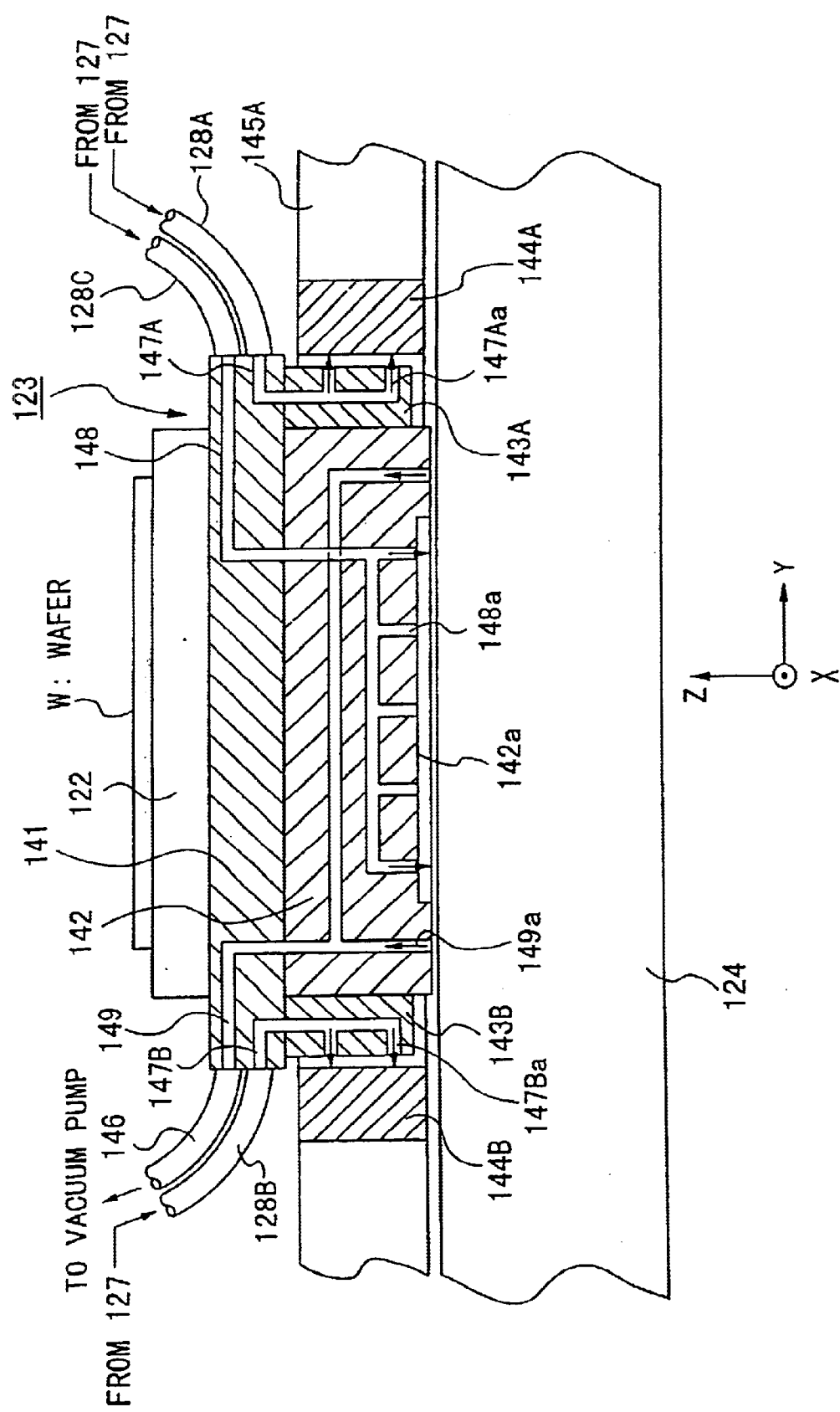
FIG. 6 is a cross sectional view of the main parts of the wafer stage in FIG. 5 as viewed from the X direction.

FIG. 6 shows a cross sectional view of a portion of the wafer stage in FIG. 5 viewed from the X direction, and in this FIG. 6, wafer W is affixed to the upper plate 141 via a sample platform 122, and a bottom plate 142 is affixed to the bottom surface of the upper plate 141, and bottom plate 142 is placed on the upper surface of fixed platform 124, which upper surface is polished so as to be flat. Furthermore, the bottom plate 142 is affixed to bearing plates 143A and 143B so as to be sandwiched therebetween in the Y direction, and two X guide bars 144A and 144B are installed in a framing manner parallel thereto along the X direction so as to sandwich the bearing plates 143A and 143B in the Y direction. The upper plate 141, lower plate 142, and bearing plates 143A and 143B comprise the XY stage 123, and the XY stage 123 is driven in the X direction along the X guide bars 144A and 144B by a linear motor which is not depicted in the figure. Furthermore, the X guide bars 144A and 144B are unitary, and are driven in the Y direction by a linear motor which is not depicted in the figure along two Y guide bars 145A (a further one is disposed on the front side) which are disposed so as to extend in the Y direction.

Furthermore, a passage hole 147A is formed from upper plate 141 to being plate 143A, and helium compressed to a predetermined pressure is supplied from the temporary storage cylinder 127 in FIG. 5 to passage hole 147A on the upper plate 141 side via pipe 128A, and this helium is blown out from blow hole 147Aa of bearing plate 143A onto the X guide bar 144A. In the same way, helium compressed to a predetermined pressure is supplied from the temporary storage cylinder 127 in FIG. 5 to the passage hole 147B on the upper plate 141 side via pipe 128B, and this helium is blown from blow bole 147Ba within bearing plate 143b onto the X guide bar 144B. By means of this, the bearing plates 143A and 143B are supported in a non-contacting manner while maintaining a predetermined gap with X guide bars 144A and 144B.

Furthermore, a passage hole 148 is formed from upper plate 141 to lower plate 142, and helium which is compressed to a predetermined pressure is supplied from the temporary storage cylinder 127 of FIG. 5 to the passage hole 148 on the upper plate 141 side via pipe 128C, and this helium is blown from the blow hole 148a which is provided in the bottom surface of the bottom plate 142 onto the fixed platform 124. A shallow gas pocket part 142a is formed in the region containing the blow hole 148a of the bottom surface of the bottom plate 142, and by means of the pressurized helium which collects in this gas pocket part 142a, the XY stage 123 floats on the upper surface of the fixed plate. Here, an air intake hole 149a is formed in the periphery of the gas pocket part 142a of the bottom surface of the bottom plate 142 so that the XY stage 123 does not float excessively, and the air intake hole 149a communicates with the passage hole 149 which is formed within bottom plate 142 and upper plate 141. The passage hole 149 is connected to a suction pump which is not depicted in the figure via highly flexible pipe 146, and by sucking gas (chiefly helium) from above fixed platform 124 through the air intake hole 149a of the bottom plate 142 using this vacuum pump, the XY stage 123 is stably supported in a non-contacting manner above the fixed platform 124.

In this way, the XY stage 123 of the present embodiment is placed in a non-contacting manner in the Z direction with respect to the fixed platform 124 by the gas bearing method employing helium and is installed in a non-contacting manner in the Y direction with respect to the X guide bars 144A and 144B by the gas bearing method using helium, so that it is possible to move this stage at a high rate of speed using an extremely small amount of force in the X direction and the Y direction on the fixed platform 124.

In this way, in the present embodiment, helium gas which has a transmittivity with respect to light of 150 nm or less, as well, is supplied to the optical path of the ultraviolet pulse light IL from the output surface of the $F_2$ laser light source 103 of FIG. 5 to the main condenser lens system 119, as well as to the optical path of the ultraviolet pulse light IL within the projection optical system PL. Furthermore, the spaces from the main condenser lens system 119 to the input surface of the projection optical system PL, and from the output surface of the projection optical system PL to the surface of the wafer W are supplied with nitrogen gas, which does not have very good transmittivity with respect to light of 150 nm or less; however, the optical path which passes through this nitrogen gas is extremely short, so that there is little absorption as a result of the nitrogen gas. Accordingly, the ultraviolet pulse light IL which is emitted from the $F_2$ laser light source 103 reaches the surface of wafer W at an overall high transmittivity (efficiency of use), so that it is possible to reduce the exposure period (scanning exposure period) and it is possible to increase the throughput of the exposure process.

Furthermore, in the present embodiment, the gas used for the static pressure gas bearing using the XY stage 123 on the wafer side is helium, and the gas employed in the vibration isolation platforms 125A and 125B is also helium. For this reason, there is no decline in the purity of the helium of the optical path of the ultraviolet pulse light IL as a result of the use of the static pressure air bearings or the like during exposure, and the addition of a gas having a lower transmittivity is prevented in the remainder of the optical path of the ultraviolet pulse light IL, so that the overall transmittivity of the ultraviolet pulse light IL does not decline.

Furthermore, the nitrogen and helium are inert, so that fogging substances are not deposited on the optical members in the optical path of the ultraviolet pulse light IL as a result of chemical reactions.

Furthermore, helium has a thermal conductivity which is approximately six times that of nitrogen, so that the heat energy which is built up as a result of the application of the ultraviolet pulse light IL at the optical elements within the illumination optical system and the optical elements within the projection optical system PL is efficiently transmitted to, respectively, the cover of the subchamber 106, and the barrel of the projection optical system PL via the helium gas. Furthermore, the heat energy of the cover of the subchamber 106, and the barrel of the projection optical system PL, is efficiently exhausted to the exterior, such as lower floors, or the like, by temperature controlled air within the clean room or by temperature controlled nitrogen gas within the environment chamber 107. Accordingly, the rise in temperature of the optical elements of the illumination optical system and the projection optical system PL can be maintained at a very low level, and it is possible to control degradation and image formation characteristics at a minimum level. Furthermore, the amount of change in the index of refraction of helium in response to changes in air pressure is very small, so that the amount of change in the index of refraction within, for example, the projection optical system PL is extremely small and for this reason, as well, it is possible to maintain stable image formation characteristics.

Among the machinery employed in the projection exposure apparatus, that which employs gas includes, for example, gas type cylinder apparatuses employed in the conveyance of the reticle holder system or the wafer holder system. The cylinder apparatuses are provided with a plurality of pistons, and by extending and retracting these pistons using gas, predetermined parts may be moved. It is desirable that helium be used as the gas in these cylinder apparatuses. By means of this, the transmittivity of the ultraviolet pulse light IL can be further improved.

In the embodiment described above, a $F_2$ laser light was employed as the exposure energy beam; however, even in cases when a ArF excimer laser light (with a wavelength of 193 nm) or KrF excimer laser light (with a wavelength of 248 nm) or X-rays or the like arm employed as the exposure energy beam, when an inert gas such as helium or nitrogen is supplied to at least a portion of the optical path of the exposure energy beam as a gas having good transmittivity, the present application may be applied. In particular, when exposure light having a wavelength within a range of 250 nm–200 nm, such as KrF excimer laser light, is employed, inexpensive nitrogen can be employed as the gas having good transmittivity. When nitrogen is employed in this way, it is desirable that the gas used in the static pressure air bearing of the XY stage 123 in FIG. 6 and as the gas in the vibration isolation platforms 125A and 125B in FIG. 5 be nitrogen.

On the other hand, in a projection exposure apparatus which employs ArF excimer laser light having a wavelength of 193 nm as the exposure light, when the projection optical system comprises a cata-dioptric optical system, it is desirable that helium, which has little change in the refractive index, be employed as the gas used to purge the optical system. In this case, the illumination optical system may be purged with either nitrogen or helium; however, it is desirable that the same gas be employed as in the projection optical system, that is to say, helium. Furthermore, when ArF excimer laser light is employed and a projection optical system is employed which comprises a refraction optical system, nitrogen may be employed as the gas used to purge the interior of the projection optical system; however, the use of helium is desirable.

Furthermore, in the present embodiment, an inert gas (helium or nitrogen or the like) which was identical to that used for purging which was supplied to the illumination optical system and projection optical system PL was employed as the gas used in the static pressure gas bearing mechanism (FIG. 6), the air cylinder apparatuses, and the like in the present embodiment; however, when, for example, helium is supplied to the projection optical system PL and the like and nitrogen is supplied to the environment chamber 107, the space between the illumination optical system and the projection optical system PL, and the space between the projection optical system PL and the wafer W have nitrogen atmospheres, so that nitrogen may employed in the static pressure gas bearing mechanism described above and the like. At this time, a gas consisting of a mixture of nitrogen and helium at predetermined proportions may also be used in the static pressure gas bearing mechanism and the like.

Furthermore, the first gas which is employed in the static pressure gas bearing mechanism and the like described above, and a second gas for purging which is supplied to the illumination optical system and the projection optical system PL (an inert gas such as nitrogen, helium, or the like), or a second gas which is supplied to the environment chamber 7 (an inert gas for chemically clean dry air or the like) need not have completely identical compositions, or alternatively, if the compositions are the same, the purity (concentration) thereof need not be identical. For example, a mixed gas containing two or more gases (inert gases) containing the second gas, or a gas which is the same as the second gas but has a lower purity than the second gas may be employed as the first gas.

Furthermore, if the gas (inert gas) is capable of reducing attenuation in exposure light, then this gas may be used as the first gas even if it differs from the second gas. That is to say, if the gas is such as to have the same or similar optical characteristics (transmittivity or the like) as the second gas, even if it differs from the second gas, it may be employed as the first gas. For example, when helium is used as the second gas in an exposure apparatus which employs exposure light in the vacuum ultraviolet band having a wavelength of 200 nm or less, at least one type of inert gas (nitrogen or the like) other than helium may be employed as the first gas. Furthermore, when nitrogen is employed as the second gas in an exposure apparatus which uses exposure light having, for example, a wavelength of 190 nm or more, at least one type of inert gas other than nitrogen, or chemically dean dry air (desiccated air) may be employed as the first gas. Here, what is meant by chemically clean is a state in which impurities including the silicon system organic materials and the like described above have been removed.

Furthermore, the exposure main unit 126 of the present embodiment is a step and scan type; however, it is of course the case that the present invention may applied even when a stepping exposure type or a proximity type or the like is employed.

In the embodiment described above, helium gas was supplied to the optical path of the ultraviolet pulse light IL from the output surface of the $F_2$ laser light source 103 to the main condenser lens system 119, and to the optical path of the ultraviolet pulse light IL within the projection optical system PL, and nitrogen was supplied from the main condenser lens system 119 to the input surface of the projection optical system PL and from the output surface of the projection optical system PL to the surface of the wafer W; however, it is also possible to apply the helium circulation apparatus and nitrogen circulation apparatus shown in the first and second embodiments to this embodiment. Furthermore, the modifications described in the first and second embodiments may applied in an unchanged fashion.

In the first through third embodiments described above, a fly eye lens was used as an optical integrator (homogenizer); however, in place of the fly eye lens, a rod integrator may be employed, or alternatively, a fly eye lens and a rod integrator may be employed in a combined manner.

Figure 7:
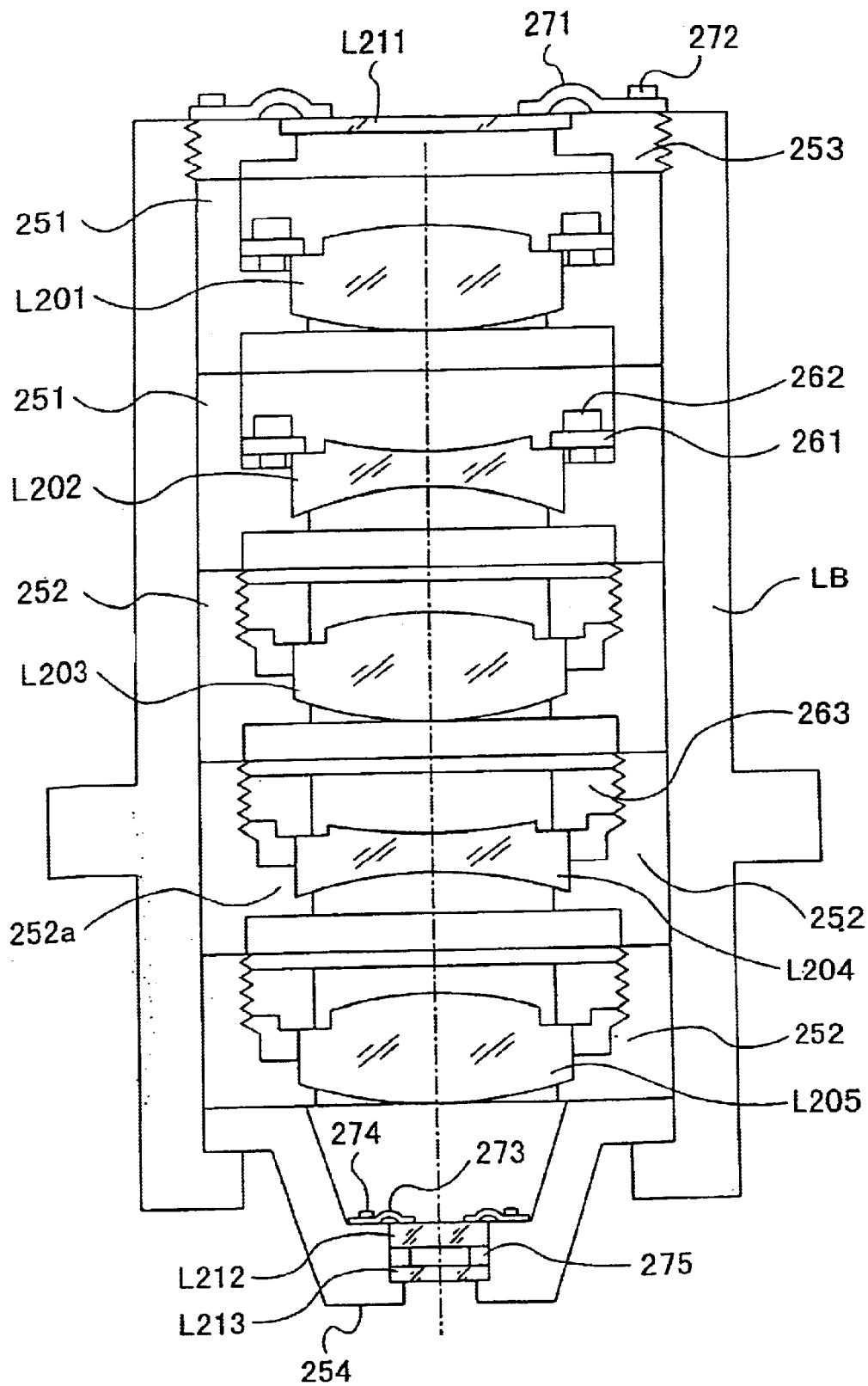
FIG. 7 shows the concept in the case in which the lenses of the projection optical system are supported by flat springs.

FIG. 7 is a diagram showing an example of a preferred support structure for the optical elements of the projection optical system PL in the first embodiment of FIG. 1, the second embodiment shown in FIG. 4, and the third embodiment shown in FIG. 5.

Five refraction type lenses L201–L205 are supported within a cylindrical barrel LB via lens support tubes 251 and 252, and a parallel flat plate L211 which corrects distortion, particularly the non-rotationally symmetric component, is supported via a lens support tube 253 at the reticle side end of barrel LB, and parallel flat plate L212, which compensates for the spherical aberration, as well as a parallel flat plate L213, which compensates for the eccentric top aberration, are supported at the wafer side end of the barrel LB via lens support member 254.

Figure 8:
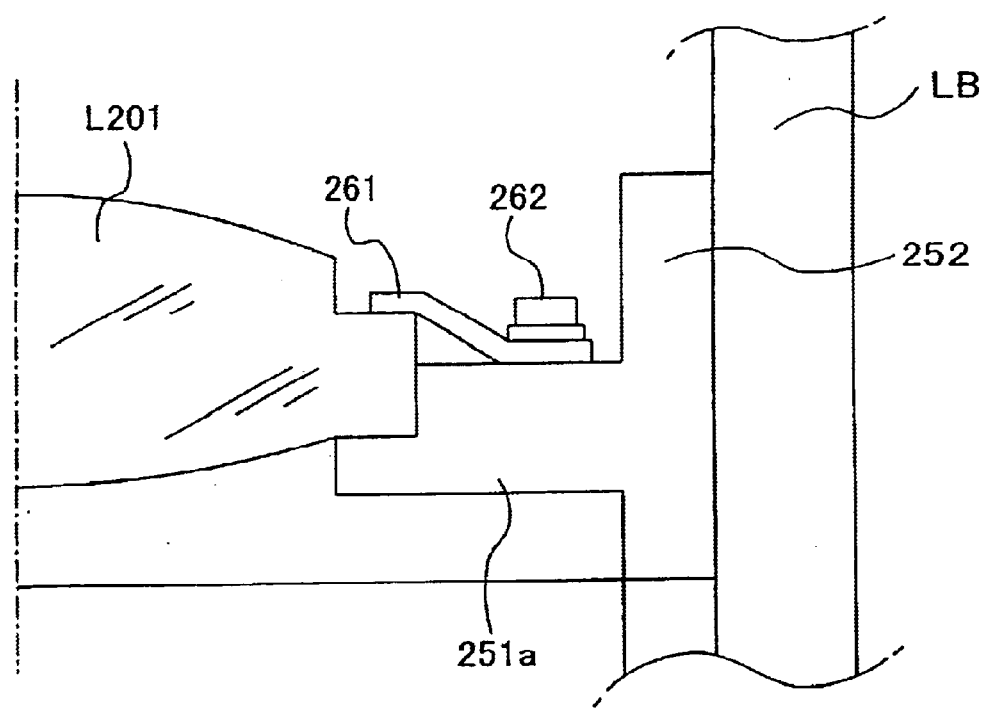
FIG. 8 is a detailed view of the press-attachment mechanism employing flat springs.

Lenses L201 and L202 are pressure supported in support tube 251 by flat spring 261. As shown in detail in FIG. 8, one end of flat spring 261 is screwably attached to the projecting end 251a of lens support tube 251 with a bolt 262, while the other end presses against the pressure flat face of the outer circumferencial part of lens L201, and by means of this, lens L201 is held from both sides by pressure against projecting part 251a. Lens 1202 is affixed in lens barrel LB in the same manner. Both lenses L201 and L202 are supported in lens barrel LB via support tube 251 without the use of any adhesive (or filler).

As shown in FIG. 7, lenses L203–L205 are held by pressure in support tube 252 by screw ring 263. A female thread is provided in the inner wall of support tube 252, and screw ring 263 is screwably attached thereto. When screw ring 263 is screwably advanced and the end surface thereof presses against the pressure flat part of the outer circumferencial part of lenses L203–L205, lenses L203–L205 are supported from both sides by pressure against the projecting part 252a of the support tube 252. Lenses L203–L205 are supported in lens barrel LB via support tube 252 without the use of any adhesive (or filler) at all.

As shown in FIG. 7, parallel flat plate L211 is press-supported on support tube 253 by flat springs 271. Support tube 253 is screwably attached to barrel LB. One end of flat spring 271 is screwably attached to support tube 253 by bolts 272, while the other end presses against the outer circumferencial part of the flat plate L211, and by means of this, the flat plate L211 is supported from both sides by pressure against the support tube 253. Flat plate L211, as well, is supported in lens barrel LB via support tube 253 without the use of any adhesive (or filler) at all.

As shown in FIG. 7, parallel flat plate L212 is supported in support tube 254 by flat spring 273. One end of flat spring 273 is screwably attached to support tube 254 by bolt 274, while the other end thereof presses against the outer circumferencial part of the parallel flat plate L212, and by means of this, parallel flat plate L212 is supported from both sides by compression against support tube 254. Support tube 254 is supported between the support tube 252 and the barrel LB. Parallel flat plate L213 is affixed to the support tube 254 so as to bracket the spacer ring 275 between it and parallel flat plate L211. Parallel flat plates L212 and L213, as well, are supported in barrel LB via support tube 254 without the use of any adhesive (or filler) at all.

It is possible to use ring shaped flat springs as the flat springs 261, 271, and 273; however, a plurality of belt shaped flat springs may also be disposed at predetermined angles. Furthermore, in the foregoing, the optical elements were attached and supported by the support tubes using flat springs or screw rings; however, the optical elements may be supported by elements of other forms.

Next, the fly eye lenses 11, and 111 will be explained in detail with reference to FIGS. 9 and 10.

Figure 9:
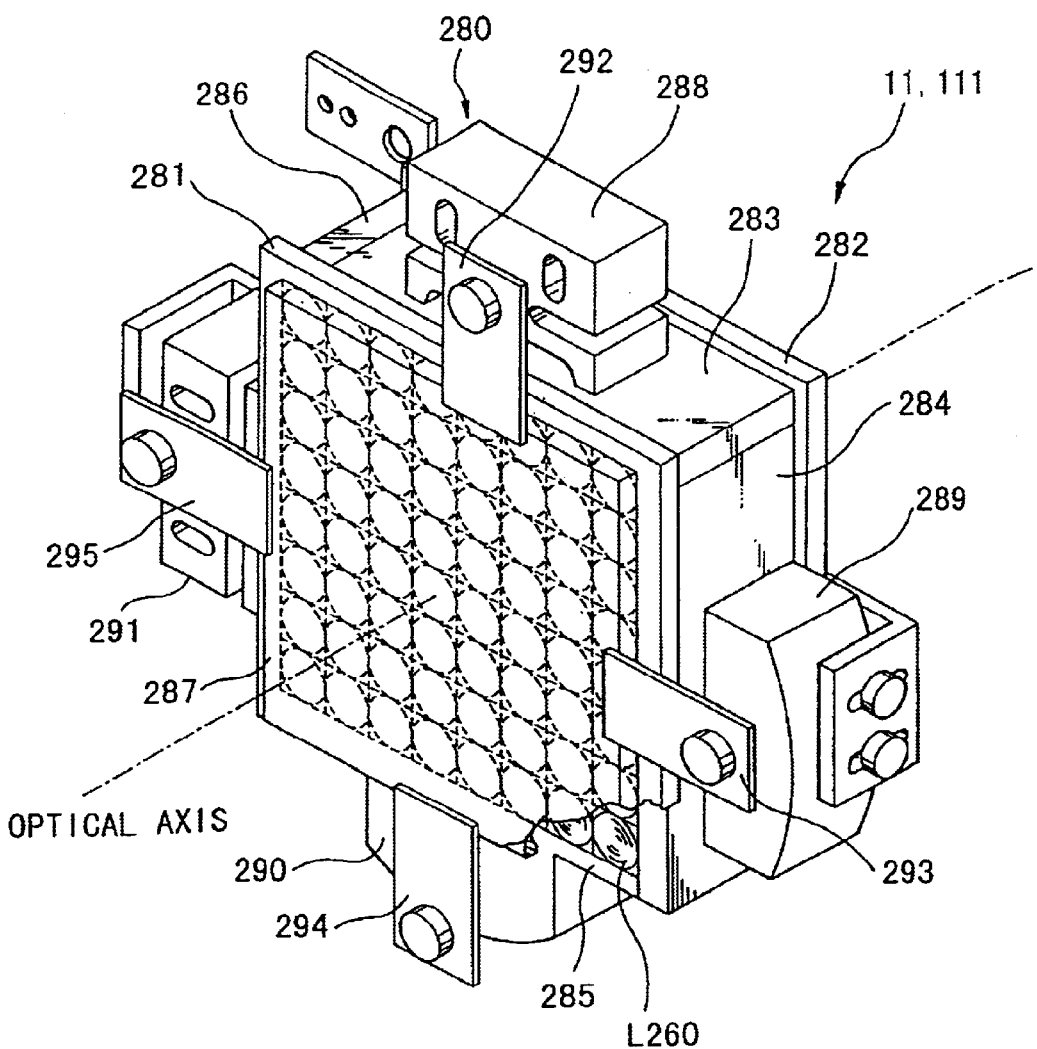
FIG. 9 is a perspective view showing the details of the fly eye lens.
Figure 10A:
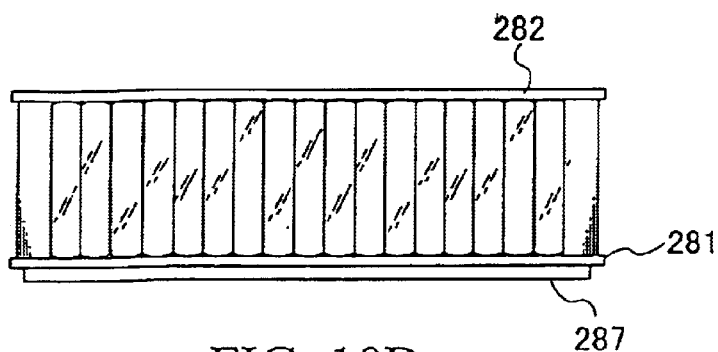
Figure 10B:
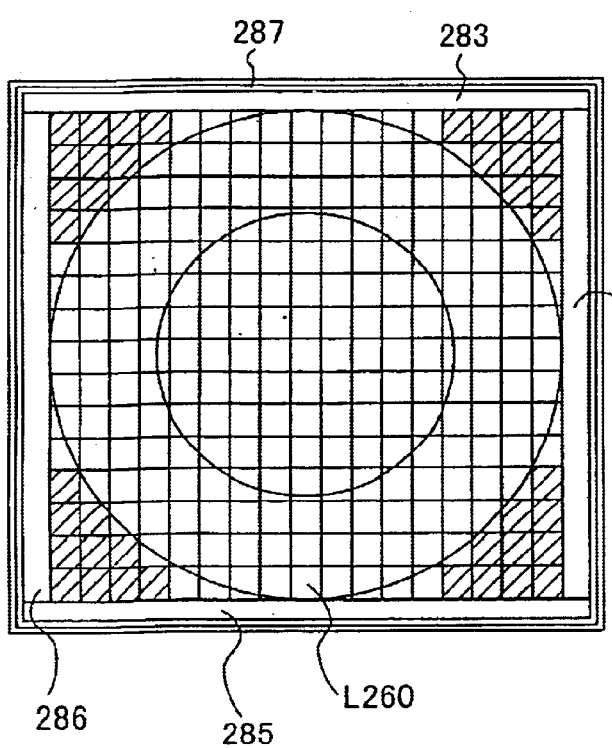
FIG. 10B is a front view thereof.
Figure 10C:
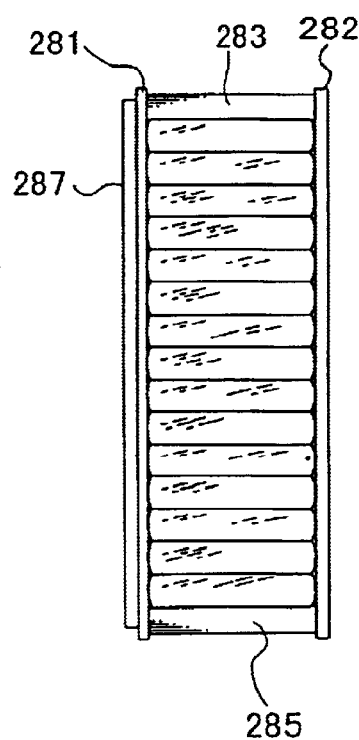
FIG. 10C is a side view thereof.
Figure 1:
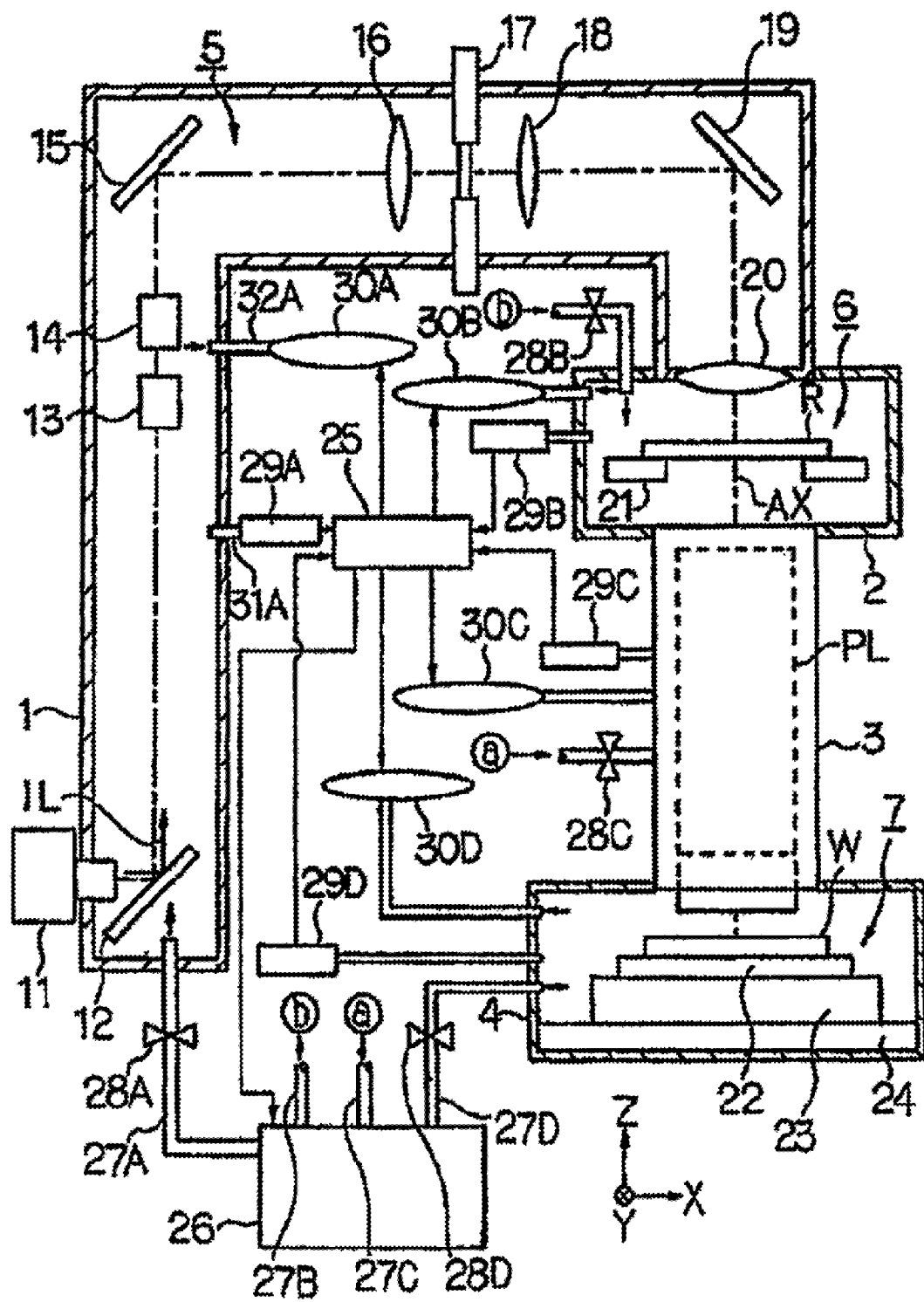
Figure 2:
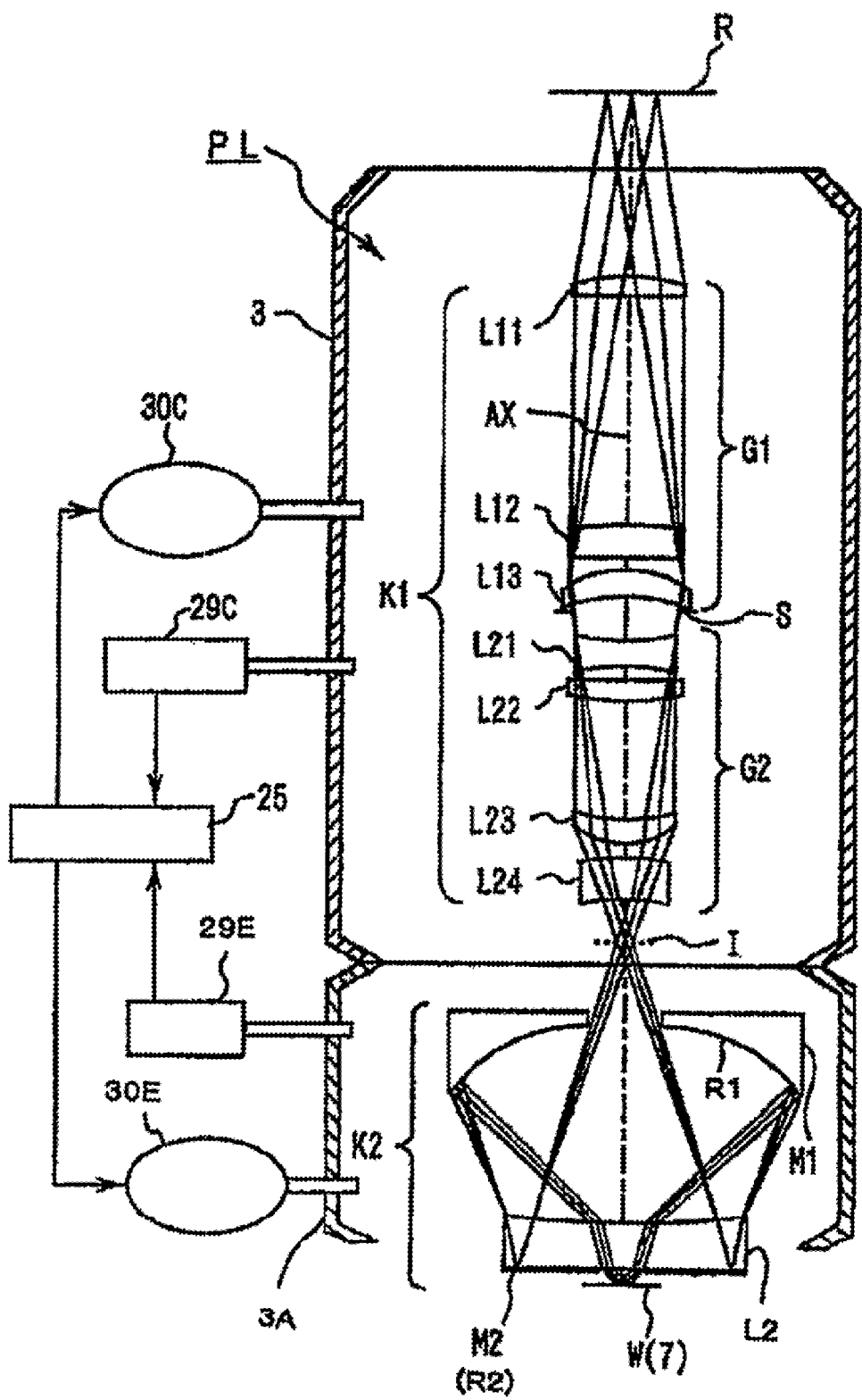
Figure 3:
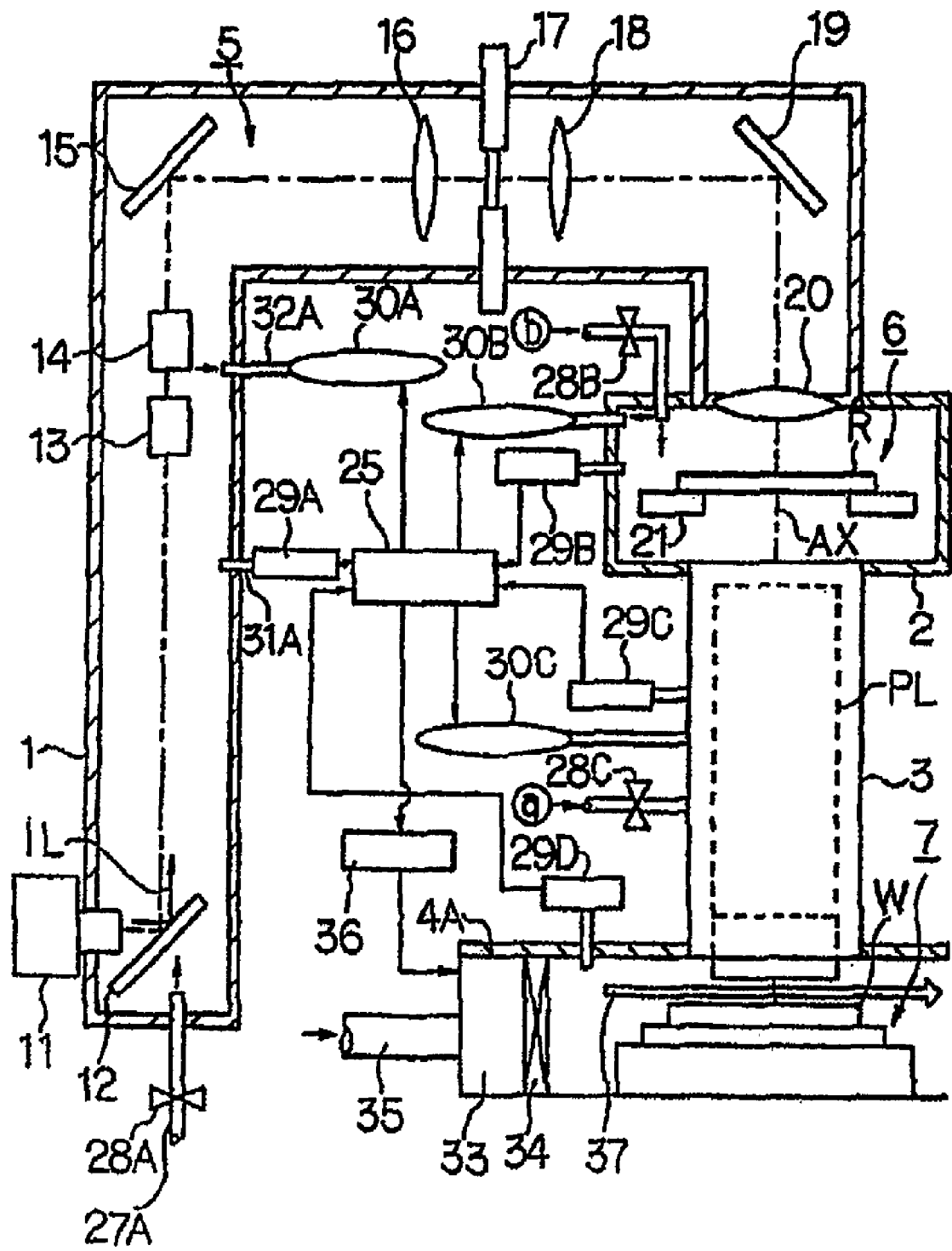
Figure 4:
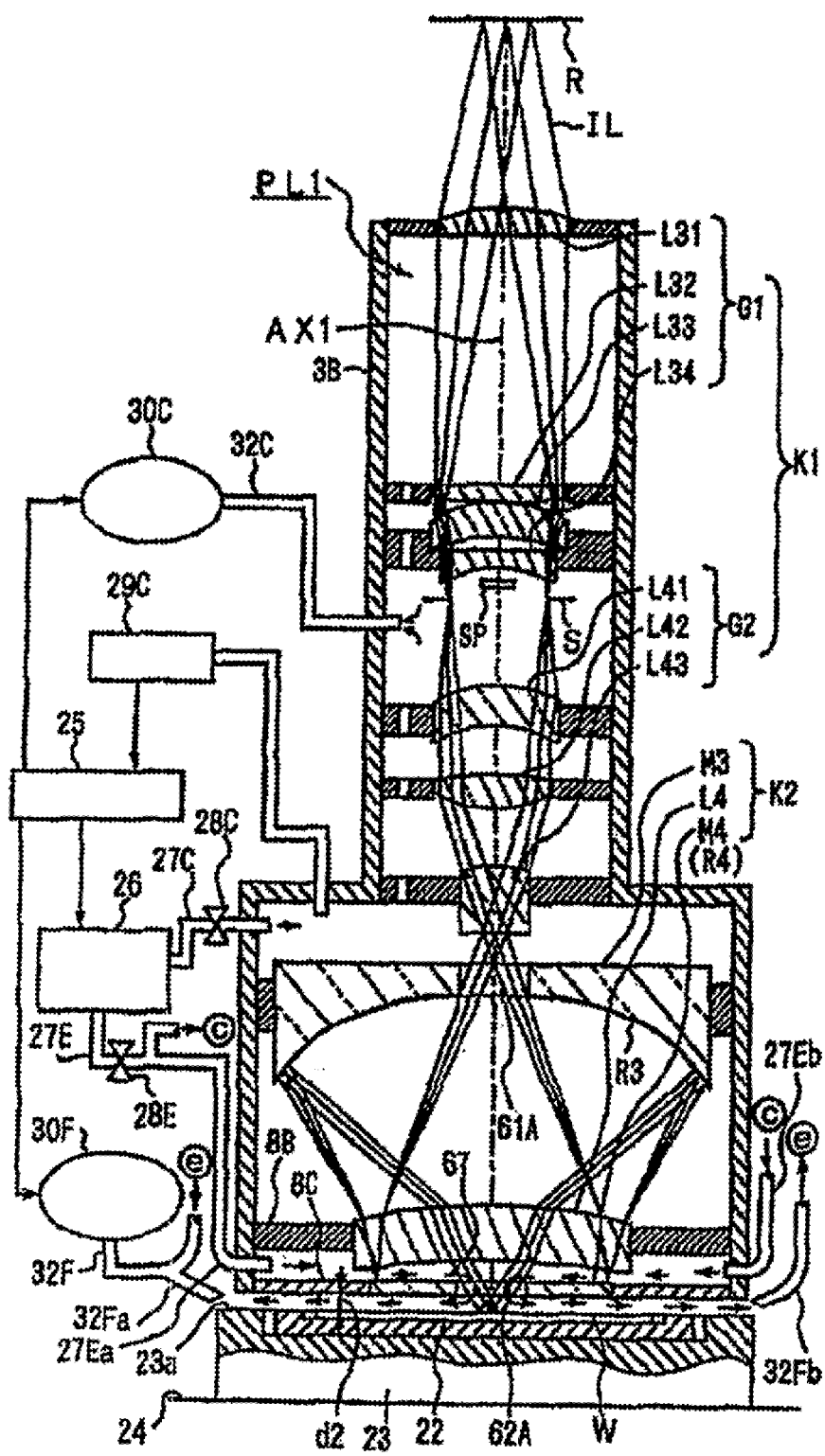
Figure 1:
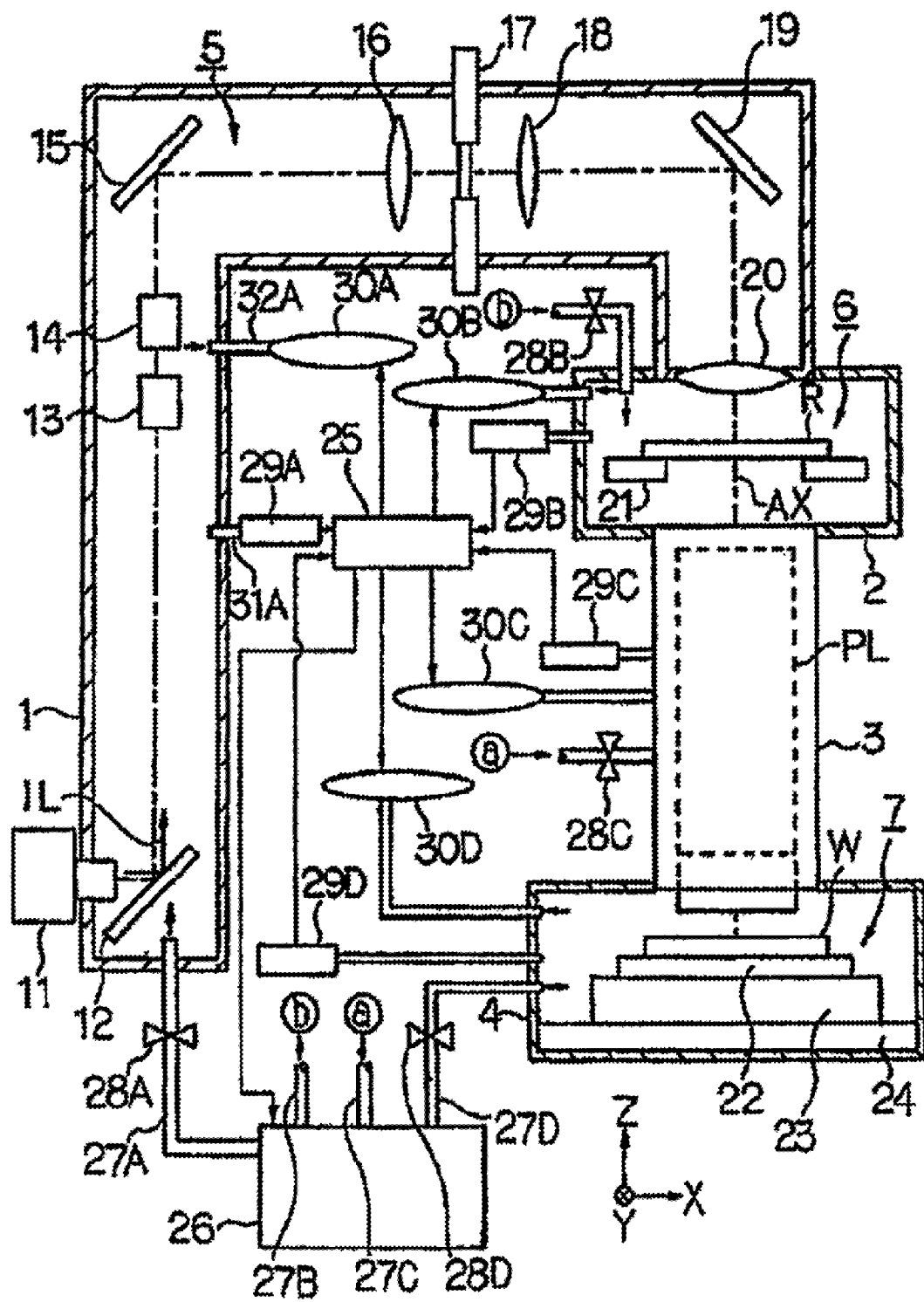
Figure 2:
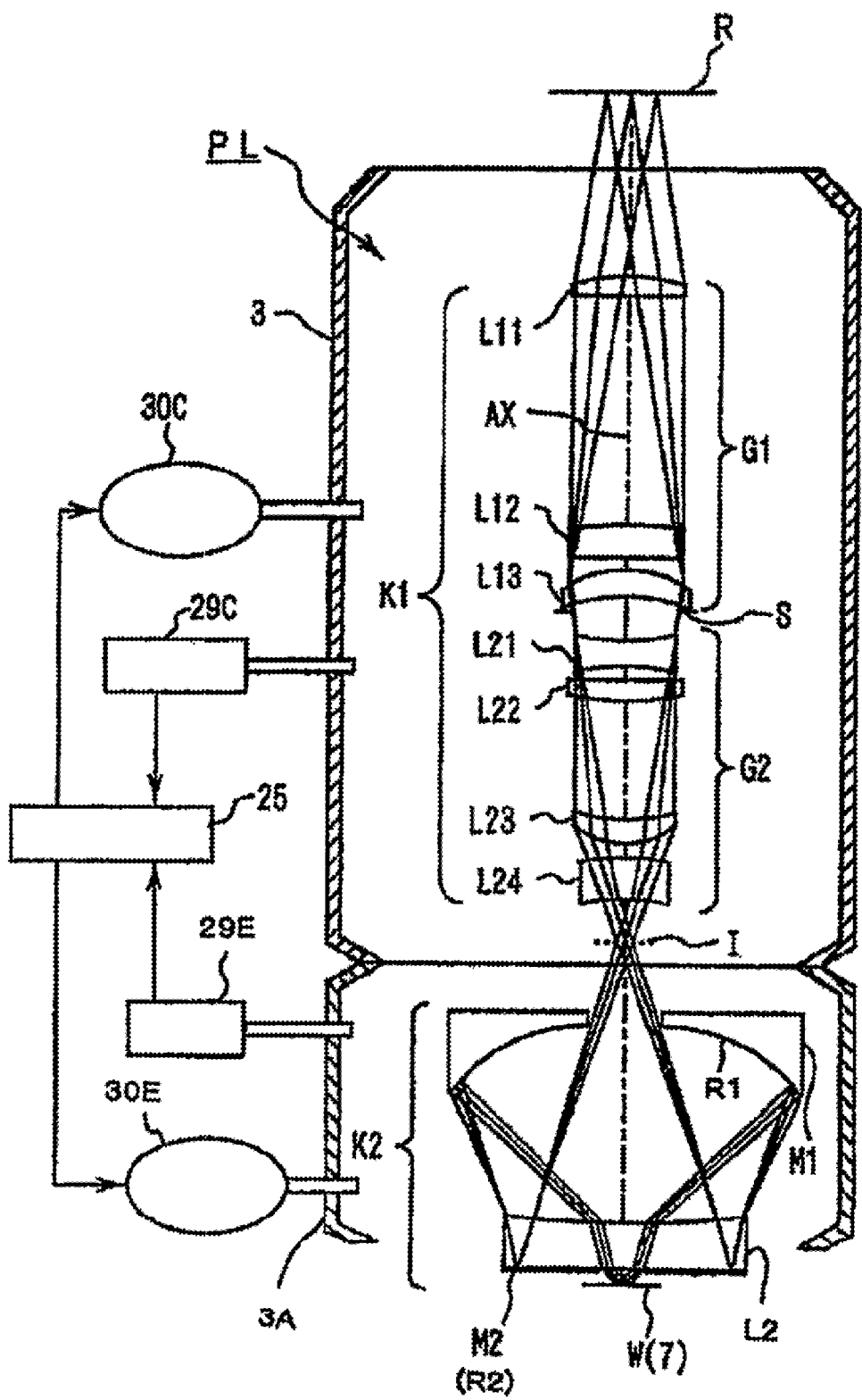
Figure 3:
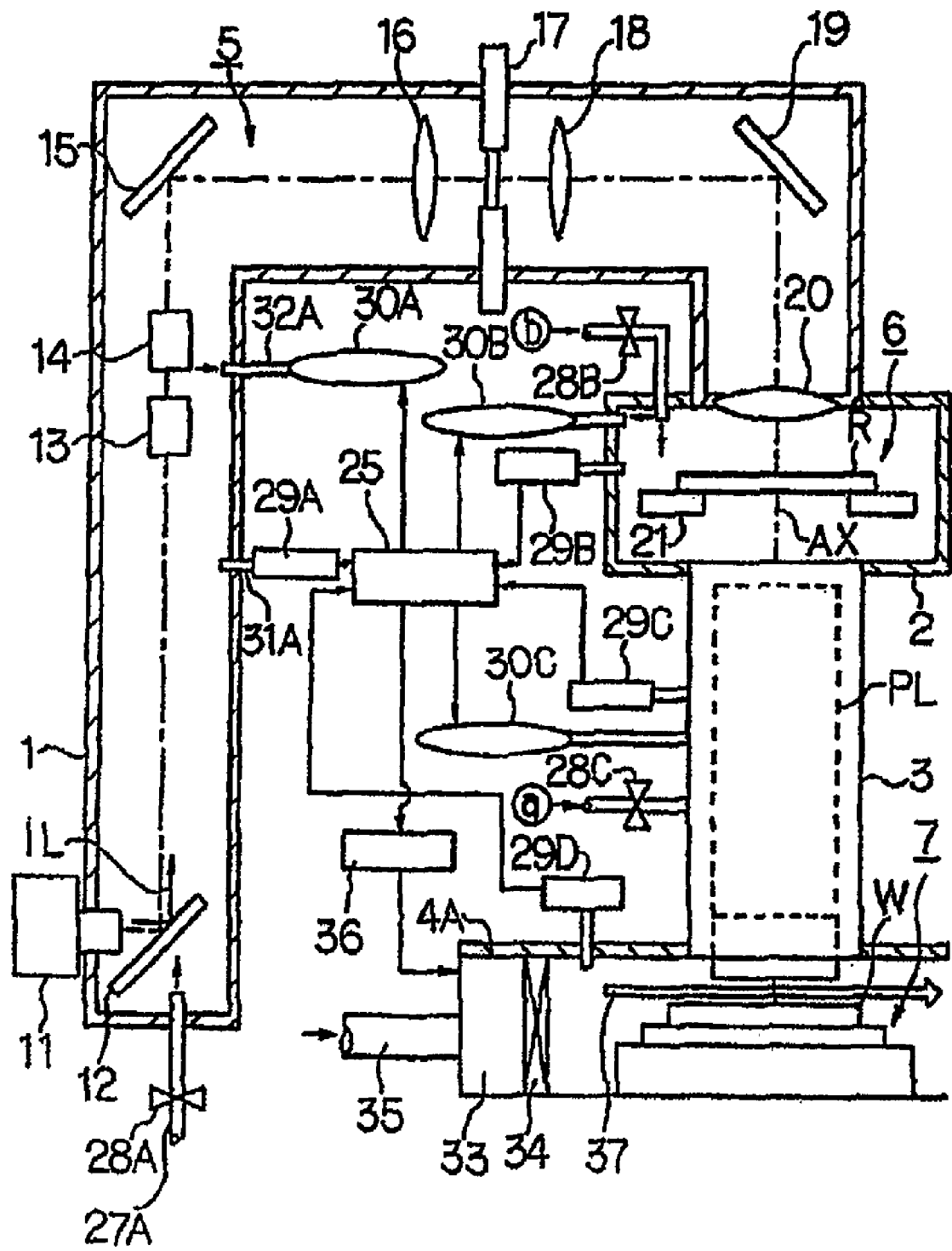
Figure 4:
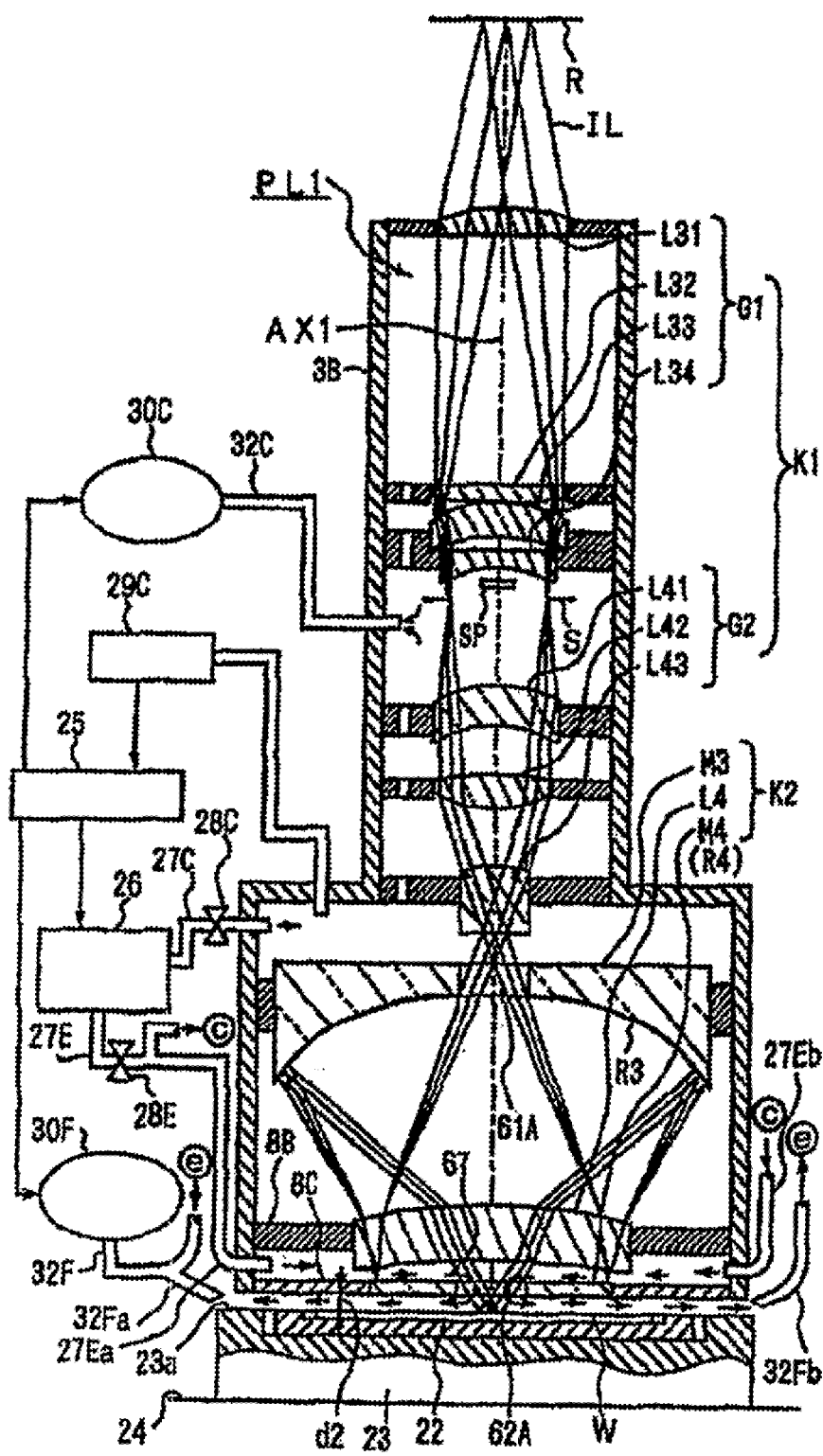

As shown in FIGS. 9 and 10, fly eye lenses 11 and 111 are produced by bundling a plurality of rod lenses L260 having the shape of square columns in a support mechanism 280 wherein they are arranged in the form of a matrix, as shown in FIG. 10B. Support apparatus 280 is provided with frames 281 and 282 which have the shape of rectangular rings and on the inside of which are collected and contain the rod lenses L260; pressing plates 283–286, which press the rod lenses L260 collected in frames 281 and 282 from the four side surfaces; a silica plate 287, which arranges the position in the direction of the optical axis of the rod lenses L260 and which is disposed at one end surface of the rod lenses L260; pressing blocks 288–291, which serve to press the rod lenses L260 from one side via pressing plates 283–286; and pressing plates 292–295, one end of which is affixed to the pressing blocks 288–291 and the other end of which presses silica plate 287. The pressing blocks 288–291 are attached to affixing fixtures which are not depicted in the figure. In this way, the rod lenses L260 are collected and supported without the use of any adhesive (or filler) at all: In FIG. 10B the regions other than the regions indicated by slanting lines are those regions which may be effectively employed as the fly eye lens.

In this way, the optical elements such as lenses, reflecting mirrors, and the like are supported by support members such as support tubes or the like using flat springs or screw rings without the use of adhesives. Accordingly, the volatilization of the organic solvents of adhesives as a result of the application of the ArF excimer laser is eliminated, and contamination of the surfaces of the optical elements by organic materials is prevented. As a result, a decline in the transmittivity of the optical system is prevented. Furthermore, a phenomenon is known in which the contaminant substances which arm deposited on the surfaces of the optical elements are stripped from the surfaces of the optical elements by the effects of the light washing of the excimer laser, and as the exposure time passes, the transmittivity rises, and when the illumination of the excimer laser is halted, these are redeposited and the transmittivity decreases; however, by means of supporting the optical elements on support members without the use of adhesive, the generation of the contaminant materials themselves is suppressed, and it is possible to control fluctuations in the transmittivity of the optical system.

In the correspondence between the example of the projection optical system explained above and the elements in the claims, the various lenses 9A (109A), 9B (109B), 11 (111), 13 (113), L201, and L202 . . . form the optical elements, support tubes 251, 252, 253, and 254 and the like form the support members, and flat springs 261, 271, and 273 and pressure ring 263 form the press-attachment mechanism.

INDUSTRIAL APPLICABILITY

In accordance with the exposure apparatus and the device manufacturing apparatus of the present invention, at least a portion of the gas having high transmittivity with respect to the exposure energy beam (exposure light) and which has good heat transmittivity is recovered, so that the efficiency of use of the exposure energy beam is increased, and the cooling efficiency of the optical elements and the like of the exposure apparatus is increased, and this has an advantage in that the amount of gas employed can be reduced. In other words, this gas can be recycled to a certain extent, and the operating costs of the exposure apparatus can be reduced.

Furthermore, when this gas is helium, because helium is stable and has a high transmittivity and high thermal conductivity, the efficiency of use of the exposure energy beam is particularly increased, and the cooling effects are increased. On the other hand, helium has low availability and is high in cost, so that the effect of reduction of the operating costs by means of the present invention is particularly large.

Furthermore, when the gas recovery apparatus is commonly employed by a plurality of exposure apparatuses, the recovery costs can be further decreased.

Furthermore, in the case in which the gas recovered by the gas recovery apparatus is recirculated to the optical path of the exposure energy beam via at least one gas supply apparatus, it is possible to reduce the amount of gas for replenishment.

Furthermore, when the gas supply apparatus is provided with a concentration meter for measuring the concentration of the gas supplied from the gas recovery apparatus, a gas source which is filled with this gas, and a control unit which replenishes the gas supplied from the gas recovery unit with gas from the gas source in accordance with the results of the measurement of the concentration meter, this has the advantage that gas can always be supplied to the optical path of the exposure energy beam at a predetermined purity (concentration) or above. Furthermore, when the gas is compressed at high pressures or is liquefied and stored, it is possible to store a large amount of this gas in a small space.

Furthermore, in accordance with the exposure apparatus of the present invention, a gas (a second gas) having a predetermined high transmittivity is supplied to at least a portion of the optical path of the exposure energy beam (exposure light), and in this case, the gas of the gas controlled drive apparatus is the same type as the second gas having high transmittivity. Accordingly, the concentration of the second gas does not decease, so that the exposure energy beam can be guided to the substrate with high efficiency, and this has an advantage in that it is possible to increase the throughput of the exposure process.

Furthermore, when the gas controlled drive apparatus is a stage apparatus which makes contact with the guide surface using a gas bearing method, this stage is disposed at a position close to the mask or the substrate, so that the transmittivity of the exposure energy beam is maintained at a high level.

Furthermore, when the exposure energy beam is ultraviolet light having a wavelength of 250 nm or less and nitrogen or helium is employed as this second gas, nitrogen has a low cost, while helium has high transmittivity and good thermal conductivity.

Furthermore, when the exposure energy beam is a X-ray, when nitrogen or helium is employed as the second gas, a certain amount of transmittivity can be obtained if the distance over which the X-ray must pass through the gas shorts Furthermore, in accordance with exposure apparatus of the present invention, all of the optical elements of the illumination optical system and the projection optical system are supported on support elements using press-attachment mechanisms without the use of adhesive, so that the volatilization of the organic solvents of the adhesives by the application of the ultraviolet light, and the contamination of the surfaces of the optical elements are prevented, and it is possible to control declines or fluctuations in the transmittivity. Furthermore, the fly eye lens which is formned from a plurality of rod lenses is put together without the use of adhesive, so that the volatilization of the organic solvents of the adhesives by the application of ultraviolet light and the contamination of the surfaces of the optical elements is prevented, and it is possible to prevent declines or fluctuations in the transmittivity.

What is claimed is:

1. An exposure method which transfers a predetermined pattern onto a substrate by using an exposure beam from an exposure light source, comprising:
   dividing an optical path of the exposure beam from the exposure light source to the substrate into a plurality of partial optical paths, having lengths different from one another;
   respectively setting allowable concentrations of absorption substance, which absorbs the exposure beam, in the plurality of partial optical paths depending on a length of each of the partial optical paths; and
   managing concentrations of the absorption substance, in the plurality of the partial optical paths independently of each other in order for the concentrations of the absorption substance in the plurality of the partial optical paths to be respectively equal to or lower than the set allowable concentrations of the absorption substance in the plurality of the partial optical paths.

2. An exposure method as recited in claim 1, wherein a gas which is transparent with respect to the exposure beam is supplied to at least a part of the plurality of the partial optical paths for the exposure beam.

3. An exposure method as recited in claim 1, wherein the exposure beam is a light in a vacuum ultraviolet region, and the absorption substance is oxygen, water or carbon dioxide.

4. A method of manufacturing a device, comprising transferring a predetermined pattern onto the substrate in a state that an illuminance of an exposure beam is managed on the substrate by using the exposure method as recited in claim 1.

5. An exposure method as recited in claim 1, wherein the set allowable concentrations of the absorption substance are different from each other for every partial optical path.

6. An exposure method as recited in claim 5, wherein when the concentration of the absorption substance in at least one of the plurality of the partial optical paths is equal to or more than the set allowable concentration thereof, the transfer operation is stopped.

7. An exposure method as recited in claim 1, wherein gases which are transparent with respect to the exposure beam are respectively supplied to the plurality of the partial optical paths, and kinds of the gases are different from one another depending on lengths of the partial optical paths.

8. An exposure method as recited in claim 7, wherein a helium gas is supplied to a space of the partial optical path having a long length and a nitrogen gas is supplied to a space of the partial optical path having a short length.

9. An exposure method as recited in claim 1, wherein the optical path of the exposure beam includes an optical path of an illuminating system which illuminates a mask on which the predetermined pattern is formed, an optical path of a projecting optical system which transfers the predetermined pattern onto the substrate, an optical path between the illuminating system and the projecting optical system and an optical path between the projecting optical system and the substrate.

10. An exposure method as recited in claim 9, wherein the optical path between the illuminating system and the projecting optical system is shorter than the optical path of the illuminating system.

11. An exposure method as recited in claim 10, wherein outside air flows into the optical path between the illuminating system and the projecting optical system more easily than the optical path of the illuminating system.

12. An exposure method as recited in claim 9, wherein the optical path between the projecting optical system and the substrate is shorter than the optical path of the projecting optical system.

13. An exposure method as recited in claim 12, wherein outside air flows into the optical path between the projecting optical system and the substrate more easily than the optical path of the projecting optical system.

14. An exposure method as recited in claim 1, wherein the allowable concentrations of the absorption substance is set in order for allowable absorptances of the exposure beam in the plurality of the partial optical paths to be constant.

15. An exposure method as recited in claim 1, wherein a gas which is transparent with respect to the exposure beam is supplied to each of the plurality of the partial optical paths, and the concentrations of the absorption substance are managed by exhausting the absorption substance outside the partial optical paths together with the transparent gas.

16. An exposure method which irradiates an exposure beam from an exposure light source onto a mask through an illumination system and transfers a pattern of the mask onto a substrate through a projecting optical system, comprising:
dividing an optical path of the exposure beam from the exposure light source to the substrate into a plurality of partial optical paths including an illumination system portion in the illumination system, a mask operating portion provided around the mask, a projecting optical system portion including at least a part of the projecting optical system and a substrate operating portion including an upper portion of the substrate;
respectively setting allowable concentrations of absorption substance, which absorbs the exposure beam, in the plurality of the partial optical paths depending on a length of each of the partial optical paths; and
managing concentrations of the absorption substance in the plurality of the partial optical paths independently of each other in order for the concentrations of the absorption substance in the plurality of the partial optical paths to be respectively equal to or lower than the set allowable concentrations of the absorption substance in the plurality of the partial optical paths.

17. An exposure method as recited in claim 16, wherein there is provided a delivery space which delivers the mask from a mask library to the mask operating portion, and in the delivery space, a concentration of the absorption substance is managed independently of the concentrations of the absorption substance of the partial optical paths including the mask operating portion.

18. An exposure method as recited in claim 9, wherein in the space of the mask library, a concentration of the absorption substance is managed independently from that of the delivery space.

19. An exposure method as recited in claim 16, wherein a gas which is transparent with respect to the exposure beam is supplied from the projecting optical system side to between the projecting optical system and the substrate, and the gas is discharged from the substrate side.

20. An exposure method as recited in claim 19, wherein a ratio of the supply of the gas is smaller than that of discharge of the gas.

21. An exposure method which transfers a predetermined pattern onto a substrate by using an exposure beam from an exposure light source, comprising:
dividing an optical path of the exposure beam from the exposure light source to the substrate into a plurality of partial optical paths having lengths different from one another;
respectively setting allowable absorptances of the exposure beam descending on a length of each of the partial optical paths; and
managing concentrations of an absorption substance, which absorbs the exposure beam, in the plurality of the partial optical paths independently of each other in order for absorptances of the exposure beam in the plurality of the partial optical paths to be the set allowable absorptances of the exposure beam in the plurality of the partial optical paths.

22. An exposure method which transfers a predetermined pattern onto a substrate by using an exposure beam from an exposure light source, comprising:
dividing an optical path of the exposure beam from the exposure light source to the substrate into a plurality of partial optical paths, said plurality of partial optical paths respectively including absorption substance therein, which absorbs the exposure beam;
respectively supplying a gas which is transparent with respect to the exposure beam to each of the plurality of the partial optical paths;
respectively setting concentrations of the gas in the plurality of the partial optical paths depending on a length of each of the partial optical paths; and
managing concentrations of the absorption substance in the plurality of the partial optical paths independently of each other in order for concentrations of the gas in the plurality of the partial optical paths to be the set concentrations of the gas in the plurality of the partial optical paths.

23. An exposure method as recited in claim 22, wherein the optical path of the exposure beam includes an optical path of an illuminating system which illuminates a mask on which the predetermined pattern is formed, an optical path of a projecting optical system which transfers the predetermined pattern onto the substrate, an optical path between the illuminating system and the projecting optical system and an optical path between the projecting optical system and the substrate.

24. An exposure method as recited in claim 23, wherein the optical path between the illuminating system and the projecting optical system is shorter than the optical path of the illuminating system.

25. An exposure method as recited in claim 24, wherein outside air flows into the optical path between the illuminating system and the projecting optical system more easily than the optical path of the illuminating system.

26. An exposure method as recited in claim 23, wherein the optical path between the projecting optical system and the substrate is shorter than the optical path of the projecting optical system.

27. An exposure method as recited in claim 26, wherein outside air flows into the optical path between the projecting optical system and the substrate more easily than the optical path of the projecting optical system.

28. An exposure method as recited in claim 22, wherein the concentrations of the absorption substance are managed by exhausting the absorption substance outside the partial optical paths together with the transparent gas.

29. An exposure apparatus which transfers a predetermined pattern onto a substrate by using an exposure beam from an exposure light source, comprising:
a plurality of chambers which divide an optical path of the exposure beam from the exposure light source to the substrate into a plurality of partial optical paths having lengths different from one another and which covers the plurality of the partial optical paths to substantially isolate the plurality of the partial optical paths from outside air, respectively; and a controller which is connected to the plurality of chambers and which manages concentrations of an absorption substance, which absorbs the exposure beam, in the plurality of the chambers independently of each other in order for concentrations of the absorption substance in the plurality of the partial optical paths to be respectively equal to or lower than set allowable concentrations of the absorption substance in the plurality of the partial optical paths.

30. An exposure apparatus as recited in claim 29, further comprising:

concentration sensors which are disposed in the plurality of the chambers and which measure the concentrations of the absorption substance in the plurality of the chambers; and an eliminator which is connected to the controller and which eliminates the absorption substance in the plurality of the chambers according to the result of measurement of the concentration sensors.

31. An exposure apparatus as recited in claim 30, wherein the controller stops the transfer operation when the concentration of the absorption substance in at least one of the plurality of the chambers is equal to or higher than a predetermined allowable concentration.

32. An exposure apparatus as recited in claim 29, wherein:

the predetermined pattern is a pattern formed on a mask;

the pattern of the mask is transferred onto the substrate through a projecting optical systems; and the plurality of the chambers include a first chamber which covers an illuminating system portion in an illuminating system for the exposure beam, a second chamber which covers a mask operating portion around the mask, a third chamber which covers a projecting optical system portion including at least a part of the projecting optical system, and a fourth chamber which covers a substrate operating portion including an upper portion of the substrate.

33. An exposure apparatus as recited in claim 29, further comprising a supply device which is connected to the plurality of the chambers and which respectively supplies gases which are transparent with respect to the exposure beam to the plurality of the partial optical paths.

34. An exposure apparatus as recited in claim 29, further comprising a mask library which accommodates a mask, wherein the controller manages a concentration of an absorption substance in a delivery space between the mask library and the second chamber.

35. An exposure apparatus as recited in claim 34, herein the controller manages a concentration of an absorption substance in a space of the mask library.

36. An exposure apparatus as recited in claim 29, wherein the controller sets allowable concentrations of the absorption substance in order for allowable absorptances of the exposure beam in the plurality of the partial optical paths to be constant.

37. An exposure apparatus which transfers a predetermined pattern onto a substrate by using an exposure beam from an exposure light source, comprising:

a plurality of chambers which divide an optical path of the exposure beam from the exposure light source to the substrate into a plurality of partial optical paths having lengths different from one another and which cover the plurality of the partial optical paths to substantially isolate the plurality of the partial optical paths from outside air, respectively;

a supply device which is connected to the plurality of the chambers and which supplies a gas which is transparent with respect to the exposure beam to each of the plurality of the chambers; and a controller which is connected to the plurality of the chambers and which manages concentrations of absorption substance, which absorbs the exposure beam, in the plurality of the chambers independently of each other in order for concentrations of the gas in the plurality of the partial optical paths to be concentrations of the gas in the plurality of the partial optical paths which have been set depending on a length of each of the partial optical paths.

38. An exposure apparatus as recited in claim 37, further comprising:

concentration sensors which are disposed in the plurality of chambers and which measure the concentrations of the absorption substance in the chambers, and an eliminator which is connected to the controller and which eliminates the absorption substance in the plurality of the chambers according to the measurement result of the concentration sensors.

39. An exposure apparatus as recited in claim 37, wherein:

the predetermined pattern is a pattern formed on a mask;

a pattern of the mask is transferred onto the substrate through a projecting optical system; and the plurality of the chambers include a first chamber which covers an illuminating system portion in an illuminating system for the exposure beam, a second chamber which covers a mask operating portion around the mask, a third chamber which covers a projecting optical system portion including at least a part of the projecting optical system, and a fourth chamber which covers a substrate operating portion including an upper portion of the substrate.

40. An exposure apparatus as recited in claim 37, wherein the controller stops the transfer operation when the concentrations of the absorption substance included in the transparent gas becomes equal to or larger than a predetermined value in at least one chamber of the plurality of the chambers.

41. An exposure method, comprising transferring a predetermined pattern onto a substrate by using an exposure beam from an exposure light source, wherein:

an optical path of the exposure beam from the exposure light source to the substrate is divided into a plurality of partial optical paths having lengths different from one another;

allowable concentrations of absorption substance, which absorbs the exposure beam, in the plurality of the partial optical paths are respectively set depending on a length of each of the partial optical paths; and concentrations of the absorption substance, in the plurality of the partial optical paths are managed independently of each other in order for the concentrations of the absorption substance in the plurality of the partial optical paths to be respectively equal to or lower than the set allowable concentrations of the absorption substance in the plurality of the partial optical paths.

42. An exposure method, comprising irradiating an exposure beam from an exposure light source onto a mask through an illumination system so as to transfer a pattern of the mask onto a substrate through a projecting optical system, wherein:

an optical path of the exposure beam from the exposure light source to the substrate is divided into a plurality of partial optical paths including an illumination system portion in the illumination system, a mask operating portion provided around the mask, a projecting optical system portion including at least a part of the projecting optical system and a substrate operating portion including an upper portion of the substrate;

allowable concentrations of absorption substance, which absorbs the exposure beam, in the plurality of the partial optical paths are respectively set depending on a length of each of the partial optical paths; and concentrations of the absorption substance, in the plurality of the partial optical paths are managed independently of each other in order for the concentrations of the absorption substance in the plurality of the partial optical paths to be respectively equal to or lower than the set allowable concentrations of the absorption substance in the plurality of the partial optical paths.

43. An exposure method, comprising transferring a predetermined pattern onto a substrate by using an exposure beam from an exposure light source, wherein:

an optical path of the exposure beam from the exposure light source to the substrate is divided into a plurality of partial optical paths having lengths different from one another;

allowable absorptances of the exposure beam are respectively set depending on a length of each of the partial optical paths; and concentrations of an absorption substance, which absorbs the exposure beam, in the plurality of the partial optical paths are managed independently of each other in order for absorptances of the exposure beam in the plurality of the partial optical oaths to be the set allowable absorptances of the exposure beam in the plurality of the partial optical paths.

44. An exposure method, comprising transferring a predetermined pattern onto a substrate by using an exposure beam from an exposure light source, wherein:

an optical path of the exposure beam from the exposure light source to the substrate is divided into a plurality of partial optical paths, said plurality of partial optical paths respectively including absorption substance therein, which absorbs the exposure beam;

a gas which is transparent with respect to the exposure beam is supplied to each of the plurality of the partial optical paths;

concentrations of the as in the plurality of the partial optical paths are respectively set depending on a length of each of the partial optical paths; and concentrations of the absorption substance in the plurality of the partial optical paths are managed independently of each other in order for concentrations of the gas in the plurality of the partial optical paths to be the set concentrations of the gas in the plurality of the partial optical paths.

* * * * *

UNITED STATES PATENT AND TRADEMARK OFFICE
CERTIFICATE OF CORRECTION

PATENT NO. : 6,707,529 B1 Page 1 of 20
APPLICATION NO. : 09/913328
DATED : March 16, 2004
INVENTOR(S) : Aoki et al.

It is certified that error appears in the above-identified patent and that said Letters Patent is hereby corrected as shown below:

PLEASE DELETE ENTIRE PATENT TITLE PAGE, DRAWINGS 1 THROUGH 10, AND COLUMNS 1 THROUGH 44

AND INSERT TITLE PAGE, DRAWINGS 1 THROUGH 4, AND COLUMNS 1 THROUGH 28 AS SHOWN ON THE ATTACHED PAGES.

Signed and Sealed this

Twenty-third Day of October, 2007

JON W. DUDAS
*Director of the United States Patent and Trademark Office*

(12) United States Patent
Aoki et al.

(10) Patent No.: US 6,707,529 B1
(45) Date of Patent: Mar. 16, 2004

(54) EXPOSURE METHOD AND APPARATUS

(75) Inventors: Takashi Aoki, Chiyoda-ku (JP);
Naomasa Shiraishi, Chiyoda-ku (JP);
Soichi Owa, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/913,328

(22) PCT Filed: Feb. 8, 2000

(86) PCT No.: PCT/JP00/00676
§ 371 (c)(1),
(2), (4) Date: Oct. 15, 2001

(87) PCT Pub. No.: WO00/48237
PCT Pub. Date: Aug. 17, 2000

(30) Foreign Application Priority Data
Feb. 12, 1999 (JP) .................................. 11/34897

(51) Int. Cl.[7] .......................... G03B 27/52; G03B 27/42
(52) U.S. Cl. .................................. 355/30; 355/53
(58) Field of Search ............................ 355/53, 67, 69–71, 355/30

(56) References Cited

U.S. PATENT DOCUMENTS

| | | |
|---|---|---|
| 4,690,528 A | 9/1987 | Tanimoto et al. |
| 4,825,453 A * | 4/1989 | Kembo et al. ............ 378/34 |
| 5,425,045 A | 6/1995 | Hamatani |
| 5,430,303 A | 7/1995 | Matsumoto et al. |
| 5,559,584 A | 9/1996 | Miyaji et al. ............ 355/73 |
| 5,696,623 A | 12/1997 | Fujie et al. |
| 6,208,406 B1 | 3/2001 | Nakashima |
| 6,222,610 B1 | 4/2001 | Hagiwara et al. |
| 6,252,648 B1 * | 6/2001 | Hase et al. ............ 355/53 |
| 6,335,787 B1 * | 1/2002 | Nishi ............ 355/87 |
| 2002/0033943 A1 | 3/2002 | Ishii |

FOREIGN PATENT DOCUMENTS

| | | | |
|---|---|---|---|
| JP | 61-79228 | * | 4/1986 |
| JP | 61-136227 A | | 6/1986 |
| JP | 62-286226 | | 12/1987 |
| JP | 62-286226 A | | 12/1987 |
| JP | 9-162117 | | 6/1997 |
| JP | 9-162117 A | | 6/1997 |
| JP | 10-284410 A | | 10/1998 |
| WO | WO 99/25010 A1 | | 5/1999 |

OTHER PUBLICATIONS

International Preliminary Examination Report for International Application No. PCT/JP00/00676 (Apr. 24, 2001).

* cited by examiner

Primary Examiner—Henry Hung Nguyen
(74) Attorney, Agent, or Firm—Oliff & Berridge PLC

(57) ABSTRACT

An exposure apparatus having an illumination system which applies an exposure energy beam to a mask on which a pattern for transfer is formed, and a stage system for positioning a substrate to which the pattern of the mask is transferred, is characterized in that: a gas supply apparatus for supplying a gas of high transmittivity with respect to the exposure energy beam, and having good thermal conductivity, to at least a portion of an optical path of the exposure energy beam, and a gas recovery apparatus for recovering at least a portion of the gas after the gas is supplied to the optical path of the exposure energy beam from the gas supply apparatus, are provided.

44 Claims, 4 Drawing Sheets

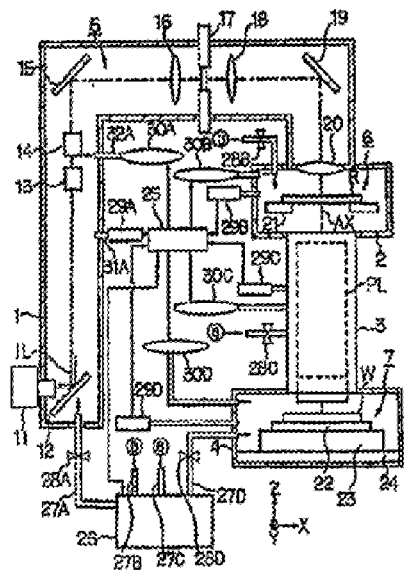

EXPOSURE METHOD AND APPARATUS

DESCRIPTION

1. Technical Field

The present invention relates to an exposure method and apparatus to be used when a predetermined pattern is to be transferred onto a substrate in a lithographic process for manufacturing a semiconductor device, an image pick-up device (a CCD or the like), a liquid crystal display element, a thin film magnetic head or the like, for example, and more particularly, the present invention can be suitably used for a VUV light (Vacuum Ultraviolet light) having a wavelength of approximately 200 nm or less as an exposure beam.

2. Background Art

In the lithographic process for manufacturing a semiconductor device or the like, there have been used various exposure apparatuses such as a reducing projection type exposure apparatus, for example, a stepper, to transfer a reticle pattern to be a mask onto a wafer (or a glass plate or the like) coated with a resist (photosensitive material) to be a substrate, a proximity type exposure apparatus for directly transferring a reticle pattern on a wafer, and the like. In the exposure apparatus of this kind, conventionally, an ultraviolet light such as i rays of a mercury lamp (a wavelength of 365 nm) or a KrF excimer laser beam (a wavelength of 248 nm) has been used as an exposure beam (exposure light).

In order to obtain a higher resolution corresponding to an increase in integration of a semiconductor integrated circuit or the like, recently, the wavelength of the exposure beam has been more shortened. The practical use of the ArF excimer laser beam (a wavelength of 193 nm) has come to a final stage. An $F_2$ laser beam (a wavelength of 157 nm) has also been studied as an advanced exposure beam. On the other hand, a desired value of an energy (illuminance) of an exposure beam to be irradiated on a reticle (wafer) per unit time has been increased in order to enhance the throughput of the exposure apparatus. Referring to a dioptric member such as a lens in an illuminating optical system or a projecting optical system, synthetic silica glass, fluorite or the like having a high transmittance to a light having a wavelength of approximately 200 nm has been used.

As the exposure beam for the exposure apparatus, recently, the utilization of a vacuum ultraviolet light (VUV light) having a wavelength of approximately 200 nm or less has been investigated, and the use of a glass material having a high transmittance to the vacuum ultraviolet light has been investigated for the dioptric member in the illuminating optical system or the like. Referring to the exposure beam, however, a substance (hereinafter referred to as an absorption substance) for absorbing the exposed beam to greatly reduce the transmittance of the exposure beam is present in the atmosphere on an optical path in addition to the dioptric member. The absorption substance is varied depending on the wavelength of the exposure beam. In the normal air, ozone or the like acts as the absorption substance for a light having a wavelength of 200 nm or more, and oxygen molecules contained in the air, water molecules, carbon dioxide molecules and the like act as the absorption substances for the vacuum ultraviolet light.

In the case in which the air is supplied to the optical path of the vacuum ultraviolet light, therefore, the vacuum ultraviolet light is greatly absorbed by the absorption substances. For this reason, it is hard to cause the vacuum ultraviolet light to reach a wafer through a reticle with a sufficient illuminance. In order to prevent the illuminance on the wafer from being reduced, it is necessary to decrease the amount of the absorption substance on the optical path of the exposure beam or to eliminate the absorption substance, thereby increasing the transmittance of the optical path. For this purpose, there has been proposed a method of uniformly reducing the amount of the absorption substance on all the optical paths of the exposure beam or eliminating the absorption substance, thereby collectively managing the absorption material. However, if the absorption substance is collectively managed including the vicinity of a movable portion such as a reticle stage or a wafer stage and the inner portion of the illuminating optical system and the like, a mechanism might become complicated partially to increase the manufacturing cost of the exposure apparatus and the running cost of the exposure apparatus.

In consideration of such a respect, it is a first object to provide an exposure method capable of increasing the illuminance of an exposure beam on a transfer object.

Moreover, it is a second object of the present invention to provide an exposure method capable of increasing the illuminance of an exposure beam on a transfer object in the case in which an exposure beam capable of being easily absorbed by various substances, for example, a vacuum violet light is to be used. In particular, it is an object of the present invention to provide an exposure method capable of increasing the illuminance of an exposure beam on a transfer object without wholly complicating a mechanism or greatly increasing the running cost.

Furthermore, it is an object of the present invention to provide an exposure apparatus capable of carrying out the exposure method and a method of manufacturing a device using the exposure method.

DISCLOSURE OF THE INVENTION

The present invention provides a first exposure method which transfers a predetermined pattern onto a substrate (W) by using an exposure beam from an exposure light source (11), wherein an optical path of the exposure beam from the exposure light source to the substrate is divided into a plurality of partial optical paths and concentrations of an absorption substance which absorbs the exposure beam are respectively managed independently of each other for the plurality of the partial optical paths.

According to the above-mentioned present invention, the optical path of the exposure beam is divided into a first partial optical path including an optical path of an illuminating optical system and a second partial optical path, which is located in the vicinity of a movable member such as a stage system, into which not only the outside air but also an absorption substance absorbing the exposure beam is easily mixed, but which has a shorter optical path length than the first partial optical path, for example. As compared with the first partial optical path, for example, the allowable concentration of the absorption substance contained in the second partial optical path is allowed to be increased, and by managing the concentration of the absorption substance in the first partial optical path and the second partial optical path independently of each other by eliminating the absorption substance and the like, the illuminance of the exposure beam (a pulse energy in the case of a pulse light) on the substrate can be increased without greatly complicating a mechanism such as a closing mechanism (an airtight mechanism) of each partial optical path or an eliminating mechanism for the absorption substance.

In place of the concentration of the absorption substance, the total amount of the absorption substance in the partial optical path may be managed.

Furthermore, the present invention provides a second exposure method which irradiates an exposure beam from an exposure light source (11) onto a mask (R) through an illumination system and transfers a pattern of the mask onto a substrate (W) through a projecting optical system (PL), wherein an optical path of the exposure beam from the exposure light source to the substrate is divided into a plurality of partial optical paths including an illumination system portion (5) in the illumination system, a mask operating portion (6) provided around the mask, a projecting optical system portion (PL) including at least a part of the projecting optical system and a substrate operating portion (7) including an upper portion of the substrate, and concentrations of an absorption substance which absorbs the exposure beam are respectively managed independently of each other for the plurality of the partial optical paths.

According to the above-mentioned present invention, the outside air (absorption substance) is comparatively less mixed in the illumination system portion. Moreover, the mask operating portion has more movable portions to exchange and to position a mask and therefore the outside air is easily mixed therein. The projecting optical system portion has an almost closed structure and the substrate operating portion has more movable portions to exchange and to position a substrate. Moreover, the illumination system portion and the projecting optical system portion have longer optical path lengths than the optical path length of the mask operating portion or the substrate operating portion, and a fluctuation in the amount of each component in the atmosphere on the optical path is small, while the mask operating portion and the substrate operating portion have shorter optical path lengths than the optical path length of the illuminating optical system portion or the projecting optical system portion and the fluctuation in the amount of each component in the atmosphere on the optical path is great. As an example, a sealing property is enhanced for these partial optical paths, the flow of the absorption substance from the outside is almost blocked and the concentration of the absorption substance in the inner portion is managed independently for each partial optical path.

In order to reduce or eliminate the absorption substance on each partial optical path, for example, the allowable concentrations of the absorption substance are independently set for every partial optical path. In this case, the optical path is short in the mask operating portion and the substrate operating portion. As one of control methods, therefore, the allowable concentration of the absorption substance is allowed to be higher than that of other portions. In the partial optical path in which the concentration of the absorption substance exceeds the allowable concentration, exhaust (or pressure reduction) is carried out in the inner portion thereof. If necessary, then, a gas having a low absorptivity (a high transmittance) to the exposure beam is supplied to the inner portion, for example. Consequently, the concentration of the absorption substance is managed to be equal to or lower than the allowable concentration set for each partial optical path and the illuminance of the exposure beam on the substrate can be enhanced. Consequently, the mask pattern can be transferred onto the substrate with high precision and high throughput. In this case, particularly, the structures of the mask operating portion and the substrate operating portion can be relatively simplified as compared with the case in which the concentration of the absorption substance is collectively managed in the whole optical path.

Furthermore, the concentration of the absorption substance is allowed to be increased in the mask operating portion and the substrate operating portion and the concentration (or the total amount) of the absorption substance is managed independently of other illumination system portions and projecting optical system portions. Consequently, the illuminance of the exposure beam can be increased without complicating a control mechanism in the illumination system portion and the projecting optical system portion. In other words, in the case in which the concentration (amount) of the absorption substance in each of the mask operating portion and the substrate operating portion is increased and in such a situation that the degree of sealing is enhanced for each partial optical path, the mask operating portion and the substrate operating portion take countermeasures independently of other portions to solve the problems (the concentration is managed to reduce the concentration of the absorption substance). Consequently, the other portions are not affected by an increase in the concentration (amount) of the absorption substance. In the other portions, therefore, the concentration can easily be managed and the running cost can also be reduced. On the other hand, in the case in which the degree of sealing is not increased for each partial optical path and the concentration on the whole optical path is collectively managed, the other portions are adversely influenced when the concentration is increased in a part of the optical path.

In this case, when the exposure beam is a light in a vacuum violet region, an example of the absorption substance includes oxygen, water or carbon dioxide and an example of a gas having a high transmittance is nitrogen and a rare gas such helium, neon or argon or a mixed gas combining them.

The present invention provides a third exposure method which transfers a predetermined pattern onto a substrate by using an exposure beam transmitted from an exposure light source, wherein an optical path of the exposure beam from the exposure light source to the substrate is divided into a plurality of partial optical paths and transmittances of the exposure beam are respectively managed independently of each other for the plurality of the partial optical paths. According to the present invention, for example, the degree of internal vacuum, the concentration (total amount) of a gas having a high transmittance in the inner portion, the concentration (total amount) of the absorption substance in the inner portion or the like is managed independently for the plurality of the partial optical paths. Consequently, it is possible to wholly simplify a mechanism, and furthermore, to efficiently increase the illuminance of (a pulse energy in the case of a pulse light) the exposure beam on the substrate.

The present invention provides a fourth exposure method which transfers a predetermined pattern onto a substrate (W) by using an exposure beam transmitted from an exposure light source (11), wherein an optical path of the exposure beam from the exposure light source to the substrate is divided into a plurality of partial optical paths and concentrations of a gas in the plurality of the partial optical paths are managed independently of each other. According to the present invention, in the case in which the gas, although having differences in extent for the exposure beam, acts as absorption substance, the concentrations of the gas are managed independently of each other so that the illuminance of the exposure beam can be increased on the substrate in the same manner as in the first exposure method.

In this case, the concentrations of the gas in the plurality of the partial optical paths may be managed depending on the lengths of the partial optical paths. Alternatively, the concentrations of the gas may be managed depending on the frequencies of such as the in-and-out operation of the substrate between the partial optical path and the outside air.

Examples of the gas of which concentrations are to be managed include nitrogen, helium, neon or argon or a mixed gas combining them.

The present invention provides a first exposure apparatus which transfers a predetermined pattern onto a substrate (W) by using an exposure beam transmitted from an exposure light source (11), comprising a plurality of chambers which covers a plurality of partial optical paths formed by dividing an optical path of the exposure beam from the exposure light source to the substrate to substantially isolate the plurality of the partial optical paths from outside air, respectively, and a controller (25) which manages concentrations of an absorption substance in the plurality of the chambers independently of each other. According to the present invention, the first exposure method can be carried out.

In this case, preferably, there are provided a concentration sensor (29A to 29D) which measures the concentrations of the absorption substance for absorbing the exposure beam in the plurality of the chambers and an eliminator (30A to 30D) which eliminates the absorption substance in the plurality of the chambers, and the controller manages the concentrations of the absorption substance through the eliminator according to the result of measurement of the concentration sensor.

In this case, furthermore, when the predetermined pattern is a pattern formed on a mask, the mask is illuminated by an illuminating optical system, a mask pattern is transferred onto the substrate through a projecting optical system, it is desirable that the plurality of the chambers include a first chamber (1) which covers an illuminating system portion (5) in an illuminating system for the exposure beam, a second chamber (2) which covers a mask operating portion (6) around the mask, a third chamber (3) which covers a projecting optical system portion including at least a part of the projecting optical system (PL), and a fourth chamber (4) which covers a substrate operating portion (7) including an upper portion of the substrate. With this, the second exposure method according to the present invention can be carried out. Moreover, the inner portions of the first to fourth chambers may be divided into a plurality of partial chambers which are isolated from each other.

The present invention provides a third exposure apparatus which transfers a predetermined pattern onto a substrate (W) by using an exposure beam transmitted from an exposure light source (11), comprising a plurality of chambers which covers a plurality of partial optical paths formed by dividing an optical path of the exposure beam from the exposure light source to the substrate to be substantially isolate the plurality of the partial optical paths from outside air, respectively, and a controller (25) which manages concentrations of a gas in the plurality of the chambers independently of each other. With this, the fourth exposure method according to the present invention can be carried out.

Moreover, the method of manufacturing a device according to the present invention comprises a step of transferring a predetermined pattern onto the substrate in such a state that an illuminance of an exposure beam is managed on the substrate by using the above-mentioned exposure methods according to the present invention. In this case, the illuminance of the exposure beam on the substrate is high. Therefore, it is possible to mass produce a semiconductor device or the like with high throughput.

BRIEF DESCRIPTION OF THE FIGURES IN THE DRAWINGS

FIG. 1 is a schematic view showing the structure of a projecting exposure apparatus according to an example of an embodiment in accordance with the present invention, a part of which is taken away.

FIG. 2 is a view showing an end face along a section according to an example of the structures of a projecting optical system PL and a barrel 3 in FIG. 1.

FIG. 3 is a schematic view showing the structure of a main part of a projecting exposure apparatus according to a second embodiment of the present invention, a part of which is taken away.

FIG. 4 is a view showing a structure from a projecting optical system PL1 to a wafer stage 23 according to a third embodiment of the present invention, a part of which is taken away.

BEST MODE FOR CARRYING OUT THE INVENTION

A preferred first embodiment of the present invention will be described below with reference to FIGS. 1 and 2. In the present embodiment, the present invention is applied to a projecting exposure apparatus of a step and scan type using a vacuum violet light as an exposure beam.

FIG. 1 is a view showing the schematic structure of the projecting exposure apparatus according to the present embodiment, a part of which is taken away. In FIG. 1, a mechanism portion of the projecting exposure apparatus according to the present embodiment is roughly divided into an illuminating optical system portion 5, a reticle operating portion 6, a projecting optical system PL and a wafer operating portion 7. Furthermore, the illuminating optical system portion 5, the reticle operating portion 6, the projecting optical system PL and the wafer operating portion 7 are accommodated in an illuminating system chamber 1, a reticle chamber 2, a barrel 3 and a wafer chamber 4 to be isolated from the outside air with a high degree of sealing, respectively. Furthermore, the projecting exposure apparatus according to the present embodiment is wholly accommodated in one large chamber in which the temperature of an internal gas (for example, purified air) is controlled into a predetermined target range.

In the illuminating optical system portion 5, first of all, an $F_2$ laser beam source for generating a pulse laser beam having a wavelength of 157 nm in a vacuum ultraviolet area is used as an exposure light source 11, and the emitting end of the exposure light source 11 is inserted into the lower side surface of the illuminating system chamber 1. During exposure, an illumination light IL (exposure beam) emitted from the exposure light source 11 into the illuminating system chamber 1 is reflected upward by a mirror 12 and is incident on a fly eye lens (or a rod lens) 14 to be an optical integrator (homogenizer) through an automatic following portion for aligning an optical axis shift caused by a vibration or the like which is not shown and a beam reshaping optical system 13 for reshaping the sectional shape of the illuminating system and controlling the amount of a light and an aperture diaphragm (not shown) is provided on the emitting surface of the fly eye lens 14 and an illumination light IL emitted from the fly eye lens 14 and passing through the aperture diaphragm is reflected in an almost horizontal direction through a mirror 15 and reaches a field stop (reticle blind) 17 through a relay lens 16.

A surface on which the field stop 17 is provided is almost conjugated with a pattern surface of a reticle R of an exposure object, and the field stop 17 includes a fixed blind for defining the shape of a slender and rectangular illumination region on the pattern surface and a movable blind for closing the illumination region to prevent exposure to an unnecessary portion during the start and end of scanning and exposure. The illumination light IL passing through the field stop 17 illuminates, with a uniform illumination distribution, a rectangular (slit-shaped) illumination region on the pattern surface of the reticle R through a relay lens 18, a mirror 19 and a condenser lens system 20 fixed to the tip portion of the illuminating system chamber 1. The exposure light source 11 to the condenser lens system 20 constitute the illuminating optical system portion 5, and the optical path of the illumination light IL in the illuminating optical system portion 5, that is, the optical path from the exposure light source 11 to the condenser lens system 20 is closed by the illuminating system chamber 1.

Based on the illumination light IL, a pattern image in the illumination region of the reticle R is projected onto the wafer W coated with a photoresist to be a substrate with a projection magnification $\beta$ ($\beta$ is ¼, ⅕ or the like, for example) through the projecting optical system PL. The wafer (wafer) W is a disc-shaped substrate such as a semiconductor (silicon or the like), SOI (silicon on insulator) or the like, for example. In the case in which the illumination light IL is the $F_2$ laser beam as in the present embodiment, an optical glass member having a high transmittance is restricted to fluorite ($CaF_2$ crystal), quartz glass doped with fluorine, magnesium fluoride ($MgF_2$) or the like. Therefore, it is hard to obtain a desired image forming characteristic (color aberration characteristic or the like) by constituting the projecting optical system with only a dioptric member. The projecting optical system PL according to the present embodiment will be described by using a catadioptric system combining a dioptric member and a reflecting mirror as will be described below. In the case in which the desired imaging characteristic is to be obtained, the projecting optical system may be constituted by the dioptric system. A Z-axis is taken in parallel with an optical axis AX of the projecting optical system PL, an X-axis is taken in parallel with the paper of FIG. 1 in a plane perpendicular to the Z-axis (a horizontal plane in the present embodiment), and a Y-axis is taken perpendicularly to the paper in FIG. 1. The illumination region on the reticle R in the present embodiment is a slender rectangle in the X direction and the scanning direction of the reticle R and the wafer W during the exposure is set to be the Y direction.

At this time, the reticle R is held on a reticle stage 21. The reticle stage 21 continuously moves the reticle R in the Y direction on a reticle base which is not shown and slightly drives the reticle R to reduce a synchronization error in the X direction, the Y direction and the rotating direction. The position of the reticle stage 21 is measured with high precision by means of a laser interferometer which is not shown, and the reticle stage 21 is driven based on control information transmitted from a main control system 25 comprising a computer for generally controlling a measured value and the operation of the whole apparatus. The reticle operating operation 6 is constituted by the reticle, the reticle stage 21, a reticle base and a reticle loader which are not shown, and the like, and the optical path of the illumination light L in the reticle operating portion 6, that is, the optical path from the condenser lens system 20 to the projecting optical system PL is closed by the reticle chamber 2.

On the other hand, the wafer W is held on a wafer stage 23 through a wafer holder 22, and the wafer stage 23 continuously moves the wafer W in the Y direction over a wafer base 24 and moves the wafer W by stepping in the X direction and the Y direction. Moreover, the wafer stage 23 focuses the surface of the wafer W on the image plane of the projecting optical system PL by an autofocus method based on information about a position (a focus position) in an optical axis AX direction of the surface of the wafer W measured by an autofocus sensor which is not shown. The position of the wafer stage 23 is measured with high precision by means of a laser interferometer which is not shown, and the wafer stage 23 is driven based on a measured value and control information transmitted from the main control system 25.

During the exposure, an operation for stepping a shot area of an exposure object on the wafer W to this side in the exposure area of the projecting optical system PL and an operation for scanning the wafer W in the Y direction at a constant rate $\beta \cdot VR$ ($\beta$ is a projection magnification of the projecting optical system PL) through the wafer stage 23 synchronously with the scanning of the reticle R at a constant rate VR in the Y direction for the illumination area of the illumination light IL through the reticle stage 21 are repeated by a step and scan method. Thus, the reduced image of a pattern of the reticle R is sequentially transferred into each shot area on the wafer W.

The wafer W, the wafer holder 22, the wafer stage 23, the wafer base and the wafer loader which are not shown and the like constitute the wafer operating portion 7, and the optical path of the illumination light IL in the wafer operating portion 7, that is, the optical path from the projecting optical system PL to the wafer W is closed by the wafer chamber 4. Moreover, the projecting optical system PL is closed and accommodated in the barrel 3, and the optical path from the optical member on the reticle side of the projecting optical system PL to the optical member on the wafer side is closed in the barrel 3.

The illumination light IL according to the present embodiment is a vacuum ultraviolet light having a wavelength of 157 nm. Therefore, an ordinary absorption substance in the air from which ozone for the illumination light IL is removed includes a gas such as oxygen ($O_2$) or carbon dioxide ($CO_2$), steam ($H_2O$) or the like. On the other hand, examples of a transmission gas to the illumination light IL (a substance rarely having absorption) include a rare gas such as helium (He), neon (Ne) or argon (Ar) in addition to a nitrogen gas ($N_2$). Moreover, while the nitrogen gas acts as the absorption substance for a light having a wavelength of approximately 150 nm or less, the helium gas can be used as a transmission gas with a wavelength of approximately 100 nm or less. Furthermore, the helium gas has a thermal conductivity which is approximately six times as high as that of the nitrogen gas and the amount of fluctuation in a refractive index for a change in an air pressure is approximately ⅓ of that of the nitrogen gas. For this reason, particularly, the helium gas has a high transmittance and is excellent in stability and cooling properties of an image forming characteristic of the optical system. However, the helium gas is expensive. Therefore, if the wavelength of the exposure beam is 150 nm or more as in the $F_2$ laser, the nitrogen gas may be use as a transmission gas in order to reduce the running cost. In the present embodiment, the nitrogen gas is used as the transmission gas for the illumination light IL.

As described above, a vacuum pump 30A for discharging a gas containing an internal absorption substance through a pipe 32A is connected into the illuminating system chamber 1. For example, the nitrogen gas to be a transmission gas to the illumination light IL is compressed with an impurity highly removed or liquefied and stored in a bomb of an air supply device 26 provided on the outside of a chamber (not shown) accommodating the whole projecting exposure apparatus according to the present embodiment. If necessary, the nitrogen gas fetched from the bomb is controlled to a predetermined temperature at a predetermined pressure and is supplied into the illuminating system chamber 1 through a pipe 27A provided with a valve 28A which can be switched electromagnetically.

Moreover, a concentration sensor 29A for measuring the concentration of an absorption substance is connected into the illuminating system chamber 1 through a pipe 31A and the measured value of the concentration sensor 29A is supplied to the main control system 25. When the concentration of a predetermined absorption substance (oxygen, steam and carbon dioxide in the present embodiment) measured by the concentration sensor 29A exceeds a preset allowable concentration, the main control system 25 operates the vacuum pump 30A with the valve 28A closed and discharges the air and the absorption substance from the illuminating system chamber 1. Then, the main control system 25 opens the valve 28A and operates the gas supply device 26, and supplies a nitrogen gas having a high purity and a predetermined temperature at a predetermined pressure (usually, approximately 1 atm) into the illuminating system chamber 1 through the pipe 27A. Consequently, an air pressure in the illuminating system chamber 1 becomes substantially equal to that of the outside air. Then, the valve 28A is closed. The concentration of the absorption substance in the illuminating system chamber 1 is equal to or lower than the allowable concentration until a predetermined period of time passes from the operation.

Similarly, a nitrogen gas having a high purity is supplied from the gas supply device 26 to the reticle chamber 2, the barrel 3 and the wafer chamber 4 through a pipe 27B having an openable valve 28B, a pipe 27C having a valve 28C and a pipe 27D having a valve 28D at any time, and the concentration of the internal absorption substance is always measured by the concentration sensors 29B, 29C and 29D and a measured value is supplied to the main control system 25. Furthermore, vacuum pumps 30B, 30C and 30D are connected to the reticle chamber 2, the barrel 3 and the wafer chamber 4, respectively. When the concentration of the absorption substance measured by the concentration sensors 29B, 29C and 29D exceeds respective allowable concentrations, the main control system 25 operates the vacuum pumps 30B, 30C and 30D, the valves 28B to 28C and the air supply device 26 such that the concentrations of the absorption substances in the reticle chamber 2, the barrel 3 and the wafer chamber 4 can be maintained to be equal to or lower than the respective allowable concentrations. For the concentration sensors 29A to 29D, a complex sensor combining an oxygen analyzer, a hygrometer or a dew point meter to be a steam densitometer, a carbon dioxide sensor and the like can be used. For example, a polarography type oxygen analyzer, a zirconia and ceramics type oxygen analyzer, a white phosphorus emission type oxygen concentration sensor or the like can be used for the oxygen analyzer. For example, a crystal type hygrometer, an electric-resistance type hygrometer, infrared transmittance type hygrometer, a mirror reflectance measuring type dew point meter or the like can be used for the steam densitometer (the hydrometer or the dew point meter).

Moreover, a cryopump can be used for a vacuum pump. The cryopump has such a type as to utilize the fact that a vapor pressure of an element other than $H_2$, He and Ne is $10^{-8}$ Pa or less at 20K or less and a plane (cryopanel) cooled to a very low temperature (10 to 15K) is put in the vacuum and a gas ($N_2$, Ar, $O_2$, $H_2O$, $CO_2$ or the like) is adsorbed into the plane to create a clean vacuum.

Next, an example of the projecting optical system PL and the sealing mechanism according to the present embodiment will be described with reference to FIG. 2.

FIG. 2 is a view showing an end face along a section illustrating the internal structure of the projecting optical system PL in FIG. 1. In FIG. 2, the projecting optical system PL comprising a catadioptric optical system according to the present embodiment is constituted by a first imaging optical system K1 for forming a primary image (an intermediate image) I of the pattern of the reticle R and a second imaging optical system K2 for forming a secondary image of the reticle pattern on the wafer W to be a photosensitive substrate with a reduced magnification based on the light transmitted from the primary image I.

The first imaging optical system K1 is constituted by a first lens group G1 having a positive refractive power, an aperture diaphragm S and a second lens group G2 having a positive refractive power which are sequentially provided from the reticle side. The first lens group G1 is constituted by a positive meniscus lens L11 having a non-spherical convex turned toward the reticle side, a positive meniscus lens L12 having a non-spherical convex turned toward the reticle side, and a positive meniscus lens L13 having a non-spherical concave turned toward the wafer side which are sequentially provided from the reticle side.

Moreover, a second lens group G2 has a biconcave lens 21 having a plane on the reticle side to take a non-spherical shape, a biconvex lens L22 having a plane on the reticle side to take a non-spherical shape, a positive meniscus lens L23 having a non-spherical convex turned toward the wafer side, and a positive meniscus lens L24 having a non-spherical concave turned toward the wafer side which are sequentially provided from the reticle side.

On the other hand, the second imaging optical system K2 is constituted by a main mirror M1 including a surface reflection plane R1 having a concave turned toward the wafer side and an opening on a center, a lens component L2, and an auxiliary mirror M2 including a reflection plane R2 provided on a lens plane at the wafer side and having an opening on a center which are sequentially provided from the reticle side. In another respect, the auxiliary mirror M2 and the lens component L2 constitute a back-surface reflecting mirror, and the lens component L2 constitutes a refracting portion of the back-surface reflecting mirror. In this case, it is desirable that a relationship of $0.7<|\beta1/\beta2|<3.5$ should be satisfied as an example, wherein the imaging magnification of the first imaging optical system K1 is represented by $\beta1$ and the imaging magnification of the second imaging optical system K2 is represented by $\beta2$.

Moreover, all optical elements (G1, G2, M1, M2) constituting the projecting optical system PL are provided along a single optical axis AX. Furthermore, the main mirror M1 is provided in the vicinity of a position where the primary image I is to be formed and the auxiliary mirror M2 is provided in the proximity of the wafer W.

In the present embodiment, thus, the light transmitted from the pattern of the reticle R forms the primary image (intermediate image) I having a reticle pattern through the first imaging optical system K1 and the light transmitted from the primary image I is reflected by the main mirror M1 through the central opening of the main mirror M1 and the lens component L2. The light reflected by the main mirror M1 forms the secondary image of the reticle pattern with a reduced magnification on the surface of the wafer W through the lens component L2 and the central opening of the auxiliary mirror M2. In the example of FIG. 2, the imaging magnification $\beta1$ of the first imaging optical system K1 is 0.6249, the imaging magnification $\beta2$ of the first imaging optical system K2 is 0.4000 and a projecting magnification $\beta$ from the reticle R to the wafer W is 0.25 (1.4 time as large).

In the present example, fluorite (CaF$_2$ crystal) is used for all the dioptric members (lens components) constituting the projecting optical system PL. Moreover, the F$_2$ laser beam to be the exposed laser has an oscillating central wavelength of 157.6 nm and a chromatic aberration is corrected for a light having a wavelength width of 156 nm±10 pm and various aberrations such as a spherical aberration, an astigmatism and a distortion aberration can also be corrected well. In order to prevent a change in the reflection plane of the main mirror M1 for a change in a temperature to maintain an excellent imaging performance, furthermore, a support member supporting a reflection plane S1 of the main mirror M is formed by using a substrate having a coefficient of linear expansion of 3 ppm/° C. or less, for example, titanium silicate glass. For the titanium silicate glass, ULE (trade name of Ultra Low Expansion) produced by Corning Co., Ltd. can be used, for example.

The projecting optical system PL according to the present embodiment has all the optical elements constituting the catadioptric system which are provided along a single optical axis. Therefore, the chromatic aberration or the like can be reduced by using a reflecting member, and furthermore, a barrel can be designed and manufactured by the advanced technique of a conventional direct cylinder type refraction system and the precision can be increased without the difficulty of the manufacture.

As an example of a first structure according to the present embodiment, the first imaging optical system K1 and the second imaging optical system K2 are enclosed and supported in the single barrel 3. In the second imaging optical system K2, the illumination light passes through a space plural times. Therefore, it is desirable that the concentration of the absorption substance should be managed to be lower more strictly.

For an example of a second structure, as shown in FIG. 2, each optical element of the first imaging optical system K1 is supported by a lens frame which is not shown in such a state as to be enclosed in the barrel 3 and the main mirror M1 and the auxiliary mirror M2 in the second imaging optical system K2 are enclosed and supported in another lower barrel 3A through a support member which is not shown, respectively. In this case, the portions in the barrel 3 and the lower barrel 3A through which the exposure beam passes may be sealed with a parallel flat glass formed of the material having a high transmittance described above, for example, which is not shown.

As described with reference to FIG. 1, moreover, the concentration sensor 29C and the vacuum pump 30C are connected to the barrel 3. Similarly, the concentration sensor 29E and the vacuum pump 30E are also connected to the lower barrel 3A. Furthermore, a nitrogen gas having a high purity can be supplied at any time from the air supply device 26 shown in FIG. 1 to the barrel 3 and the lower barrel 3A. The concentrations of the absorption substances in the barrel 3 and the lower barrel 3A are managed to be equal or lower than an allowable concentration during the exposure independently of each other through the main control system 25. In the example of the structure, the transmittance of the illumination light for the whole projecting optical system PL can be increased by setting the allowable concentration of the absorption substance in the lower barrel 3A to be lower than the allowable concentration in the barrel 3. In the following description, it is assumed that the projecting optical system PL is accommodated in one barrel 3.

Returning to FIG. 1, description will be given to an example of the whole managing operation for reducing an absorption substance on the optical path of an exposure beam in the projecting exposure apparatus according to the present embodiment.

First of all, the reticle chamber 2 is an important management object in the exposure apparatus using the exposure beam to be absorbed by ordinary air, particularly, a vacuum ultraviolet light. The reason is as follows. It is necessary to fetch an optional reticle from a reticle library provided on the outside of a space (reticle chamber 2) accommodating a reticle R to be an exposure object and managing the concentration of an absorption substance, to move the reticle into the space managing the absorption substance and to provide the reticle on the optical path of the illumination light IL to be the exposure beam. The reticle is varied for each semiconductor element for exposing or each layer for exposing. Therefore, the reticle is exchanged depending on a required step. Consequently, the reticle is exchanged with a high frequency. Accordingly, the reticle chamber 2 not only isolates the reticle R on the optical path from the outside of the space for managing the absorption substance but also efficiently discharges foreign matters (impurities) generated from the movable portion such as the reticle stage 21 or the reticle loader (not shown), and furthermore, functions to suppress an increase in the absorption substance on the optical path on the outside of the reticle chamber 2. It is apparent that the same role can also be applied to the wafer chamber 4.

It is desirable that a space in the reticle library and a delivery space between the reticle library and the reticle chamber should also manage the absorption substance in the same manner as the reticle chamber. Moreover, the inside of a wafer delivery space for delivering a wafer to the wafer chamber may also manage the absorption substance in the same manner as the wafer chamber.

As is apparent from FIG. 1, next, the optical lengths of the illumination light IL in the optical paths (hereinafter referred to as "partial optical paths") in the illuminating system chamber 1, the reticle chamber 2, the barrel 3 and the wafer chamber 4 which accommodate each portion of the projecting exposure apparatus are different from each other, and the illuminating optical system portion 5 in the illuminating system chamber 1 has the greatest optical length and the projecting optical system PL in the barrel 3 has the second greatest optical path. The amount of the absorption substance through which the illumination light IL passes is proportional to the optical path length in the case in which the concentration of the absorption substance is constant. Therefore, the amounts of a reduction in the illuminance are different from each other in the four partial optical paths. For this reason, it is desirable that the optical path having a longer optical path length should have a smaller amount of the absorption substance. Moreover, the illuminating optical system portion 5 having a long optical path and the projecting optical system PL can have a closed structure comparatively easily. Basically, it is possible to prevent the absorption substance from flowing from the outside. Moreover, since the illuminating optical system portion 5 and the projecting optical system PL have few movable portions, the absorption substance can easily be managed at a lower concentration. Accordingly, it is possible to reduce a drop in the illuminance in the illuminating optical system portion 5 and the projecting optical system PL by once reducing the concentration of the absorption substance in the illuminating system chamber 1 and the barrel 3 and maintaining the same state.

Moreover, the optical lengths in the reticle chamber 2 and the wafer chamber 4 are shorter than those of the illuminating optical system 5 and the projecting optical system PL. However, these spaces are such that parts such as a reticle or a wafer are taken from and to the outside at any time during the actuation of the projecting exposure apparatus. At each time, the parts are exposed to the flow of air, an impurity or the like from the outside, and some foreign matters are discharged from the movable portion. Consequently, the concentration of the absorption substance cannot be easily maintained to be low. In the present embodiment, the allowable concentration of the absorption substance in each partial optical path is set such that the allowable absorptivity (allowable absorbance) of the illumination light IL is constant in each partial optical path from the illuminating system chamber 1 to the wafer chamber 4. As a result, the allowable concentration of the absorption substance is set to be higher on the partial paths in the reticle chamber 2 and the wafer chamber 4 than the allowable concentration on other partial optical paths and they contribute to a whole reduction in the illuminance of the illumination light IL almost equivalently. By this method, in addition, the drop in the illuminance can be reduced at a low running cost more actually and the apparatus does not need to be complicated.

There will be described examples of the allowable concentrations of oxygen, carbon dioxide and steam to be absorption substances from the illuminating system chamber 1 to the wafer chamber 4. In this case, the optical path lengths of the partial optical paths in the illuminating system chamber 1, the reticle chamber 2, the barrel 3 of the projecting optical system PL and the wafer chamber 4 are as follows.

Optical path length in the illuminating system chamber 1: 5000 mm
Optical path length in the reticle chamber 2: 200 mm
Optical path length in the barrel 3: 1350 mm
Optical path length in the wafer chamber 4: 10 mm If the allowance absorptivity in the partial optical length is 1%, the allowable concentrations of oxygen ($O_2$), carbon dioxide ($CO_2$) and steam ($H_2O$) in each partial optical path are shown in the following Table 1.

TABLE 1

| | Allowable $O_2$ concentration (ppm) | Allowable $CO_2$ concentration (ppm) | Allowable $H_2O$ concentration (ppm) |
|---|---|---|---|
| Illuminating system chamber 1 | $6.7 \times 10^{-2}$ | 3.3 | $2.3 \times 10^{-1}$ |
| Reticle chamber 2 | 1.7 | $8.2 \times 10^1$ | 6.8 |
| Barrel 3 | $2.5 \times 10^{-1}$ | $1.2 \times 10^1$ | 1.0 |
| Wafer chamber 4 | $3.4 \times 10^1$ | $1.7 \times 10^3$ | $1.37 \times 10^2$ |

If the allowance absorptivity in the partial optical length is 5%, the allowable concentrations of oxygen ($O_2$), carbon dioxide ($CO_2$) and steam ($H_2O$) in each partial optical path are shown in the following Table 2.

TABLE 2

| | Allowable $O_2$ concentration (ppm) | Allowable $CO_2$ concentration (ppm) | Allowable $H_2O$ concentration (ppm) |
|---|---|---|---|
| Illuminating system chamber 1 | $3.4 \times 10^{-1}$ | $1.7 \times 10^1$ | 1.4 |
| Reticle chamber 2 | 8.6 | $4.2 \times 10^2$ | $3.5 \times 10^1$ |
| Barrel 3 | 1.3 | $6.2 \times 10^1$ | 5.1 |
| Wafer chamber 4 | $1.7 \times 10^2$ | $8.4 \times 10^3$ | $6.9 \times 10^2$ |

From the Tables 1 and 2, it is apparent that the allowable concentration of the absorption substance in each of the reticle chamber 2 and the wafer chamber 4 is 10 to 100 times as high as that in each of the illuminating system chamber 1 and the barrel 3. Consequently, the concentration of the absorption substance in each of the reticle chamber 2 and the wafer chamber 4 can be managed easily and the mechanism for the reticle chamber 2 and the wafer chamber 4 do not need to be complicated.

Next, the projecting exposure apparatus according to the present embodiment uses a step and scan method. Therefore, a movable portion for synchronously scanning a reticle and a wafer is provided in the reticle chamber 2 and the wafer chamber 4. As described above, moreover, a contact with the outside air and the mixture of the absorption substance cannot be avoided because of the exchange of the reticle and the wafer. Therefore, it is necessary to operate the vacuum pumps 30B and 30D and the air supply device 26 to discharge the absorption substance until the concentration of the absorption substance in each of the reticle chamber 2 and the wafer chamber 4 is set to be equal to or lower than the allowable concentration after the reticle and the wafer are scanned and exposed or are exchanged. In the meantime, it is apparent that the circuit pattern of the reticle is not exposed.

It is preferable that pressure reduction should be carried out in the space for managing the concentration of the absorption substance (in the illuminating system chamber 1 to the wafer chamber 4) through the vacuum pumps 30A to 30D, respectively. Then, a gas which rarely absorbs the illumination light is supplied from the gas supply device 26 so that the absorption substance can be reduced or eliminated efficiently. In this case, no difference in an air pressure between the inside of each of the illuminating system chamber 1 to the wafer chamber 4 and the outside air can be substantially considered to be made. Therefore, it is not necessary to cause each portion of the exposure apparatus to be a redundant mechanism having an unnecessary strength. In the illuminating system chamber 1 to the wafer chamber 4, the absorption substance may be eliminated to carry out the exposure in an almost vacuum state. In this case, it is necessary to increase the strength of each portion of the exposure apparatus. However, it is possible to maintain the illuminance to be extremely high without depending on the wavelength of the illumination light.

It is not necessary to always carry out the pressure reduction in the illuminating system chamber 1 to the wafer chamber 4 to obtain a high vacuum. More specifically, the degree of vacuum during the pressure reduction depends on the density (amount) of the absorption substance present in the atmosphere and the optical path length in the atmosphere. If the allowable absorptivity of the exposed light to be absorbed by an optical path length of 1 m in the air atmosphere is set to 1%, it is preferable that the pressure reduction should be carried out to approximately $1.2 \times 10^{-3}$ Torr. If the allowable absorptivity of the exposed light to be absorbed by an optical path length of 1 m in the air atmosphere is set to 3%, it is preferable that the pressure reduction should be carried out to approximately $3.8 \times 10^{-3}$ Torr. When a substance having a higher coefficient of absorption is present in the atmosphere, it is sufficient that the pressure reduction is carried out to a higher degree of vacuum. When only a substance having a smaller coefficient of absorption is present in the atmosphere, it is sufficient that the pressure reduction is carried out to a lower degree of vacuum.

Moreover, the inside of each of the illuminating system chamber 1 to the wafer chamber 4 according to the present embodiment is closed. By supplying another gas (hereinafter referred to as a "purging gas") for rarely absorbing the illumination light to the respective spaces through which the exposure beam passes and discharging a mixed gas of the purging gas and the absorption substance without using a vacuum pump, therefore, the concentration (amount) of the absorption substance may be reduced to a predetermined value or less and a reduction in the illumination in each inner portion may be prevented. In this case, for example, purging may be carried out with an inexpensive gas (a nitrogen gas or the like) in a portion having a small optical length (the volume of a space for managing the concentration of the absorption substance including the optical path is small), and the purging may be carried out with a slightly expensive helium gas or the like in a portion having a great optical path length (the volume of a space for managing the concentration of the absorption substance including the optical path is great). For example, consequently, the stability of a temperature control characteristic and an imaging characteristic and the like can be enhanced without greatly raising the running cost.

In the portion having a small optical length, moreover, the nitrogen gas may be supplied to all the partial optical paths. In the portion having a great optical length, the nitrogen gas or the helium gas may be supplied to all the partial optical paths irrespective of the optical path length separately from such a structure that the helium gas is used. Moreover, the helium gas may be supplied to the portion having a small optical path length and the nitrogen gas may be supplied to the portion having a great optical path length. Also in the case in which an expensive gas (the helium gas or the like) is supplied to a portion having a high degree of sealing (airtightness) and an inexpensive gas (the nitrogen gas or the like) is supplied to a portion having a low degree of sealing (in which an absorption substance is easily mixed), the running cost can be reduced.

Next, a preferred second embodiment of the present invention will be described with reference to FIG. 3. While a structure in the present embodiment is basically the same as that of the first embodiment, the present embodiment is different from the first embodiment in that a portion corresponding to the wafer chamber 4 in FIG. 1 is not closed and there is no structure in which a wafer opening portion 7 is isolated from the outside air, that is, the atmosphere in a great chamber accommodating a projecting exposure apparatus. In FIG. 3, portions corresponding to those in FIG. 1 have the same reference numerals and detailed description thereof will be omitted.

FIG. 3 shows the main part of the projecting exposure apparatus according to the present embodiment. In FIG. 3, the upper part of the wafer operating portion 7 is covered with a cover 4A to cover the side surface of a projecting optical system PL. A blast portion 33 and a filter portion 34 are provided in the direction of the side surface of the wafer operation portion 7, and the temperature of a transmission gas (a nitrogen gas, a helium gas or the like, for example) to an illumination light IL is controlled and is supplied from an air supply device which is not shown to the blast portion 33 through a pipe 35. As shown in an arrow 37, the blast portion 33 feeds a gas in a flow corresponding to control information sent from a main control system 25 around the wafer operating portion 7 under the cover 4A through the filter portion 34. A concentration sensor 29D is provided through a pipe to a gas passageway and the concentration of an absorption substance which is measured by the concentration sensor 29D is supplied to the main control system 25. The flow of the gas fed from the blast portion 33 is controlled such that the concentration of the absorption substance which is measured by the concentration sensor 29 is equal to or lower than an allowable concentration.

In the present embodiment, it is desirable that a wafer plane should be coincident with a surface excluding a portion on which a wafer of a wafer holder is to be mounted in order to maintain a direction in which a transmission gas to a surface (wafer plane) of a wafer W to be one direction. When the wafer plane is protruded from the wafer holder, there is a possibility that an air flow in a constant direction might be changed in the peripheral portion of the wafer. Therefore, a dent (a concave portion) in which the wafer is mounted is previously formed in the central portion of the surface of the wafer holder and the wafer is mounted in the dent to cause the wafer plane to be coincident with the surface of the wafer holder.

In the present embodiment, thus, a local gas flow is generated on the optical path of an exposure beam, thereby relieving a reduction in the illuminance on the surface of the wafer W. Accordingly, a work for exchanging a gas by taking in and out the wafer is not required. Consequently, there is an advantage that higher throughput can be obtained. On the other hand, in the present embodiment, it is hard to manage the concentration of the absorption substance by the flow of the outside air with higher precision than that in the first embodiment. In the case in which more importance is attached to the relief of a reduction in the illuminance than an enhancement in the throughput, therefore, it is desirable that the first embodiment should be utilized. It is apparent that the gas flow in FIG. 3 should be obtained by a substance which less absorbs the exposure beam (does not absorb the exposure beam substantially).

It is apparent that a method of relieving the reduction in the illuminance of the exposure beam through the gas flow obtained by a substance having a small absorptivity 25 an also be applied to the reticle chamber 2 (the reticle operating portion 6) easily. Moreover, the same method can also be applied to the illuminating optical system portion 5 and the projecting optical system PL. In that case, however, it is necessary to employ a double structure for these portions.

Next, a preferred third embodiment of the present invention will be described with reference to FIG. 4. In FIG. 4, portions corresponding to those in FIGS. 1 and 2 have the same reference numerals and detailed description thereof will be omitted.

FIG. 4 is a sectional view showing a structure from a projecting optical system PL1 to a wafer stage 23 in a projecting exposure apparatus according to the present embodiment. In FIG. 4, an $F_2$ laser beam to be a vacuum violet light is used as an exposed light IL. A projecting optical system PL1 comprising a catadioptric system according to the present embodiment is also constituted by a first imaging optical system K1 of a refraction type for forming an intermediate image (a primary image) of the pattern of a reticle R and a second imaging optical system K2 of a catadioptric type for forming a final image of the reticle pattern on a wafer W to be a photosensitive substrate with a reduced magnification based on the light transmitted from the intermediate image.

The first imaging optical system K1 is constituted by a first lens group G1 having a positive refractive power, an aperture diaphragm S and a second lens group G2 having a positive refractive power which are sequentially provided from the reticle side. The first lens group G1 is constituted by a meniscus lens L31 having a non-spherical convex turned toward the reticle side, a biconvex lens L32 having a non-spherical convex turned toward the reticle side, a meniscus lens L33 having a non-spherical concave turned toward the wafer side, and a meniscus lens L34 having a non-spherical convex turned toward the reticle side which are sequentially provided from the reticle side. Moreover, the second lens group G2 is constituted by a meniscus lens L41 having a non-spherical convex turned toward the reticle side, a biconvex lens L42 having a non-spherical convex turned toward the wafer side, and a meniscus lens L43 having a non-spherical concave turned toward the wafer side which are sequentially provided from the reticle side. Furthermore, a central shielding member SP for shielding a light in the vicinity of an optical axis AX1 is provided in a position shifted from an aperture diaphragm S by a predetermined space in the direction of the optical axis AX1.

On the other hand, the second imaging optical system K2 is constituted by a main mirror M3 including an opening (a light transmitting portion) 61A in a central portion and a reflection plane R3 having a concave turned toward the wafer side and negative refractive force, a lens component L4, and an auxiliary mirror M4 including a reflection plane R4 having an opening 62A in a central portion. The lens component L4 is a negative meniscus lens having a non-spherical concave turned toward the wafer side. More specifically, all optical elements (G1, G2, M3, L4, M4) constituting the projecting optical system PL1 are provided along a single optical axis AX1. Furthermore, the main mirror M3 is provided in the vicinity of a position where the intermediate image is to be formed and the auxiliary mirror M4 is provided in the proximity of the wafer W. In the present embodiment, an exposed light IL (an imaging luminous flux) transmitted from the pattern of the reticle R forms an intermediate image by the first imagining optical system K1 and the imaging luminous flux transmitted from the intermediate image passes through an opening 61A of the main mirror M3 and is reflected by the reflection plane R4 provided on the upper surface of the auxiliary mirror M4 through the lens component L4, and is then reflected by the reflection plane R3 of the main mirror M4 through the lens component L4 and is incident on the wafer W through a lens component L2 and the opening 62A of the auxiliary mirror M4 again.

In the present embodiment, portions from the first imaging optical system K1 to the lens component L4 of the second imaging optical system K2 are enclosed and supported in a single barrel 3B. More specifically, the lenses L31 to L43, the main mirror M3, the lens component L4 and the auxiliary mirror M4 are held in the barrel 3B through a lens frame respectively and a vent for causing a gas to pass therethrough is formed in the lens frame for the optical member of each of the lens L32 to the main mirror M3, and the lens frame of the lens L31 in the uppermost stage, the lens component L4 in the lowermost stage (tip portion) and lens frame 8B and 8C of the auxiliary mirror M4 are sealed respectively.

Moreover, a pipe communicating with a concentration sensor 29C, a pipe 32C communicating with a vacuum pump 30C and a pipe 27C communicating with a gas supply device 26 are connected to the inside of a space including the main mirror M4 of the barrel 3B. By these members, the inside of the space including the main mirror M4 is filled with a purging gas having a high purity.

Moreover, two air feeding pipes 27Ea and 27Eb are provided opposite to the side surface of the barrel 3B between the lens component 4 and the auxiliary mirror M4 with the optical axis AX1 interposed therebetween, and the air feeding pipes 27Ea and 27Eb are connected to the air feeding device 26 through the pipe 27E. Accordingly, a space between the auxiliary mirror M4 and the lens component L4 is sealed excluding the opening 62A. The opening 62A is used as an opening for causing an imaging luminous flux (an exposed light IL) to be an exposure beam to pass therethrough and an opening for causing a purging gas to pass therethrough.

Furthermore, a plurality of exhaust pipes 32Fa and 32Fb are provided in the vicinity of the side face portion of a space between the auxiliary mirror M4 and the wafer W, and are connected to a vacuum pump 30F through a pipe 32F. In the present embodiment, actually, the exhaust pipes 32Fa and 32Fb are provided at regular angular intervals in eight places, for example. The air feeding pipes 27Ea and 27Eb may not only provide in two places but three or more places at almost regular angular intervals.

Furthermore, the wafer W is adsorbed and held on a mounting surface including a concave portion on a wafer holder 22, the wafer holder 22 is fixed to a concave portion on the wafer stage 23, and a surface 23a of the wafer stage 23 is provided on almost the level with the surface of the wafer W and that of the wafer holder 22. Consequently, a gas can smoothly flow over the surface of the wafer W.

In the present embodiment, the air is continuously sucked through the pipe 32F and the discharge pipes 32Fa and 32Fb through the vacuum pump 30F simultaneously with the operation for consecutively supplying a purging gas having a high purity from the gas supply device 26 toward the central part between the lens component L4 and the auxiliary mirror M4 in the projecting optical system PL1 through the air feeding pipes 27Ea and 27Eb during exposure. A portion between the lens component L4 and the auxiliary mirror M4 is filled with the purging gas having a high purity and is further pressurized. Consequently, the purging gas having a high purity flows toward the wafer W as shown in an arrow 67 and the absorption substance is caused to flow to an outer peripheral portion together with the purging gas.

In this case, the purging gas having a high purity introduced from the air feeding pipe 27Ea and 27Eb into the space between the lens component L4 and the auxiliary mirror M4 flows in the space toward the center of the opening 62A to be a center of a visual field and then flows in the opening 62A toward the wafer side (in the same direction as the direction of progress of the exposed light IL). The flow of the purging gas in the opening 62A will be referred to as a "down flow". The down-flow purging gas flows to the space between the auxiliary mirror M4 and the wafer W and then flows from the exposing portion (central portion) toward the outside as shown in the arrow 67.

In the process of the flow of the purging gas, the down flow of the purging gas is generated in an opposite direction to a direction of normal diffusion (toward the projecting optical system PL1) of degassing containing an absorption substance generated from the wafer W, particularly, degassing from a photoresist coated on the wafer W. As a result, the degassing from the wafer W is almost prevented from reversely flowing to an upper space of the auxiliary mirror M4 and flows from the center of the visual field to a peripheral portion to be drawn into the down flow of the purging gas. The gas generated from the wafer W, particularly, a purging gas containing the gas sent from the photoresist coated on the wafer W will be referred to as "a gas containing an absorption substance".

In the present embodiment, thus, it is possible to prevent a transmittance from being reduced due to the adhesion of the gas fed from the wafer W to the optical member on the tip of the projecting optical system PL1 by the down flow of the gas containing an absorption substance. Moreover, the absorption substance contained in the degassing is exhausted so that the evenness of the exposed light IL (imaging luminous flux) can be maintained, the imaging characteristic of the projecting optical system PL1 can be enhanced, and furthermore, the uniformity of the line width of a circuit pattern formed on the wafer W can be increased. In addition, a sufficient amount of the light can be caused to reach the exposing plane of the wafer W and the throughput of the exposing step can be enhanced.

In the present embodiment, furthermore, the bottom surface of the optical member (the auxiliary mirror M4) on the tip of the projecting optical system PL and the bottom surface of the lens frame 8C are flat and are positioned on the same plane. In the lower part, moreover, the upper surface 23a of the wafer stage 23, the upper surface of the wafer holder 22 and the exposed plane of the wafer W are positioned on almost the same level with the bottom surface of the auxiliary mirror M4 in parallel therewith. Accordingly, the purging gas can flow in the upper and lower spaces of the auxiliary mirror M4 (the lens frame 8C) very smoothly and the absorption substance can be efficiently discharged toward the outer peripheral portion side.

Moreover, it is desirable that a discharge ratio of a gas (the volume of a gas to be sucked per unit time) in the exhaust pipes 32Fa and 32Fb should be set to be higher than a supply ratio of a gas (the volume of the gas blown out per unit time) in the air feeding pipes 27Ea and 27Eb for the purging gas. Consequently, the atmosphere in the vicinity of the wafer stage 23 (dry air in the present embodiment) is sucked in addition to the gas containing the absorption substance. The flow in the atmosphere is usually turned from the wafer stage 23 in the direction of the exposed region (the central portion of the down flow of the purging gas having a high purity). Consequently, the gas containing an impurity is prevented from flowing from the upper part of the wafer stage 23 to an external space. Consequently, it is possible to reduce a change in a refractive index in the atmosphere in the outer peripheral portion of the wafer stage 23 as much as possible. Consequently, a fluctuation in the optical path for a laser beam of a laser interferometer for measuring the position of the wafer stage 23 is reduced and the positional precision of the wafer stage 23 can be enhanced. Moreover, the measuring precision of the focus position of an autofocus sensor can also be enhanced.

By implementing the flow of the purging gas having a high purity over the wafer stage 23 without disturbing the external atmosphere as in the present embodiment, it is possible to efficiently supply a purging gas having a high purity preponderantly around the exposing portion on the wafer. At the same time, it is possible to more lessen a detection error made by the interferometer or autofocus sensor for positioning the wafer stage 23 through a fluctuation in a refraction index through the mixture of the purging gas having a high purity and the atmosphere around the wafer stage 23.

In the present embodiment, moreover, also in the case in which a space d2 of a working distance portion between the optical member (the auxiliary mirror M4) on the tip of the projecting optical system PL1 and the wafer W is small, the purging gas having a high purity can be supplied in the form of the down flow toward the wafer W.

In each of the embodiments, moreover, a laser interferometer for measuring the position of the reticle stage 21 is provided in the reticle chamber 2 and a laser interferometer for measuring the position of the wafer stage 23 is also provided in the wafer chamber 4 in FIG. 1 or the wafer operating portion 7 in FIG. 3. In this case, it is desirable that the optical path of the laser beam for measurement of the laser interferometer should be covered with a cylinder such as a pipe in order to prevent a fluctuation in the laser beam.

Moreover, it is desirable that a housing (a cylindrical member or the like) constituting portions from the illuminating system chamber 1 to the wafer chamber 4 and a pipe for supplying a nitrogen gas, a helium gas or the like should be formed of a material having a small amount of impurity gasses (degassing), for example, various polymers such as stainless steel, ethylene tetrafluoride, tetrafluoroethylene-terfluoro (alkylvinyl ether) or a tetrafluoroethylene-hexafluoropropene copolymer.

In the absorption substance, attention should be paid to steam, hydrocarbon, halides and the like. It has been known that a large number of substances such as steam are stuck in a large amount onto the surfaces of the housing and the pipe gradually leak into a space in which substitution is carried out by the purging gas, that is, a space including the optical path of an illumination light (hereinafter referred to as an "optical path space") during vacuum exhaust or by the action on the purging gas. Moreover, the absorption substance such as hydrocarbon or a halide is discharged from a material for covering a cable for feeding a power to a driving mechanism (a reticle blind, a stage or the like) present in the optical path space or the like, a sealing material (an O ring or the like), an adhesive or the like. For this reason, after the substitution is once carried out by the purging gas, the concentration of the absorption substance is always monitored. If the concentration of the absorption substance is more than an allowable value, it is preferable that a working for exposing the circuit pattern should be once stopped and the substitution should be carried out by the purging gas again.

More specifically, the concentration (amount) of the absorption substance in each space is always monitored by means of each concentration sensor. When the result of the measurement of at least one concentration sensor is equal to or greater than an allowable value or it is anticipated that the concentration becomes equal to or greater than the allowable value through a main control system 25 based on the result of the measurement of the concentration sensor, the exposing work is automatically stopped. Then, a work for reducing the absorption substance is carried out. When the concentration of the absorption substance is reduced to the allowable value or less, the exposing work is restarted. For this purpose, it is preferable that a concentration managing system should be provided.

Furthermore, it is preferable that a material for covering a cable for supplying a power to a driving mechanism (a reticle blind, a stage or the like) in each housing, a sealing member (an O ring or the like), an adhesive or the like should not be provided in the optical path space if possible or the cable for supplying the power to the driving mechanism in the housing or the like should also be coated with a material having a small amount of impurity gases (degassing), thereby controlling the amount of the absorption substance to be generated.

Furthermore, it has been known that the amount of adsorption of a gas such as steam which is discharged from the surface of the housing or the pipe is greatly varied depending on the state of the material of the housing or the pipe. For this reason, it is desirable that the amount of adsorption of the steam or the like should be reduced as much as possible. For example, if the surface area of a structural material is larger, the number of molecules of the absorption substance to be adsorbed is increased. Therefore, the optical path space is preferably designed so as not to have a fine structure such that the surface area is reduced.

For the same reason, moreover, it is preferable that polishing such as mechanical polishing, electrolytic polishing, buff polishing, chemical polishing or GBB (Glass Bead Blasting) should be carried out to reduce the surface roughness of the housing or the pipe. In this case, it is preferable that the surface roughness represented by a center line mean roughness (Ra) should be 0.2 μm or less.

Moreover, it is preferable that pure titanium, Ti-6Al-4V, SUS-304, 403, 410 and C3604 should be used as a material for forming a tube member (including a barrel).

Furthermore, it is desirable that a fluororesin coat, NiP, NiP-Ni and BCr should be used as a surface finishing material of the tube member (including a barrel).

Preferably, these treatments are carried out, and furthermore, the surfaces of the housing and the pipe are cleaned through ultrasonic cleaning, spraying of a fluid such as dry air, vacuum-heating degassing (baking) or the like before the exposure of the circuit pattern and the substitution using the purging gas, thereby reducing the amount of degassing from the surfaces of the housing and the pipe. It is apparent that the effects of the present invention can be further obtained from these contrivances.

While a gas rarely absorbing the exposure beam is supplied to the illuminating system chamber 1 to the wafer chamber 4 (or the lower portion of the cover 4A) in the present embodiment, their partial optical paths may be used in a pressure reducing stage. Consequently, even if the exposure beam has a shorter wavelength, a high illuminance can be obtained on the wafer.

Although the illuminating optical system 5 is accommodated in one illuminating system chamber 1 in the present embodiment, the inside of the illuminating system chamber 1 may be divided into a plurality of partial optical paths and an optical element constituting the illuminating optical system 5 may be provided in the partial optical path. In this case, it is desirable that the absorption substance or the concentration of the purging gas should be managed for each partial optical path.

It is apparent that the present invention can be applied to a projecting exposure apparatus of a full field exposure type (stepper type) and an exposure apparatus using a proximity method as well as a projecting exposure apparatus of a scanning and exposing type.

Moreover, the present invention can also be applied to the case in which an extreme ultraviolet light (EUV light) having a wavelength of approximately 100 nm or less such as soft X-rays is used as an exposure beam, and similarly, to an electron beam transfer apparatus using an electron beam as the exposure beam. In the case in which the EUV light or the electron beam is to be used, the optical path of the exposure beam is to be vacuum. Almost all materials in the outside air become the absorption substances, and the mechanism of the whole apparatus can be simplified by managing the concentrations of the absorption substances every partial optical path of the exposure beam.

Moreover, the projecting exposure apparatus according to the embodiments adjusts the illuminating optical system and the projecting optical system and couples and incorporates each component electrically, mechanically or optically. In this case, it is desirable that the work should be carried out in a clean room in which a temperature is managed. The wafer W thus exposed as described above is subjected to a developing step, a pattern forming step, a bonding step and the like so that a device such as a semiconductor device can be manufactured.

The present invention is not limited to the above-mentioned embodiments, and the invention may, as a matter of course, be embodied in various forms without departing from the gist of the present invention. Furthermore, the entire disclose of Japanese Patent Application 11-34897 filed on Feb. 12, 1999 including description, claims, drawings and abstract are incorporated herein by reference in its entirety.

INDUSTRIAL APPLICABILITY

According to the first, third or fourth exposure method of the present invention, it is possible to increase the illuminance of the exposure beam on the substrate to be a transfer object.

According to the second exposure method, moreover, in the case in which an exposure beam capable of being easily absorbed by various materials such as a vacuum ultraviolet light is to be used, it is possible to increase the illuminance of the exposure beam on the substrate to be the transfer object without complicating the mechanism of the whole apparatus or greatly increasing the running cost.

According to the present invention, the absorption substance can be relieved or eliminated such that the concentration is equal to or lower than an allowable concentration set for each portion and a reduction in the illuminance for each portion can be managed. Consequently, a circuit pattern can be stuck more reliably, and furthermore, the throughput of the process for manufacturing an electronic device or the like can be enhanced. By independently managing the concentration (amount) of the absorption substance in each portion, moreover, each portion can be designed more easily, the manufacturing cost of the apparatus can be reduced and the maintenance property of each portion can be enhanced.

Furthermore, according to the exposure apparatus according to the present invention, the exposure method according to the present invention can be carried out, and according to the device manufacturing method according to the present invention, there is an advantage of capable of mass-producing various devices with high throughput.

The invention claimed is:

1. An exposure method which transfers a predetermined pattern onto a substrate by using an exposure beam from an exposure light source, comprising:

dividing an optical path of the exposure beam from the exposure light source to the substrate into a plurality of partial optical paths having lengths different from one another;

respectively setting allowable concentrations of absorption substance, which absorbs the exposure beam, in the plurality of partial optical paths depending on a length of each of the partial optical paths; and managing concentrations of the absorption substance in the plurality of the partial optical paths independently of each other in order for the concentrations of the absorption substance in the plurality of the partial optical paths to be respectively equal to or lower than the set allowable concentrations of the absorption substance in the plurality of the partial optical paths.

2. An exposure method as recited in claim 1, wherein a gas which is transparent with respect to the exposure beam is supplied to at least a part of the plurality of the partial optical paths for the exposure beam.

3. An exposure method as recited in claim 1, wherein the exposure beam is a light in a vacuum ultraviolet region, and the absorption substance is oxygen, water or carbon dioxide.

4. A method of manufacturing a device, comprising transferring a predetermined pattern onto the substrate in a state that an illuminance of an exposure beam is managed on the substrate by using the exposure method as recited in claim 1.

5. An exposure method as recited in claim 1, wherein the set allowable concentrations of the absorption substance are different from each other for every partial optical path.

6. An exposure method as recited in claim 5, wherein when the concentration of the absorption substance in at least one of the plurality of the partial optical paths is equal to or more than the set allowable concentration thereof, the transfer operation is stopped.

7. An exposure method as recited in claim 1, wherein gases which are transparent with respect to the exposure beam are respectively supplied to the plurality of the partial optical paths, and kinds of the gases are different from one another depending on lengths of the partial optical paths.

8. An exposure method as recited in claim 7, wherein a helium gas is supplied to a space of the partial optical path having a long length and a nitrogen gas is supplied to a space of the partial optical path having a short length.

9. An exposure method as recited in claim 1, wherein the optical path of the exposure beam includes an optical path of an illuminating system which illuminates a mask on which the predetermined pattern is formed, an optical path of a projecting optical system which transfers the predetermined pattern onto the substrate, an optical path between the illuminating system and the projecting optical system and an optical path between the projecting optical system and the substrate.

10. An exposure method as recited in claim 9, wherein the optical path between the illuminating system and the projecting optical system is shorter than the optical path of the illuminating system.

11. An exposure method as recited in claim 10, wherein outside air flows into the optical path between the illuminating system and the projecting optical system more easily than the optical path of the illuminating system.

12. An exposure method as recited in claim 9, wherein the optical path between the projecting optical system and the substrate is shorter than the optical path of the projecting optical system.

13. An exposure method as recited in claim 12, wherein outside air flows into the optical path between the projecting optical system and the substrate more easily than the optical path of the projecting optical system.

14. An exposure method as recited in claim 1, wherein the allowable concentrations of the absorption substance is set in order for allowable absorptances of the exposure beam in the plurality of the partial optical paths to be constant.

15. An exposure method as recited in claim 1, wherein a gas which is transparent with respect to the exposure beam is supplied to each of the plurality of the partial optical paths, and the concentrations of the absorption substance are managed by exhausting the absorption substance outside the partial optical paths together with the transparent gas.

16. An exposure method which irradiates an exposure beam from an exposure light source onto a mask through an illumination system and transfers a patter of the mask onto a substrate through a projecting optical system, comprising:
dividing an optical path of the exposure beam from the exposure light source to the substrate into a plurality of partial optical paths including an illumination system portion in the illumination system, a mask operating portion provided around the mask, a projecting optical system portion including at least a part of the projecting optical system and a substrate operating portion including an upper portion of the substrate;
respectively setting allowable concentrations of absorption substance, which absorbs the exposure beam, in the plurality of the partial optical paths depending on a length of each of the partial optical paths; and
managing concentrations of the absorption substance in the plurality of the partial optical paths independently of each other in order for the concentrations of the absorption substance in the plurality of the partial optical paths to be respectively equal to or lower than the set allowable concentrations of the absorption substance in the plurality of the partial optical paths.

17. An exposure method as recited in claim 16, wherein there is provided a delivery space which delivers the mask from a mask library to the mask operating portion, and in the delivery space, a concentration of the absorption substance is managed independently of the concentrations of the absorption substance of the partial optical paths including the mask operating portion.

18. An exposure method as recited in claim 17, wherein in the space of the mask library, a concentration of the absorption substance is managed independently from that of the delivery space.

19. An exposure method as recited in claim 16, wherein a gas which is transparent with respect to the exposure beam is supplied from the projecting optical system side to between the projecting optical system and the substrate, and the gas is discharged from the substrate side.

20. An exposure method as recited in claim 19, wherein a ratio of the supply of the gas is smaller than that of discharge of the gas.

21. An exposure method which transfers a predetermined pattern onto a substrate by using an exposure beam from an exposure light source, comprising:
dividing an optical path of the exposure beam from the exposure light source to the substrate into a plurality of partial optical paths having lengths different from one another;
respectively setting allowable absorptances of the exposure beam depending on a length of each of the partial optical paths; and
managing concentrations of an absorption substance, which absorbs the exposure beam, in the plurality of the partial optical paths independently of each other in order for absorbance of the exposure beam in the plurality of the partial optical paths to be the set allowable absorptances of the exposure beam in the plurality of the partial optical paths.

22. An exposure method which transfers a predetermined pattern onto a substrate by using an exposure beam from an exposure light source, comprising:
dividing an optical path of the exposure beam from the exposure light source to the substrate into a plurality of partial optical paths, said plurality of partial optical paths respectively including absorption substance therein, which absorbs the exposure beam;
respectively supplying a gas which is transparent with respect to the exposure beam to each of the plurality of the partial optical paths;
respectively setting concentrations of the gas in the plurality of the partial optical paths depending on a length of each of the partial optical paths; and
managing concentrations of the absorption substance in the plurality of the partial optical paths independently of each other in order for concentrations of the gas in the plurality of the partial optical paths to be set concentrations of the gas in the plurality of the partial optical paths.

23. An exposure method as recited in claim 22, wherein the optical path of the exposure beam includes an optical path of an illuminating system which illuminates a mask on which the predetermined pattern is formed, an optical path of a projecting optical system which transfers the predetermined pattern onto the substrate, an optical path between the illuminating system and the projecting optical system and an optical path between the projecting optical system and the substrate.

24. An exposure method as recited in claim 23, wherein the optical path between the illuminating system and the projecting optical system is shorter than the optical path of the illuminating system.

25. An exposure method as recited in claim 24, wherein outside air flows into the optical path between the illuminating system and the projecting optical system more easily than the optical path of the illuminating system.

26. An exposure method as recited in claim 23, wherein the optical path between the projecting optical system and the substrate is shorter than the optical path of the projecting optical system.

27. An exposure method as recited in claim 26, wherein outside air flows into the optical path between the projecting optical system and the substrate more easily than the optical path of the projecting optical system.

28. An exposure method as recited in claim 22, wherein the concentrations of the absorption substance are managed by exhausting the absorption substance outside the partial optical paths together with the transparent gas.

29. An exposure apparatus which transfers a predetermined pattern onto a substrate by using an exposure beam from an exposure light source, comprising:
a plurality of chambers which divide an optical path of the exposure beam from the exposure light source to the substrate into a plurality of partial optical paths having lengths different from one another and which covers the plurality of the partial optical paths to substantially isolate the plurality of the partial optical paths from outside air, respectively; and
a controller which is connected to the plurality of chambers and which manages concentrations of an absorption substance, which absorbs the exposure beam, in the plurality of the chambers independently of each other in order for concentrations of the absorption substance in the plurality of the partial optical paths to be respectively equal to or lower than set allowable concentrations of the absorption substance in the plurality of the partial optical paths.

30. An exposure apparatus as recited in claim 29, further comprising:
concentration sensors which are disposed in the plurality of the chambers and which measure the concentrations of the absorption substance in the plurality of the chambers; and
an eliminator which is connected to the controller and which eliminates the absorption substance in the plurality of the chambers according to the result of measurement of the concentration sensors.

31. An exposure apparatus as recited in claim 30, wherein the controller stops the transfer operation when the concentration of the absorption substance in at least one of the plurality of the chambers is equal to or higher than a predetermined allowable concentration.

32. An exposure apparatus as recited in claim 29, wherein:
the predetermined pattern is a pattern formed on a mask;
the pattern of the mask is transferred onto the substrate through a projecting optical system; and
the plurality of the chambers include a first chamber which covers an illuminating system portion in an illuminating system for the exposure beam, a second chamber which covers a mask operating portion around the mask, a third chamber which covers a projecting optical system portion including at least a part of the projecting optical system, and a fourth chamber which covers a substrate operating portion including an upper portion of the substrate.

33. An exposure apparatus as recited in claim 29, further comprising a supply device which is connected to the plurality of the chambers and which respectively supplies gases which are transparent with respect to the exposure beam to the plurality of the partial optical paths.

34. An exposure apparatus as recited in claim 29, further comprising a mask library which accommodates a mask, wherein the controller manages a concentration of an absorption substance in a delivery space between the mask library and the second chamber.

35. An exposure apparatus as recited in claim 34, wherein the controller manages a concentration of an absorption substance in a space of the mask library.

36. An exposure apparatus as recited in claim 29, wherein the controller sets allowable concentrations of the absorption substance in order for allowable absorptances of the exposure beam in the plurality of the partial optical paths to be constant.

37. An exposure apparatus which transfers a predetermined pattern onto a substrate by using an exposure beam from an exposure light source, comprising:
a plurality of chambers which divide an optical path of the exposure beam from the exposure light source to the substrate into a plurality of partial optical paths having lengths different from one another and which cover the plurality of partial optical paths to substantially isolate the plurality of the partial optical paths from outside air, respectively;
a supply device which is connected to the plurality of the chambers and which supplies a gas which is transparent with respect to the exposure beam to each of the plurality of the chambers; and
a controller which is connected to the plurality of the chambers and which managed concentrations of absorption substance, which absorbs the exposure beam, in the plurality of the chambers independently of each other in order for concentrations of the gas in the plurality of the partial optical paths to be concentrations of the gas in the plurality of the partial optical paths which have been set depending on a length of each of the partial optical paths.

38. An exposure apparatus as recited in claim 37, further comprising:
concentration sensors which are disposed in the plurality of chambers and which measure the concentrations of the absorption substance in the chambers, and
an eliminator which is connected to the controller and which eliminates the absorption substance in the plurality of the chambers according to the measurement result of the concentration sensors.

39. An exposure apparatus as recited in claim 37, wherein:
the predetermined pattern is a pattern formed on a mask;
a pattern of the mask is transferred onto the substrate through a projecting optical system; and
the plurality of the chambers include a first chamber which covers an illuminating system portion in an illuminating system for the exposure beam, a second chamber which covers a mask operating portion around the mask, a third chamber which covers a projecting optical system portion including at least a part of the projecting optical system, and a fourth chamber which covers a substrate operating portion including an upper portion of the substrate.

40. An exposure apparatus as recited in claim 37, wherein the controller stops the transfer operation when the concentrations of the absorption substance included in the transparent gas becomes equal to or larger than a predetermined value in at least one chamber of the plurality of the chambers.

41. An exposure method, comprising transferring a predetermined pattern onto a substrate by using an exposure beam from an exposure light source, wherein:

an optical path of the exposure beam from the exposure light source to the substrate is divided into a plurality of partial optical paths having lengths different from one another;

allowable concentrations of absorption substance, which absorbs the exposure beam, in the plurality of the partial optical paths are respectively set depending on a length of each of the partial optical paths; and concentrations of the absorption substance in the plurality of the partial optical paths are managed independently of each other, in order for the concentrations of the absorption substance in the plurality of the partial optical paths to be respectively equal to or lower than the set allowable concentrations of the absorption substance in the plurality of the partial optical paths.

42. An exposure method, comprising irradiating an exposure beam from an exposure light source onto a mask through an illumination system so as to transfer a pattern of the mask onto a substrate through a projecting optical system, wherein:

an optical path of the exposure beam from the exposure light source to the substrate is divided into a plurality of partial optical paths including an illumination system portion in the illumination system, a mask operating portion provided around the mask, a projecting optical system portion including at least a part of the projecting optical system and a substrate operating portion including an upper portion of the substrate;

allowable concentrations of absorption substance, which absorbs the exposure beam, in the plurality of the partial optical paths are respectively set depending on a length of each of the partial optical paths; and concentrations of the absorption substance in the plurality of the partial optical paths are managed independently of each other in order for the concentrations of the absorption substance in the plurality of the partial optical paths to be respectively equal to or lower than the set allowable concentrations of the absorption substance in the plurality of the partial optical paths.

43. An exposure method, comprising transferring a predetermined pattern onto a substrate by using an exposure beam from an exposure light source, wherein:

an optical path of the exposure beam from the exposure light source to the substrate is divided into a plurality of partial optical paths having lengths different from one another;

allowable absorptances of the exposure beam are respectively set depending on a length of each of the partial optical paths; and concentrations of an absorption substance, which absorbs the exposure beam, in the plurality of the partial optical paths are managed independently of each other in order for absorptances of the exposure beam in the plurality of the partial optical paths to be the set allowable absorptances of the exposure beam in the plurality of the partial optical paths.

44. An exposure method, comprising transferring a predetermined pattern onto a substrate by using an exposure beam from an exposure light source, wherein:

an optical path of the exposure beam from the exposure light source to the substrate is divided into a plurality of partial optical paths, said plurality of partial optical paths respectively including absorption substance therein, which absorbs the exposure beam;

a gas which is transparent with respect to the exposure beam is supplied to each of the plurality of the partial optical paths;

concentrations of the gas in the plurality of the partial optical paths are respectively set depending on a length of each of the partial optical paths; and concentrations of the absorption substance in the plurality of the partial optical paths are managed independently of each other in order for concentrations of the gas in the plurality of the partial optical paths to be the set concentrations of the gas in the plurality of the partial optical paths.

* * * * *

UNITED STATES PATENT AND TRADEMARK OFFICE
CERTIFICATE OF CORRECTION

PATENT NO. : 6,707,529 B1  Page 1 of 20
APPLICATION NO. : 09/913328
DATED : March 16, 2004
INVENTOR(S) : Aoki et al.

It is certified that error appears in the above-identified patent and that said Letters Patent is hereby corrected as shown below:

PLEASE DELETE ENTIRE PATENT TITLE PAGE, DRAWINGS 1 THROUGH 10, AND COLUMNS 1 THROUGH 44

AND INSERT TITLE PAGE, DRAWINGS 1 THROUGH 4, AND COLUMNS 1 THROUGH 28 AS SHOWN ON THE ATTACHED PAGES.

This certificate supersedes the Certificate of Correction issued October 23, 2007.

Signed and Sealed this

Fifteenth Day of April, 2008

JON W. DUDAS
*Director of the United States Patent and Trademark Office*

(12) United States Patent
Aoki et al.

(10) Patent No.: US 6,707,529 B1
(45) Date of Patent: Mar. 16, 2004

(54) EXPOSURE METHOD AND APPARATUS

(75) Inventors: Takashi Aoki, Chiyoda-ku (JP); Naomasa Shiraishi, Chiyoda-ku (JP); Soichi Owa, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/913,328

(22) PCT Filed: Feb. 8, 2000

(86) PCT No.: PCT/JP00/00676
§ 371 (c)(1),
(2), (4) Date: Oct. 15, 2001

(87) PCT Pub. No.: WO00/48237
PCT Pub. Date: Aug. 17, 2000

(30) Foreign Application Priority Data

Feb. 12, 1999 (JP) .................................. 11/34897

(51) Int. Cl.[7] .......................... G03B 27/52; G03B 27/42
(52) U.S. Cl. .................................. 355/30; 355/53
(58) Field of Search ........................ 355/53, 67, 69–71, 355/30

(56) References Cited

U.S. PATENT DOCUMENTS

| | | | |
|---|---|---|---|
| 4,690,528 A | | 9/1987 | Tanimoto et al. |
| 4,825,453 A | * | 4/1989 | Kembo et al. ............ 378/34 |
| 5,425,045 A | | 6/1995 | Hamatani |
| 5,430,303 A | | 7/1995 | Matsumoto et al. |
| 5,559,584 A | | 9/1996 | Miyaji et al. ............ 355/73 |
| 5,696,623 A | | 12/1997 | Fujie et al. |
| 6,208,406 B1 | | 3/2001 | Nakashima |
| 6,222,610 B1 | | 4/2001 | Hagiwara et al. |
| 6,252,648 B1 | * | 6/2001 | Hase et al. ............ 355/53 |
| 6,335,787 B1 | * | 1/2002 | Nishi ............ 355/87 |
| 2002/0033943 A1 | | 3/2002 | Ishii |

FOREIGN PATENT DOCUMENTS

| | | | |
|---|---|---|---|
| JP | 61-79228 | * | 4/1986 |
| JP | 61-136227 A | | 6/1986 |
| JP | 62-286226 | | 12/1987 |
| JP | 62-286226 A | | 12/1987 |
| JP | 9-162117 | | 6/1997 |
| JP | 9-162117 A | | 6/1997 |
| JP | 10-284410 A | | 10/1998 |
| WO | WO 99/25010 A1 | | 5/1999 |

OTHER PUBLICATIONS

International Preliminary Examination Report for International Application No. PCT/JP00/00676 (Apr. 24, 2001).

* cited by examiner

*Primary Examiner*—Henry Hung Nguyen
(74) *Attorney, Agent, or Firm*—Oliff & Berridge PLC

(57) ABSTRACT

An exposure apparatus having an illumination system which applies an exposure energy beam to a mask on which a pattern for transfer is formed, and a stage system for positioning a substrate to which the pattern of the mask is transferred, is characterized in that: a gas supply apparatus for supplying a gas of high transmittivity with respect to the exposure energy beam, and having good thermal conductivity, to at least a portion of an optical path of the exposure energy beam, and a gas recovery apparatus for recovering at least a portion of the gas after the gas is supplied to the optical path of the exposure energy beam from the gas supply apparatus, are provided.

44 Claims, 4 Drawing Sheets

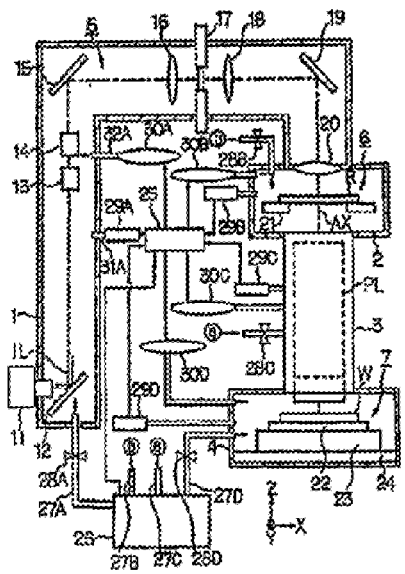

EXPOSURE METHOD AND APPARATUS

DESCRIPTION

1. Technical Field

The present invention relates to an exposure method and apparatus to be used when a predetermined pattern is to be transferred onto a substrate in a lithographic process for manufacturing a semiconductor device, an image pick-up device (a CCD or the like), a liquid crystal display element, a thin film magnetic head or the like, for example, and more particularly, the present invention can be suitably used for a VUV light (Vacuum Ultraviolet light) having a wavelength of approximately 200 nm or less as an exposure beam.

2. Background Art

In the lithographic process for manufacturing a semiconductor device or the like, there have been used various exposure apparatuses such as a reducing projection type exposure apparatus, for example, a stepper, to transfer a reticle pattern to be a mask onto a wafer (or a glass plate or the like) coated with a resist (photosensitive material) to be a substrate, a proximity type exposure apparatus for directly transferring a reticle pattern on a wafer, and the like. In the exposure apparatus of this kind, conventionally, an ultraviolet light such as i rays of a mercury lamp (a wavelength of 365 nm) or a KrF excimer laser beam (a wavelength of 248 nm) has been used as an exposure beam (exposure light).

In order to obtain a higher resolution corresponding to an increase in integration of a semiconductor integrated circuit or the like, recently, the wavelength of the exposure beam has been more shortened. The practical use of the ArF excimer laser beam (a wavelength of 193 nm) has come to a final stage. An $F_2$ laser beam (a wavelength of 157 nm) has also been studied as an advanced exposure beam. On the other hand, a desired value of an energy (illuminance) of an exposure beam to be irradiated on a reticle (wafer) per unit time has been increased in order to enhance the throughput of the exposure apparatus. Referring to a dioptric member such as a lens in an illuminating optical system or a projecting optical system, synthetic silica glass, fluorite or the like having a high transmittance to a light having a wavelength of approximately 200 nm has been used.

As the exposure beam for the exposure apparatus, recently, the utilization of a vacuum ultraviolet light (VUV light) having a wavelength of approximately 200 nm or less has been investigated, and the use of a glass material having a high transmittance to the vacuum ultraviolet light has been investigated for the dioptric member in the illuminating optical system or the like. Referring to the exposure beam, however, a substance (hereinafter referred to as an absorption substance) for absorbing the exposed beam to greatly reduce the transmittance of the exposure beam is present in the atmosphere on an optical path in addition to the dioptric member. The absorption substance is varied depending on the wavelength of the exposure beam. In the normal air, ozone or the like acts as the absorption substance for a light having a wavelength of 200 nm or more, and oxygen molecules contained in the air, water molecules, carbon dioxide molecules and the like act as the absorption substances for the vacuum ultraviolet light.

In the case in which the air is supplied to the optical path of the vacuum ultraviolet light, therefore, the vacuum ultraviolet light is greatly absorbed by the absorption substances. For this reason, it is hard to cause the vacuum ultraviolet light to reach a wafer through a reticle with a sufficient illuminance. In order to prevent the illuminance on the wafer from being reduced, it is necessary to decrease the amount of the absorption substance on the optical path of the exposure beam or to eliminate the absorption substance, thereby increasing the transmittance of the optical path. For this purpose, there has been proposed a method of uniformly reducing the amount of the absorption substance on all the optical paths of the exposure beam or eliminating the absorption substance, thereby collectively managing the absorption material. However, if the absorption substance is collectively managed including the vicinity of a movable portion such as a reticle stage or a wafer stage and the inner portion of the illuminating optical system and the like, a mechanism might become complicated partially to increase the manufacturing cost of the exposure apparatus and the running cost of the exposure apparatus.

In consideration of such a respect, it is a first object to provide an exposure method capable of increasing the illuminance of an exposure beam on a transfer object.

Moreover, it is a second object of the present invention to provide an exposure method capable of increasing the illuminance of an exposure beam on a transfer object in the case in which an exposure beam capable of being easily absorbed by various substances, for example, a vacuum violet light is to be used. In particular, it is an object of the present invention to provide an exposure method capable of increasing the illuminance of an exposure beam on a transfer object without wholly complicating a mechanism or greatly increasing the running cost.

Furthermore, it is an object of the present invention to provide an exposure apparatus capable of carrying out the exposure method and a method of manufacturing a device using the exposure method.

DISCLOSURE OF THE INVENTION

The present invention provides a first exposure method which transfers a predetermined pattern onto a substrate (W) by using an exposure beam from an exposure light source (11), wherein an optical path of the exposure beam from the exposure light source to the substrate is divided into a plurality of partial optical paths and concentrations of an absorption substance which absorbs the exposure beam are respectively managed independently of each other for the plurality of the partial optical paths.

According to the above-mentioned present invention, the optical path of the exposure beam is divided into a first partial optical path including an optical path of an illuminating optical system and a second partial optical path, which is located in the vicinity of a movable member such as a stage system, into which not only the outside air but also an absorption substance absorbing the exposure beam is easily mixed, but which has a shorter optical path length than the first partial optical path, for example. As compared with the first partial optical path, for example, the allowable concentration of the absorption substance contained in the second partial optical path is allowed to be increased, and by managing the concentration of the absorption substance in the first partial optical path and the second partial optical path independently of each other by eliminating the absorption substance and the like, the illuminance of the exposure beam (a pulse energy in the case of a pulse light) on the substrate can be increased without greatly complicating a mechanism such as a closing mechanism (an airtight mechanism) of each partial optical path or an eliminating mechanism for the absorption substance.

In place of the concentration of the absorption substance, the total amount of the absorption substance in the partial optical path may be managed.

Furthermore, the present invention provides a second exposure method which irradiates an exposure beam from an exposure light source (11) onto a mask (R) through an illumination system and transfers a pattern of the mask onto a substrate (W) through a projecting optical system (PL), wherein an optical path of the exposure beam from the exposure light source to the substrate is divided into a plurality of partial optical paths including an illumination system portion (5) in the illumination system, a mask operating portion (6) provided around the mask, a projecting optical system portion (PL) including at least a part of the projecting optical system and a substrate operating portion (7) including an upper portion of the substrate, and concentrations of an absorption substance which absorbs the exposure beam are respectively managed independently of each other for the plurality of the partial optical paths.

According to the above-mentioned present invention, the outside air (absorption substance) is comparatively less mixed in the illumination system portion. Moreover, the mask operating portion has more movable portions to exchange and to position a mask and therefore the outside air is easily mixed therein. The projecting optical system portion has an almost closed structure and the substrate operating portion has more movable portions to exchange and to position a substrate. Moreover, the illumination system portion and the projecting optical system portion have longer optical path lengths than the optical path length of the mask operating portion or the substrate operating portion, and a fluctuation in the amount of each component in the atmosphere on the optical path is small, while the mask operating portion and the substrate operating portion have shorter optical path lengths than the optical path length of the illuminating optical system portion or the projecting optical system portion and the fluctuation in the amount of each component in the atmosphere on the optical path is great. As an example, a sealing property is enhanced for these partial optical paths, the flow of the absorption substance from the outside is almost blocked and the concentration of the absorption substance in the inner portion is managed independently for each partial optical path.

In order to reduce or eliminate the absorption substance on each partial optical path, for example, the allowable concentrations of the absorption substance are independently set for every partial optical path. In this case, the optical path is short in the mask operating portion and the substrate operating portion. As one of control methods, therefore, the allowable concentration of the absorption substance is allowed to be higher than that of other portions. In the partial optical path in which the concentration of the absorption substance exceeds the allowable concentration, exhaust (or pressure reduction) is carried out in the inner portion thereof. If necessary, then, a gas having a low absorptivity (a high transmittance) to the exposure beam is supplied to the inner portion, for example. Consequently, the concentration of the absorption substance is managed to be equal to or lower than the allowable concentration set for each partial optical path and the illuminance of the exposure beam on the substrate can be enhanced. Consequently, the mask pattern can be transferred onto the substrate with high precision and high throughput. In this case, particularly, the structures of the mask operating portion and the substrate operating portion can be relatively simplified as compared with the case in which the concentration of the absorption substance is collectively managed in the whole optical path.

Furthermore, the concentration of the absorption substance is allowed to be increased in the mask operating portion and the substrate operating portion and the concentration (or the total amount) of the absorption substance is managed independently of other illumination system portions and projecting optical system portions. Consequently, the illuminance of the exposure beam can be increased without complicating a control mechanism in the illumination system portion and the projecting optical system portion. In other words, in the case in which the concentration (amount) of the absorption substance in each of the mask operating portion and the substrate operating portion is increased and in such a situation that the degree of sealing is enhanced for each partial optical path, the mask operating portion and the substrate operating portion take countermeasures independently of other portions to solve the problems (the concentration is managed to reduce the concentration of the absorption substance). Consequently, the other portions are not affected by an increase in the concentration (amount) of the absorption substance. In the other portions, therefore, the concentration can easily be managed and the running cost can also be reduced. On the other hand, in the case in which the degree of sealing is not increased for each partial optical path and the concentration on the whole optical path is collectively managed, the other portions are adversely influenced when the concentration is increased in a part of the optical path.

In this case, when the exposure beam is a light in a vacuum violet region, an example of the absorption substance includes oxygen, water or carbon dioxide and an example of a gas having a high transmittance is nitrogen and a rare gas such helium, neon or argon or a mixed gas combining them.

The present invention provides a third exposure method which transfers a predetermined pattern onto a substrate by using an exposure beam transmitted from an exposure light source, wherein an optical path of the exposure beam from the exposure light source to the substrate is divided into a plurality of partial optical paths and transmittances of the exposure beam are respectively managed independently of each other for the plurality of the partial optical paths. According to the present invention, for example, the degree of internal vacuum, the concentration (total amount) of a gas having a high transmittance in the inner portion, the concentration (total amount) of the absorption substance in the inner portion or the like is managed independently for the plurality of the partial optical paths. Consequently, it is possible to wholly simplify a mechanism, and furthermore, to efficiently increase the illuminance of (a pulse energy in the case of a pulse light) the exposure beam on the substrate.

The present invention provides a fourth exposure method which transfers a predetermined pattern onto a substrate (W) by using an exposure beam transmitted from an exposure light source (11), wherein an optical path of the exposure beam from the exposure light source to the substrate is divided into a plurality of partial optical paths and concentrations of a gas in the plurality of the partial optical paths are managed independently of each other. According to the present invention, in the case in which the gas, although having differences in extent for the exposure beam, acts as absorption substance, the concentrations of the gas are managed independently of each other so that the illuminance of the exposure beam can be increased on the substrate in the same manner as in the first exposure method.

In this case, the concentrations of the gas in the plurality of the partial optical paths may be managed depending on the lengths of the partial optical paths. Alternatively, the concentrations of the gas may be managed depending on the frequencies of such as the in-and-out operation of the substrate between the partial optical path and the outside air.

Examples of the gas of which concentrations are to be managed include nitrogen, helium, neon or argon or a mixed gas combining them.

The present invention provides a first exposure apparatus which transfers a predetermined pattern onto a substrate (W) by using an exposure beam transmitted from an exposure light source (11), comprising a plurality of chambers which covers a plurality of partial optical paths formed by dividing an optical path of the exposure beam from the exposure light source to the substrate to substantially isolate the plurality of the partial optical paths from outside air, respectively, and a controller (25) which manages concentrations of an absorption substance in the plurality of the chambers independently of each other. According to the present invention, the first exposure method can be carried out.

In this case, preferably, there are provided a concentration sensor (29A to 29D) which measures the concentrations of the absorption substance for absorbing the exposure beam in the plurality of the chambers and an eliminator (30A to 30D) which eliminates the absorption substance in the plurality of the chambers, and the controller manages the concentrations of the absorption substance through the eliminator according to the result of measurement of the concentration sensor.

In this case, furthermore, when the predetermined pattern is a pattern formed on a mask, the mask is illuminated by an illuminating optical system, a mask pattern is transferred onto the substrate through a projecting optical system, it is desirable that the plurality of the chambers include a first chamber (1) which covers an illuminating system portion (5) in an illuminating system for the exposure beam, a second chamber (2) which covers a mask operating portion (6) around the mask, a third chamber (3) which covers a projecting optical system portion including at least a part of the projecting optical system (PL), and a fourth chamber (4) which covers a substrate operating portion (7) including an upper portion of the substrate. With this, the second exposure method according to the present invention can be carried out. Moreover, the inner portions of the first to fourth chambers may be divided into a plurality of partial chambers which are isolated from each other.

The present invention provides a third exposure apparatus which transfers a predetermined pattern onto a substrate (W) by using an exposure beam transmitted from an exposure light source (11), comprising a plurality of chambers which covers a plurality of partial optical paths formed by dividing an optical path of the exposure beam from the exposure light source to the substrate to be substantially isolate the plurality of the partial optical paths from outside air, respectively, and a controller (25) which manages concentrations of a gas in the plurality of the chambers independently of each other. With this, the fourth exposure method according to the present invention can be carried out.

Moreover, the method of manufacturing a device according to the present invention comprises a step of transferring a predetermined pattern onto the substrate in such a state that an illuminance of an exposure beam is managed on the substrate by using the above-mentioned exposure methods according to the present invention. In this case, the illuminance of the exposure beam on the substrate is high. Therefore, it is possible to mass produce a semiconductor device or the like with high throughput.

BRIEF DESCRIPTION OF THE FIGURES IN THE DRAWINGS

FIG. 1 is a schematic view showing the structure of a projecting exposure apparatus according to an example of an embodiment in accordance with the present invention, a part of which is taken away.

FIG. 2 is a view showing an end face along a section according to an example of the structures of a projecting optical system PL and a barrel 3 in FIG. 1.

FIG. 3 is a schematic view showing the structure of a main part of a projecting exposure apparatus according to a second embodiment of the present invention, a part of which is taken away.

FIG. 4 is a view showing a structure from a projecting optical system PL1 to a wafer stage 23 according to a third embodiment of the present invention, a part of which is taken away.

BEST MODE FOR CARRYING OUT THE INVENTION

A preferred first embodiment of the present invention will be described below with reference to FIGS. 1 and 2. In the present embodiment, the present invention is applied to a projecting exposure apparatus of a step and scan type using a vacuum violet light as an exposure beam.

FIG. 1 is a view showing the schematic structure of the projecting exposure apparatus according to the present embodiment, a part of which is taken away. In FIG. 1, a mechanism portion of the projecting exposure apparatus according to the present embodiment is roughly divided into an illuminating optical system portion 5, a reticle operating portion 6, a projecting optical system PL and a wafer operating portion 7. Furthermore, the illuminating optical system portion 5, the reticle operating portion 6, the projecting optical system PL and the wafer operating portion 7 are accommodated in an illuminating system chamber 1, a reticle chamber 2, a barrel 3 and a wafer chamber 4 to be isolated from the outside air with a high degree of sealing, respectively. Furthermore, the projecting exposure apparatus according to the present embodiment is wholly accommodated in one large chamber in which the temperature of an internal gas (for example, purified air) is controlled into a predetermined target range.

In the illuminating optical system portion 5, first of all, an $F_2$ laser beam source for generating a pulse laser beam having a wavelength of 157 nm in a vacuum ultraviolet area is used as an exposure light source 11, and the emitting end of the exposure light source 11 is inserted into the lower side surface of the illuminating system chamber 1. During exposure, an illumination light IL (exposure beam) emitted from the exposure light source 11 into the illuminating system chamber 1 is reflected upward by a mirror 12 and is incident on a fly eye lens (or a rod lens) 14 to be an optical integrator (homogenizer) through an automatic following portion for aligning an optical axis shift caused by a vibration or the like which is not shown and a beam reshaping optical system 13 for reshaping the sectional shape of the illuminating system and controlling the amount of a light and an aperture diaphragm (not shown) is provided on the emitting surface of the fly eye lens 14 and an illumination light IL emitted from the fly eye lens 14 and passing through the aperture diaphragm is reflected in an almost horizontal direction through a mirror 15 and reaches a field stop (reticle blind) 17 through a relay lens 16.

A surface on which the field stop 17 is provided is almost conjugated with a pattern surface of a reticle R of an exposure object, and the field stop 17 includes a fixed blind for defining the shape of a slender and rectangular illumination region on the pattern surface and a movable blind for closing the illumination region to prevent exposure to an unnecessary portion during the start and end of scanning and exposure. The illumination light IL passing through the field stop 17 illuminates, with a uniform illumination distribution, a rectangular (slit-shaped) illumination region on the pattern surface of the reticle R through a relay lens 18, a mirror 19 and a condenser lens system 20 fixed to the tip portion of the illuminating system chamber 1. The exposure light source 11 to the condenser lens system 20 constitute the illuminating optical system portion 5, and the optical path of the illumination light IL in the illuminating optical system portion 5, that is, the optical path from the exposure light source 11 to the condenser lens system 20 is closed by the illuminating system chamber 1.

Based on the illumination light IL, a pattern image in the illumination region of the reticle R is projected onto the wafer W coated with a photoresist to be a substrate with a projection magnification $\beta$ ($\beta$ is ¼, ⅕ or the like, for example) through the projecting optical system PL. The wafer (wafer) W is a disc-shaped substrate such as a semiconductor (silicon or the like), SOI (silicon on insulator) or the like, for example. In the case in which the illumination light IL is the $F_2$ laser beam as in the present embodiment, an optical glass member having a high transmittance is restricted to fluorite ($CaF_2$ crystal), quartz glass doped with fluorine, magnesium fluoride ($MgF_2$) or the like. Therefore, it is hard to obtain a desired image forming characteristic (color aberration characteristic or the like) by constituting the projecting optical system with only a dioptric member. The projecting optical system PL according to the present embodiment will be described by using a catadioptric system combining a dioptric member and a reflecting mirror as will be described below. In the case in which the desired imaging characteristic is to be obtained, the projecting optical system may be constituted by the dioptric system. A Z-axis is taken in parallel with an optical axis AX of the projecting optical system PL, an X-axis is taken in parallel with the paper of FIG. 1 in a plane perpendicular to the Z-axis (a horizontal plane in the present embodiment), and a Y-axis is taken perpendicularly to the paper in FIG. 1. The illumination region on the reticle R in the present embodiment is a slender rectangle in the X direction and the scanning direction of the reticle R and the wafer W during the exposure is set to be the Y direction.

At this time, the reticle R is held on a reticle stage 21. The reticle stage 21 continuously moves the reticle R in the Y direction on a reticle base which is not shown and slightly drives the reticle R to reduce a synchronization error in the X direction, the Y direction and the rotating direction. The position of the reticle stage 21 is measured with high precision by means of a laser interferometer which is not shown, and the reticle stage 21 is driven based on control information transmitted from a main control system 25 comprising a computer for generally controlling a measured value and the operation of the whole apparatus. The reticle operating operation 6 is constituted by the reticle, the reticle stage 21, a reticle base and a reticle loader which are not shown, and the like, and the optical path of the illumination light L in the reticle operating portion 6, that is, the optical path from the condenser lens system 20 to the projecting optical system PL is closed by the reticle chamber 2.

On the other hand, the wafer W is held on a wafer stage 23 through a wafer holder 22, and the wafer stage 23 continuously moves the wafer W in the Y direction over a wafer base 24 and moves the wafer W by stepping in the X direction and the Y direction. Moreover, the wafer stage 23 focuses the surface of the wafer W on the image plane of the projecting optical system PL by an autofocus method based on information about a position (a focus position) in an optical axis AX direction of the surface of the wafer W measured by an autofocus sensor which is not shown. The position of the wafer stage 23 is measured with high precision by means of a laser interferometer which is not shown, and the wafer stage 23 is driven based on a measured value and control information transmitted from the main control system 25.

During the exposure, an operation for stepping a shot area of an exposure object on the wafer W to this side in the exposure area of the projecting optical system PL and an operation for scanning the wafer W in the Y direction at a constant rate $\beta \cdot VR$ ($\beta$ is a projection magnification of the projecting optical system PL) through the wafer stage 23 synchronously with the scanning of the reticle R at a constant rate VR in the Y direction for the illumination area of the illumination light IL through the reticle stage 21 are repeated by a step and scan method. Thus, the reduced image of a pattern of the reticle R is sequentially transferred into each shot area on the wafer W.

The wafer W, the wafer holder 22, the wafer stage 23, the wafer base and the wafer loader which are not shown and the like constitute the wafer operating portion 7, and the optical path of the illumination light IL in the wafer operating portion 7, that is, the optical path from the projecting optical system PL to the wafer W is closed by the wafer chamber 4. Moreover, the projecting optical system PL is closed and accommodated in the barrel 3, and the optical path from the optical member on the reticle side of the projecting optical system PL to the optical member on the wafer side is closed in the barrel 3.

The illumination light IL according to the present embodiment is a vacuum ultraviolet light having a wavelength of 157 nm. Therefore, an ordinary absorption substance in the air from which ozone for the illumination light IL is removed includes a gas such as oxygen ($O_2$) or carbon dioxide ($CO_2$), steam ($H_2O$) or the like. On the other hand, examples of a transmission gas to the illumination light IL (a substance rarely having absorption) include a rare gas such as helium (He), neon (Ne) or argon (Ar) in addition to a nitrogen gas ($N_2$). Moreover, while the nitrogen gas acts as the absorption substance for a light having a wavelength of approximately 150 nm or less, the helium gas can be used as a transmission gas with a wavelength of approximately 100 nm or less. Furthermore, the helium gas has a thermal conductivity which is approximately six times as high as that of the nitrogen gas and the amount of fluctuation in a refractive index for a change in an air pressure is approximately ⅛ of that of the nitrogen gas. For this reason, particularly, the helium gas has a high transmittance and is excellent in stability and cooling properties of an image forming characteristic of the optical system. However, the helium gas is expensive. Therefore, if the wavelength of the exposure beam is 150 nm or more as in the $F_2$ laser, the nitrogen gas may be use as a transmission gas in order to reduce the running cost. In the present embodiment, the nitrogen gas is used as the transmission gas for the illumination light IL.

As described above, a vacuum pump 30A for discharging a gas containing an internal absorption substance through a pipe 32A is connected into the illuminating system chamber 1. For example, the nitrogen gas to be a transmission gas to the illumination light IL is compressed with an impurity highly removed or liquefied and stored in a bomb of an air supply device 26 provided on the outside of a chamber (not shown) accommodating the whole projecting exposure apparatus according to the present embodiment. If necessary, the nitrogen gas fetched from the bomb is controlled to a predetermined temperature at a predetermined pressure and is supplied into the illuminating system chamber 1 through a pipe 27A provided with a valve 28A which can be switched electromagnetically.

Moreover, a concentration sensor 29A for measuring the concentration of an absorption substance is connected into the illuminating system chamber 1 through a pipe 31A and the measured value of the concentration sensor 29A is supplied to the main control system 25. When the concentration of a predetermined absorption substance (oxygen, steam and carbon dioxide in the present embodiment) measured by the concentration sensor 29A exceeds a preset allowable concentration, the main control system 25 operates the vacuum pump 30A with the valve 28A closed and discharges the air and the absorption substance from the illuminating system chamber 1. Then, the main control system 25 opens the valve 28A and operates the gas supply device 26, and supplies a nitrogen gas having a high purity and a predetermined temperature at a predetermined pressure (usually, approximately 1 atm) into the illuminating system chamber 1 through the pipe 27A. Consequently, an air pressure in the illuminating system chamber 1 becomes substantially equal to that of the outside air. Then, the valve 28A is closed. The concentration of the absorption substance in the illuminating system chamber 1 is equal to or lower than the allowable concentration until a predetermined period of time passes from the operation.

Similarly, a nitrogen gas having a high purity is supplied from the gas supply device 26 to the reticle chamber 2, the barrel 3 and the wafer chamber 4 through a pipe 27B having an openable valve 28B, a pipe 27C having a valve 28C and a pipe 27D having a valve 28D at any time, and the concentration of the internal absorption substance is always measured by the concentration sensors 29B, 29C and 29D and a measured value is supplied to the main control system 25. Furthermore, vacuum pumps 30B, 30C and 30D are connected to the reticle chamber 2, the barrel 3 and the wafer chamber 4, respectively. When the concentration of the absorption substance measured by the concentration sensors 29B, 29C and 29D exceeds respective allowable concentrations, the main control system 25 operates the vacuum pumps 30B, 30C and 30D, the valves 28B to 28C and the air supply device 26 such that the concentrations of the absorption substances in the reticle chamber 2, the barrel 3 and the wafer chamber 4 can be maintained to be equal to or lower than the respective allowable concentrations. For the concentration sensors 29A to 29D, a complex sensor combining an oxygen analyzer, a hygrometer or a dew point meter to be a steam densitometer, a carbon dioxide sensor and the like can be used. For example, a polarography type oxygen analyzer, a zirconia and ceramics type oxygen analyzer, a white phosphorus emission type oxygen concentration sensor or the like can be used for the oxygen analyzer. For example, a crystal type hygrometer, an electric-resistance type hygrometer, infrared transmittance type hygrometer, a mirror reflectance measuring type dew point meter or the like can be used for the steam densitometer (the hydrometer or the dew point meter).

Moreover, a cryopump can be used for a vacuum pump. The cryopump has such a type as to utilize the fact that a vapor pressure of an element other than $H_2$, He and Ne is $10^{-8}$ Pa or less at 20K or less and a plane (cryopanel) cooled to a very low temperature (10 to 15K) is put in the vacuum and a gas ($N_2$, Ar, $O_2$, $H_2O$, $CO_2$ or the like) is adsorbed into the plane to create a clean vacuum.

Next, an example of the projecting optical system PL and the sealing mechanism according to the present embodiment will be described with reference to FIG. 2.

FIG. 2 is a view showing an end face along a section illustrating the internal structure of the projecting optical system PL in FIG. 1. In FIG. 2, the projecting optical system PL comprising a catadioptric optical system according to the present embodiment is constituted by a first imaging optical system K1 for forming a primary image (an intermediate image) I of the pattern of the reticle R and a second imaging optical system K2 for forming a secondary image of the reticle pattern on the wafer W to be a photosensitive substrate with a reduced magnification based on the light transmitted from the primary image I.

The first imaging optical system K1 is constituted by a first lens group G1 having a positive refractive power, an aperture diaphragm S and a second lens group G2 having a positive refractive power which are sequentially provided from the reticle side. The first lens group G1 is constituted by a positive meniscus lens L11 having a non-spherical convex turned toward the reticle side, a positive meniscus lens L12 having a non-spherical convex turned toward the reticle side, and a positive meniscus lens L13 having a non-spherical concave turned toward the wafer side which are sequentially provided from the reticle side.

Moreover, a second lens group G2 has a biconcave lens 21 having a plane on the reticle side to take a non-spherical shape, a biconvex lens L22 having a plane on the reticle side to take a non-spherical shape, a positive meniscus lens L23 having a non-spherical convex turned toward the wafer side, and a positive meniscus lens L24 having a non-spherical concave turned toward the wafer side which are sequentially provided from the reticle side.

On the other hand, the second imaging optical system K2 is constituted by a main mirror M1 including a surface reflection plane R1 having a concave turned toward the wafer side and an opening on a center, a lens component L2, and an auxiliary mirror M2 including a reflection plane R2 provided on a lens plane at the wafer side and having an opening on a center which are sequentially provided from the reticle side. In another respect, the auxiliary mirror M2 and the lens component L2 constitute a back-surface reflecting mirror, and the lens component L2 constitutes a refracting portion of the back-surface reflecting mirror. In this case, it is desirable that a relationship of $0.7 < |\beta 1/\beta 2| < 3.5$ should be satisfied as an example, wherein the imaging magnification of the first imaging optical system K1 is represented by $\beta 1$ and the imaging magnification of the second imaging optical system K2 is represented by $\beta 2$.

Moreover, all optical elements (G1, G2, M1, M2) constituting the projecting optical system PL are provided along a single optical axis AX. Furthermore, the main mirror M1 is provided in the vicinity of a position where the primary image I is to be formed and the auxiliary mirror M2 is provided in the proximity of the wafer W.

In the present embodiment, thus, the light transmitted from the pattern of the reticle R forms the primary image (intermediate image) I having a reticle pattern through the first imaging optical system K1 and the light transmitted from the primary image I is reflected by the main mirror M1 through the central opening of the main mirror M1 and the lens component L2. The light reflected by the main mirror M1 forms the secondary image of the reticle pattern with a reduced magnification on the surface of the wafer W through the lens component L2 and the central opening of the auxiliary mirror M2. In the example of FIG. 2, the imaging magnification $\beta 1$ of the first imaging optical system K1 is 0.6249, the imaging magnification $\beta 2$ of the first imaging optical system K2 is 0.4000 and a projecting magnification $\beta$ from the reticle R to the wafer W is 0.25 (1.4 time as large).

In the present example, fluorite (CaF$_2$ crystal) is used for all the dioptric members (lens components) constituting the projecting optical system PL. Moreover, the F$_2$ laser beam to be the exposed laser has an oscillating central wavelength of 157.6 nm and a chromatic aberration is corrected for a light having a wavelength width of 156 nm±10 pm and various aberrations such as a spherical aberration, an astigmatism and a distortion aberration can also be corrected well. In order to prevent a change in the reflection plane of the main mirror M1 for a change in a temperature to maintain an excellent imaging performance, furthermore, a support member supporting a reflection plane S1 of the main mirror M is formed by using a substrate having a coefficient of linear expansion of 3 ppm/° C. or less, for example, titanium silicate glass. For the titanium silicate glass, ULE (trade name of Ultra Low Expansion) produced by Corning Co., Ltd. can be used, for example.

The projecting optical system PL according to the present embodiment has all the optical elements constituting the catadioptric system which are provided along a single optical axis. Therefore, the chromatic aberration or the like can be reduced by using a reflecting member, and furthermore, a barrel can be designed and manufactured by the advanced technique of a conventional direct cylinder type reflection system and the precision can be increased without the difficulty of the manufacture.

As an example of a first structure according to the present embodiment, the first imaging optical system K1 and the second imaging optical system K2 are enclosed and supported in the single barrel 3. In the second imaging optical system K2, the illumination light passes through a space plural times. Therefore, it is desirable that the concentration of the absorption substance should be managed to be lower more strictly.

For an example of a second structure, as shown in FIG. 2, each optical element of the first imaging optical system K1 is supported by a lens frame which is not shown in such a state as to be enclosed in the barrel 3 and the main mirror M1 and the auxiliary mirror M2 in the second imaging optical system K2 are enclosed and supported in another lower barrel 3A through a support member which is not shown, respectively. In this case, the portions in the barrel 3 and the lower barrel 3A through which the exposure beam passes may be sealed with a parallel flat glass formed of the material having a high transmittance described above, for example, which is not shown.

As described with reference to FIG. 1, moreover, the concentration sensor 29C and the vacuum pump 30C are connected to the barrel 3. Similarly, the concentration sensor 29E and the vacuum pump 30E are also connected to the lower barrel 3A. Furthermore, a nitrogen gas having a high purity can be supplied at any time from the air supply device 26 shown in FIG. 1 to the barrel 3 and the lower barrel 3A. The concentrations of the absorption substances in the barrel 3 and the lower barrel 3A are managed to be equal or lower than an allowable concentration during the exposure independently of each other through the main control system 25. In the example of the structure, the transmittance of the illumination light for the whole projecting optical system PL can be increased by setting the allowable concentration of the absorption substance in the lower barrel 3A to be lower than the allowable concentration in the barrel 3. In the following description, it is assumed that the projecting optical system PL is accommodated in one barrel 3.

Returning to FIG. 1, description will be given to an example of the whole managing operation for reducing an absorption substance on the optical path of an exposure beam in the projecting exposure apparatus according to the present embodiment.

First of all, the reticle chamber 2 is an important management object in the exposure apparatus using the exposure beam to be absorbed by ordinary air, particularly, a vacuum ultraviolet light. The reason is as follows. It is necessary to fetch an optional reticle from a reticle library provided on the outside of a space (reticle chamber 2) accommodating a reticle R to be an exposure object and managing the concentration of an absorption substance, to move the reticle into the space managing the absorption substance and to provide the reticle on the optical path of the illumination light IL to be the exposure beam. The reticle is varied for each semiconductor element for exposing or each layer for exposing. Therefore, the reticle is exchanged depending on a required step. Consequently, the reticle is exchanged with a high frequency. Accordingly, the reticle chamber 2 not only isolates the reticle R on the optical path from the outside of the space for managing the absorption substance but also efficiently discharges foreign matters (impurities) generated from the movable portion such as the reticle stage 21 or the reticle loader (not shown), and furthermore, functions to suppress an increase in the absorption substance on the optical path on the outside of the reticle chamber 2. It is apparent that the same role can also be applied to the wafer chamber 4.

It is desirable that a space in the reticle library and a delivery space between the reticle library and the reticle chamber should also manage the absorption substance in the same manner as the reticle chamber. Moreover, the inside of a wafer delivery space for delivering a wafer to the wafer chamber may also manage the absorption substance in the same manner as the wafer chamber.

As is apparent from FIG. 1, next, the optical lengths of the illumination light IL in the optical paths (hereinafter referred to as "partial optical paths") in the illuminating system chamber 1, the reticle chamber 2, the barrel 3 and the wafer chamber 4 which accommodate each portion of the projecting exposure apparatus are different from each other, and the illuminating optical system portion 5 in the illuminating system chamber 1 has the greatest optical length and the projecting optical system PL in the barrel 3 has the second greatest optical path. The amount of the absorption substance through which the illumination light IL passes is proportional to the optical path length in the case in which the concentration of the absorption substance is constant. Therefore, the amounts of a reduction in the illuminance are different from each other in the four partial optical paths. For this reason, it is desirable that the optical path having a longer optical path length should have a smaller amount of the absorption substance. Moreover, the illuminating optical system portion 5 having a long optical path and the projecting optical system PL can have a closed structure comparatively easily. Basically, it is possible to prevent the absorption substance from flowing from the outside. Moreover, since the illuminating optical system portion 5 and the projecting optical system PL have few movable portions, the absorption substance can easily be managed at a lower concentration. Accordingly, it is possible to reduce a drop in the illuminance in the illuminating optical system portion 5 and the projecting optical system PL by once reducing the concentration of the absorption substance in the illuminating system chamber 1 and the barrel 3 and maintaining the same state.

Moreover, the optical lengths in the reticle chamber 2 and the wafer chamber 4 are shorter than those of the illuminating optical system 5 and the projecting optical system PL. However, these spaces are such that parts such as a reticle or a wafer are taken from and to the outside at any time during the actuation of the projecting exposure apparatus. At each time, the parts are exposed to the flow of air, an impurity or the like from the outside, and some foreign matters are discharged from the movable portion. Consequently, the concentration of the absorption substance cannot be easily maintained to be low. In the present embodiment, the allowable concentration of the absorption substance in each partial optical path is set such that the allowable absorptivity (allowable absorbance) of the illumination light IL is constant in each partial optical path from the illuminating system chamber 1 to the wafer chamber 4. As a result, the allowable concentration of the absorption substance is set to be higher on the partial paths in the reticle chamber 2 and the wafer chamber 4 than the allowable concentration on other partial optical paths and they contribute to a whole reduction in the illuminance of the illumination light IL almost equivalently. By this method, in addition, the drop in the illuminance can be reduced at a low running cost more actually and the apparatus does not need to be complicated.

There will be described examples of the allowable concentrations of oxygen, carbon dioxide and steam to be absorption substances from the illuminating system chamber 1 to the wafer chamber 4. In this case, the optical path lengths of the partial optical paths in the illuminating system chamber 1, the reticle chamber 2, the barrel 3 of the projecting optical system PL and the wafer chamber 4 are as follows.

Optical path length in the illuminating system chamber 1: 5000 mm
Optical path length in the reticle chamber 2: 200 mm
Optical path length in the barrel 3: 1350 mm
Optical path length in the wafer chamber 4: 10 mm If the allowance absorptivity in the partial optical length is 1%, the allowable concentrations of oxygen ($O_2$), carbon dioxide ($CO_2$) and steam ($H_2O$) in each partial optical path are shown in the following Table 1.

TABLE 1

| | Allowable $O_2$ concentration (ppm) | Allowable $CO_2$ concentration (ppm) | Allowable $H_2O$ concentration (ppm) |
|---|---|---|---|
| Illuminating system chamber 1 | $6.7 \times 10^{-2}$ | 3.3 | $2.3 \times 10^{-1}$ |
| Reticle chamber 2 | 1.7 | $8.2 \times 10^{1}$ | 6.8 |
| Barrel 3 | $2.5 \times 10^{-1}$ | $1.2 \times 10^{1}$ | 1.0 |
| Wafer chamber 4 | $3.4 \times 10^{1}$ | $1.7 \times 10^{3}$ | $1.37 \times 10^{2}$ |

If the allowance absorptivity in the partial optical length is 5%, the allowable concentrations of oxygen ($O_2$), carbon dioxide ($CO_2$) and steam ($H_2O$) in each partial optical path are shown in the following Table 2.

TABLE 2

| | Allowable $O_2$ concentration (ppm) | Allowable $CO_2$ concentration (ppm) | Allowable $H_2O$ concentration (ppm) |
|---|---|---|---|
| Illuminating system chamber 1 | $3.4 \times 10^{-1}$ | $1.7 \times 10^{1}$ | 1.4 |
| Reticle chamber 2 | 8.6 | $4.2 \times 10^{2}$ | $3.5 \times 10^{1}$ |
| Barrel 3 | 1.3 | $6.2 \times 10^{1}$ | 5.1 |
| Wafer chamber 4 | $1.7 \times 10^{2}$ | $8.4 \times 10^{3}$ | $6.9 \times 10^{2}$ |

From the Tables 1 and 2, it is apparent that the allowable concentration of the absorption substance in each of the reticle chamber 2 and the wafer chamber 4 is 10 to 100 times as high as that in each of the illuminating system chamber 1 and the barrel 3. Consequently, the concentration of the absorption substance in each of the reticle chamber 2 and the wafer chamber 4 can be managed easily and the mechanism for the reticle chamber 2 and the wafer chamber 4 do not need to be complicated.

Next, the projecting exposure apparatus according to the present embodiment uses a step and scan method. Therefore, a movable portion for synchronously scanning a reticle and a wafer is provided in the reticle chamber 2 and the wafer chamber 4. As described above, moreover, a contact with the outside air and the mixture of the absorption substance cannot be avoided because of the exchange of the reticle and the wafer. Therefore, it is necessary to operate the vacuum pumps 30B and 30D and the air supply device 26 to discharge the absorption substance until the concentration of the absorption substance in each of the reticle chamber 2 and the wafer chamber 4 is set to be equal to or lower than the allowable concentration after the reticle and the wafer are scanned and exposed or are exchanged. In the meantime, it is apparent that the circuit pattern of the reticle is not exposed.

It is preferable that pressure reduction should be carried out in the space for managing the concentration of the absorption substance (in the illuminating system chamber 1 to the wafer chamber 4) through the vacuum pumps 30A to 30D, respectively. Then, a gas which rarely absorbs the illumination light is supplied from the gas supply device 26 so that the absorption substance can be reduced or eliminated efficiently. In this case, no difference in an air pressure between the inside of each of the illuminating system chamber 1 to the wafer chamber 4 and the outside air can be substantially considered to be made. Therefore, it is not necessary to cause each portion of the exposure apparatus to be a redundant mechanism having an unnecessary strength. In the illuminating system chamber 1 to the wafer chamber 4, the absorption substance may be eliminated to carry out the exposure in an almost vacuum state. In this case, it is necessary to increase the strength of each portion of the exposure apparatus. However, it is possible to maintain the illuminance to be extremely high without depending on the wavelength of the illumination light.

It is not necessary to always carry out the pressure reduction in the illuminating system chamber 1 to the wafer chamber 4 to obtain a high vacuum. More specifically, the degree of vacuum during the pressure reduction depends on the density (amount) of the absorption substance present in the atmosphere and the optical path length in the atmosphere. If the allowable absorptivity of the exposed light to be absorbed by an optical path length of 1 m in the air atmosphere is set to 1%, it is preferable that the pressure reduction should be carried out to approximately $1.2 \times 10^{-3}$ Torr. If the allowable absorptivity of the exposed light to be absorbed by an optical path length of 1 m in the air atmosphere is set to 3%, it is preferable that the pressure reduction should be carried out to approximately $3.8 \times 10^{-3}$ Torr. When a substance having a higher coefficient of absorption is present in the atmosphere, it is sufficient that the pressure reduction is carried out to a higher degree of vacuum. When only a substance having a smaller coefficient of absorption is present in the atmosphere, it is sufficient that the pressure reduction is carried out to a lower degree of vacuum.

Moreover, the inside of each of the illuminating system chamber 1 to the wafer chamber 4 according to the present embodiment is closed. By supplying another gas (hereinafter referred to as a "purging gas") for rarely absorbing the illumination light to the respective spaces through which the exposure beam passes and discharging a mixed gas of the purging gas and the absorption substance without using a vacuum pump, therefore, the concentration (amount) of the absorption substance may be reduced to a predetermined value or less and a reduction in the illumination in each inner portion may be prevented. In this case, for example, purging may be carried out with an inexpensive gas (a nitrogen gas or the like) in a portion having a small optical length (the volume of a space for managing the concentration of the absorption substance including the optical path is small), and the purging may be carried out with a slightly expensive helium gas or the like in a portion having a great optical path length (the volume of a space for managing the concentration of the absorption substance including the optical path is great). For example, consequently, the stability of a temperature control characteristic and an imaging characteristic and the like can be enhanced without greatly raising the running cost.

In the portion having a small optical length, moreover, the nitrogen gas may be supplied to all the partial optical paths. In the portion having a great optical length, the nitrogen gas or the helium gas may be supplied to all the partial optical paths irrespective of the optical path length separately from such a structure that the helium gas is used. Moreover, the helium gas may be supplied to the portion having a small optical path length and the nitrogen gas may be supplied to the portion having a great optical path length. Also in the case in which an expensive gas (the helium gas or the like) is supplied to a portion having a high degree of sealing (airtightness) and an inexpensive gas (the nitrogen gas or the like) is supplied to a portion having a low degree of sealing (in which an absorption substance is easily mixed), the running cost can be reduced.

Next, a preferred second embodiment of the present invention will be described with reference to FIG. 3. While a structure in the present embodiment is basically the same as that of the first embodiment, the present embodiment is different from the first embodiment in that a portion corresponding to the wafer chamber 4 in FIG. 1 is not closed and there is no structure in which a wafer opening portion 7 is isolated from the outside air, that is, the atmosphere in a great chamber accommodating a projecting exposure apparatus. In FIG. 3, portions corresponding to those in FIG. 1 have the same reference numerals and detailed description thereof will be omitted.

FIG. 3 shows the main part of the projecting exposure apparatus according to the present embodiment. In FIG. 3, the upper part of the wafer operating portion 7 is covered with a cover 4A to cover the side surface of a projecting optical system PL. A blast portion 33 and a filter portion 34 are provided in the direction of the side surface of the wafer operation portion 7, and the temperature of a transmission gas (a nitrogen gas, a helium gas or the like, for example) to an illumination light IL is controlled and is supplied from an air supply device which is not shown to the blast portion 33 through a pipe 35. As shown in an arrow 37, the blast portion 33 feeds a gas in a flow corresponding to control information sent from a main control system 25 around the wafer operating portion 7 under the cover 4A through the filter portion 34. A concentration sensor 29D is provided through a pipe to a gas passageway and the concentration of an absorption substance which is measured by the concentration sensor 29D is supplied to the main control system 25. The flow of the gas fed from the blast portion 33 is controlled such that the concentration of the absorption substance which is measured by the concentration sensor 29 is equal to or lower than an allowable concentration.

In the present embodiment, it is desirable that a wafer plane should be coincident with a surface excluding a portion on which a wafer of a wafer holder is to be mounted in order to maintain a direction in which a transmission gas to a surface (wafer plane) of a wafer W to be one direction. When the wafer plane is protruded from the wafer holder, there is a possibility that an air flow in a constant direction might be changed in the peripheral portion of the wafer. Therefore, a dent (a concave portion) in which the wafer is mounted is previously formed in the central portion of the surface of the wafer holder and the wafer is mounted in the dent to cause the wafer plane to be coincident with the surface of the wafer holder.

In the present embodiment, thus, a local gas flow is generated on the optical path of an exposure beam, thereby relieving a reduction in the illuminance on the surface of the wafer W. Accordingly, a work for exchanging a gas by taking in and out the wafer is not required. Consequently, there is an advantage that higher throughput can be obtained. On the other hand, in the present embodiment, it is hard to manage the concentration of the absorption substance by the flow of the outside air with higher precision than that in the first embodiment. In the case in which more importance is attached to the relief of a reduction in the illuminance than an enhancement in the throughput, therefore, it is desirable that the first embodiment should be utilized. It is apparent that the gas flow in FIG. 3 should be obtained by a substance which less absorbs the exposure beam (does not absorb the exposure beam substantially).

It is apparent that a method of relieving the reduction in the illuminance of the exposure beam through the gas flow obtained by a substance having a small absorptivity 25 an also be applied to the reticle chamber 2 (the reticle operating portion 6) easily. Moreover, the same method can also be applied to the illuminating optical system portion 5 and the projecting optical system PL. In that case, however, it is necessary to employ a double structure for these portions.

Next, a preferred third embodiment of the present invention will be described with reference to FIG. 4. In FIG. 4, portions corresponding to those in FIGS. 1 and 2 have the same reference numerals and detailed description thereof will be omitted.

FIG. 4 is a sectional view showing a structure from a projecting optical system PL1 to a wafer stage 23 in a projecting exposure apparatus according to the present embodiment. In FIG. 4, an $F_2$ laser beam to be a vacuum violet light is used as an exposed light IL. A projecting optical system PL1 comprising a catadioptric system according to the present embodiment is also constituted by a first imaging optical system K1 of a refraction type for forming an intermediate image (a primary image) of the pattern of a reticle R and a second imaging optical system K2 of a catadioptric type for forming a final image of the reticle pattern on a wafer W to be a photosensitive substrate with a reduced magnification based on the light transmitted from the intermediate image.

The first imaging optical system K1 is constituted by a first lens group G1 having a positive refractive power, an aperture diaphragm S and a second lens group G2 having a positive refractive power which are sequentially provided from the reticle side. The first lens group G1 is constituted by a meniscus lens L31 having a non-spherical convex turned toward the reticle side, a biconvex lens L32 having a non-spherical convex turned toward the reticle side, a meniscus lens L33 having a non-spherical concave turned toward the wafer side, and a meniscus lens L34 having a non-spherical convex turned toward the reticle side which are sequentially provided from the reticle side. Moreover, the second lens group G2 is constituted by a meniscus lens L41 having a non-spherical convex turned toward the reticle side, a biconvex lens L42 having a non-spherical convex turned toward the wafer side, and a meniscus lens L43 having a non-spherical concave turned toward the wafer side which are sequentially provided from the reticle side. Furthermore, a central shielding member SP for shielding a light in the vicinity of an optical axis AX1 is provided in a position shifted from an aperture diaphragm S by a predetermined space in the direction of the optical axis AX1.

On the other hand, the second imaging optical system K2 is constituted by a main mirror M3 including an opening (a light transmitting portion) 61A in a central portion and a reflection plane R3 having a concave turned toward the wafer side and negative refractive force, a lens component L4, and an auxiliary mirror M4 including a reflection plane R4 having an opening 62A in a central portion. The lens component L4 is a negative meniscus lens having a non-spherical concave turned toward the wafer side. More specifically, all optical elements (G1, G2, M3, L4, M4) constituting the projecting optical system PL1 are provided along a single optical axis AX1. Furthermore, the main mirror M3 is provided in the vicinity of a position where the intermediate image is to be formed and the auxiliary mirror M4 is provided in the proximity of the wafer W. In the present embodiment, an exposed light IL (an imaging luminous flux) transmitted from the pattern of the reticle R forms an intermediate image by the first imagining optical system K1 and the imaging luminous flux transmitted from the intermediate image passes through an opening 61A of the main mirror M3 and is reflected by the reflection plane R4 provided on the upper surface of the auxiliary mirror M4 through the lens component L4, and is then reflected by the reflection plane R3 of the main mirror M4 through the lens component L4 and is incident on the wafer W through a lens component L2 and the opening 62A of the auxiliary mirror M4 again.

In the present embodiment, portions from the first imaging optical system K1 to the lens component L4 of the second imaging optical system K2 are enclosed and supported in a single barrel 3B. More specifically, the lenses L31 to L43, the main mirror M3, the lens component L4 and the auxiliary mirror M4 are held in the barrel 3B through a lens frame respectively and a vent for causing a gas to pass therethrough is formed in the lens frame for the optical member of each of the lens L32 to the main mirror M3, and the lens frame of the lens L31 in the uppermost stage, the lens component L4 in the lowermost stage (tip portion) and lens frame 8B and 8C of the auxiliary mirror M4 are sealed respectively.

Moreover, a pipe communicating with a concentration sensor 29C, a pipe 32C communicating with a vacuum pump 30C and a pipe 27C communicating with a gas supply device 26 are connected to the inside of a space including the main mirror M4 of the barrel 3B. By these members, the inside of the space including the main mirror M4 is filled with a purging gas having a high purity.

Moreover, two air feeding pipes 27Ea and 27Eb are provided opposite to the side surface of the barrel 3B between the lens component 4 and the auxiliary mirror M4 with the optical axis AX1 interposed therebetween, and the air feeding pipes 27Ea and 27Eb are connected to the air feeding device 26 through the pipe 27E. Accordingly, a space between the auxiliary mirror M4 and the lens component L4 is sealed excluding the opening 62A. The opening 62A is used as an opening for causing an imaging luminous flux (an exposed light IL) to be an exposure beam to pass therethrough and an opening for causing a purging gas to pass therethrough.

Furthermore, a plurality of exhaust pipes 32Fa and 32Fb are provided in the vicinity of the side face portion of a space between the auxiliary mirror M4 and the wafer W, and are connected to a vacuum pump 30F through a pipe 32F. In the present embodiment, actually, the exhaust pipes 32Fa and 32Fb are provided at regular angular intervals in eight places, for example. The air feeding pipes 27Ea and 27Eb may not only provide in two places but three or more places at almost regular angular intervals.

Furthermore, the wafer W is adsorbed and held on a mounting surface including a concave portion on a wafer holder 22, the wafer holder 22 is fixed to a concave portion on the wafer stage 23, and a surface 23a of the wafer stage 23 is provided on almost the level with the surface of the wafer W and that of the wafer holder 22. Consequently, a gas can smoothly flow over the surface of the wafer W.

In the present embodiment, the air is continuously sucked through the pipe 32F and the discharge pipes 32Fa and 32Fb through the vacuum pump 30F simultaneously with the operation for consecutively supplying a purging gas having a high purity from the gas supply device 26 toward the central part between the lens component L4 and the auxiliary mirror M4 in the projecting optical system PL1 through the air feeding pipes 27Ea and 27Eb during exposure. A portion between the lens component L4 and the auxiliary mirror M4 is filled with the purging gas having a high purity and is further pressurized. Consequently, the purging gas having a high purity flows toward the wafer W as shown in an arrow 67 and the absorption substance is caused to flow to an outer peripheral portion together with the purging gas.

In this case, the purging gas having a high purity introduced from the air feeding pipe 27Ea and 27Eb into the space between the lens component L4 and the auxiliary mirror M4 flows in the space toward the center of the opening 62A to be a center of a visual field and then flows in the opening 62A toward the wafer side (in the same direction as the direction of progress of the exposed light IL). The flow of the purging gas in the opening 62A will be referred to as a "down flow". The down-flow purging gas flows to the space between the auxiliary mirror M4 and the wafer W and then flows from the exposing portion (central portion) toward the outside as shown in the arrow 67.

In the process of the flow of the purging gas, the down flow of the purging gas is generated in an opposite direction to a direction of normal diffusion (toward the projecting optical system PL1) of degassing containing an absorption substance generated from the wafer W, particularly, degassing from a photoresist coated on the wafer W. As a result, the degassing from the wafer W is almost prevented from reversely flowing to an upper space of the auxiliary mirror M4 and flows from the center of the visual field to a peripheral portion to be drawn into the down flow of the purging gas. The gas generated from the wafer W, particularly, a purging gas containing the gas sent from the photoresist coated on the wafer W will be referred to as "a gas containing an absorption substance".

In the present embodiment, thus, it is possible to prevent a transmittance from being reduced due to the adhesion of the gas fed from the wafer W to the optical member on the tip of the projecting optical system PL1 by the down flow of the gas containing an absorption substance. Moreover, the absorption substance contained in the degassing is exhausted so that the evenness of the exposed light IL (imaging luminous flux) can be maintained, the imaging characteristic of the projecting optical system PL1 can be enhanced, and furthermore, the uniformity of the line width of a circuit pattern formed on the wafer W can be increased. In addition, a sufficient amount of the light can be caused to reach the exposing plane of the wafer W and the throughput of the exposing step can be enhanced.

In the present embodiment, furthermore, the bottom surface of the optical member (the auxiliary mirror M4) on the tip of the projecting optical system PL and the bottom surface of the lens frame 8C are flat and are positioned on the same plane. In the lower part, moreover, the upper surface 23a of the wafer stage 23, the upper surface of the wafer holder 22 and the exposed plane of the wafer W are positioned on almost the same level with the bottom surface of the auxiliary mirror M4 in parallel therewith. Accordingly, the purging gas can flow in the upper and lower spaces of the auxiliary mirror M4 (the lens frame 8C) very smoothly and the absorption substance can be efficiently discharged toward the outer peripheral portion side.

Moreover, it is desirable that a discharge ratio of a gas (the volume of a gas to be sucked per unit time) in the exhaust pipes 32Fa and 32Fb should be set to be higher than a supply ratio of a gas (the volume of the gas blown out per unit time) in the air feeding pipes 27Ea and 27Eb for the purging gas. Consequently, the atmosphere in the vicinity of the wafer stage 23 (dry air in the present embodiment) is sucked in addition to the gas containing the absorption substance. The flow in the atmosphere is usually turned from the wafer stage 23 in the direction of the exposed region (the central portion of the down flow of the purging gas having a high purity). Consequently, the gas containing an impurity is prevented from flowing from the upper part of the wafer stage 23 to an external space. Consequently, it is possible to reduce a change in a refractive index in the atmosphere in the outer peripheral portion of the wafer stage 23 as much as possible. Consequently, a fluctuation in the optical path for a laser beam of a laser interferometer for measuring the position of the wafer stage 23 is reduced and the positional precision of the wafer stage 23 can be enhanced. Moreover, the measuring precision of the focus position of an autofocus sensor can also be enhanced.

By implementing the flow of the purging gas having a high purity over the wafer stage 23 without disturbing the external atmosphere as in the present embodiment, it is possible to efficiently supply a purging gas having a high purity preponderantly around the exposing portion on the wafer. At the same time, it is possible to more lessen a detection error made by the interferometer or autofocus sensor for positioning the wafer stage 23 through a fluctuation in a refraction index through the mixture of the purging gas having a high purity and the atmosphere around the wafer stage 23.

In the present embodiment, moreover, also in the case in which a space d2 of a working distance portion between the optical member (the auxiliary mirror M4) on the tip of the projecting optical system PL1 and the wafer W is small, the purging gas having a high purity can be supplied in the form of the down flow toward the wafer W.

In each of the embodiments, moreover, a laser interferometer for measuring the position of the reticle stage 21 is provided in the reticle chamber 2 and a laser interferometer for measuring the position of the wafer stage 23 is also provided in the wafer chamber 4 in FIG. 1 or the wafer operating portion 7 in FIG. 3. In this case, it is desirable that the optical path of the laser beam for measurement of the laser interferometer should be covered with a cylinder such as a pipe in order to prevent a fluctuation in the laser beam.

Moreover, it is desirable that a housing (a cylindrical member or the like) constituting portions from the illuminating system chamber 1 to the wafer chamber 4 and a pipe for supplying a nitrogen gas, a helium gas or the like should be formed of a material having a small amount of impurity gasses (degassing), for example, various polymers such as stainless steel, ethylene tetrafluoride, tetrafluoroethylene-terfluoro (alkylvinyl ether) or a tetrafluoroethylene-hexafluoropropene copolymer.

In the absorption substance, attention should be paid to steam, hydrocarbon, halides and the like. It has been known that a large number of substances such as steam are stuck in a large amount onto the surfaces of the housing and the pipe gradually leak into a space in which substitution is carried out by the purging gas, that is, a space including the optical path of an illumination light (hereinafter referred to as an "optical path space") during vacuum exhaust or by the action on the purging gas. Moreover, the absorption substance such as hydrocarbon or a halide is discharged from a material for covering a cable for feeding a power to a driving mechanism (a reticle blind, a stage or the like) present in the optical path space or the like, a sealing material (an O ring or the like), an adhesive or the like. For this reason, after the substitution is once carried out by the purging gas, the concentration of the absorption substance is always monitored. If the concentration of the absorption substance is more than an allowable value, it is preferable that a working for exposing the circuit pattern should be once stopped and the substitution should be carried out by the purging gas again.

More specifically, the concentration (amount) of the absorption substance in each space is always monitored by means of each concentration sensor. When the result of the measurement of at least one concentration sensor is equal to or greater than an allowable value or it is anticipated that the concentration becomes equal to or greater than the allowable value through a main control system 25 based on the result of the measurement of the concentration sensor, the exposing work is automatically stopped. Then, a work for reducing the absorption substance is carried out. When the concentration of the absorption substance is reduced to the allowable value or less, the exposing work is restarted. For this purpose, it is preferable that a concentration managing system should be provided.

Furthermore, it is preferable that a material for covering a cable for supplying a power to a driving mechanism (a reticle blind, a stage or the like) in each housing, a sealing member (an O ring or the like), an adhesive or the like should not be provided in the optical path space if possible or the cable for supplying the power to the driving mechanism in the housing or the like should also be coated with a material having a small amount of impurity gases (degassing), thereby controlling the amount of the absorption substance to be generated.

Furthermore, it has been known that the amount of adsorption of a gas such as steam which is discharged from the surface of the housing or the pipe is greatly varied depending on the state of the material of the housing or the pipe. For this reason, it is desirable that the amount of adsorption of the steam or the like should be reduced as much as possible. For example, if the surface area of a structural material is larger, the number of molecules of the absorption substance to be adsorbed is increased. Therefore, the optical path space is preferably designed so as not to have a fine structure such that the surface area is reduced.

For the same reason, moreover, it is preferable that polishing such as mechanical polishing, electrolytic polishing, buff polishing, chemical polishing or GBB (Glass Bead Blasting) should be carried out to reduce the surface roughness of the housing or the pipe. In this case, it is preferable that the surface roughness represented by a center line mean roughness (Ra) should be 0.2 μm or less.

Moreover, it is preferable that pure titanium, Ti-6Al-4V, SUS-304, 403, 410 and C3604 should be used as a material for forming a tube member (including a barrel).

Furthermore, it is desirable that a fluororesin coat, NiP, NiP-Ni and BCr should be used as a surface finishing material of the tube member (including a barrel).

Preferably, these treatments are carried out, and furthermore, the surfaces of the housing and the pipe are cleaned through ultrasonic cleaning, spraying of a fluid such as dry air, vacuum-heating degassing (baking) or the like before the exposure of the circuit pattern and the substitution using the purging gas, thereby reducing the amount of degassing from the surfaces of the housing and the pipe. It is apparent that the effects of the present invention can be further obtained from these contrivances.

While a gas rarely absorbing the exposure beam is supplied to the illuminating system chamber 1 to the wafer chamber 4 (or the lower portion of the cover 4A) in the present embodiment, their partial optical paths may be used in a pressure reducing stage. Consequently, even if the exposure beam has a shorter wavelength, a high illuminance can be obtained on the wafer.

Although the illuminating optical system 5 is accommodated in one illuminating system chamber 1 in the present embodiment, the inside of the illuminating system chamber 1 may be divided into a plurality of partial optical paths and an optical element constituting the illuminating optical system 5 may be provided in the partial optical path. In this case, it is desirable that the absorption substance or the concentration of the purging gas should be managed for each partial optical path.

It is apparent that the present invention can be applied to a projecting exposure apparatus of a full field exposure type (stepper type) and an exposure apparatus using a proximity method as well as a projecting exposure apparatus of a scanning and exposing type.

Moreover, the present invention can also be applied to the case in which an extreme ultraviolet light (EUV light) having a wavelength of approximately 100 nm or less such as soft X-rays is used as an exposure beam, and similarly, to an electron beam transfer apparatus using an electron beam as the exposure beam. In the case in which the EUV light or the electron beam is to be used, the optical path of the exposure beam is to be vacuum. Almost all materials in the outside air become the absorption substances, and the mechanism of the whole apparatus can be simplified by managing the concentrations of the absorption substances every partial optical path of the exposure beam.

Moreover, the projecting exposure apparatus according to the embodiments adjusts the illuminating optical system and the projecting optical system and couples and incorporates each component electrically, mechanically or optically. In this case, it is desirable that the work should be carried out in a clean room in which a temperature is managed. The wafer W thus exposed as described above is subjected to a developing step, a pattern forming step, a bonding step and the like so that a device such as a semiconductor device can be manufactured.

The present invention is not limited to the above-mentioned embodiments, and the invention may, as a matter of course, be embodied in various forms without departing from the gist of the present invention. Furthermore, the entire disclose of Japanese Patent Application 11-34897 filed on Feb. 12, 1999 including description, claims, drawings and abstract are incorporated herein by reference in its entirety.

INDUSTRIAL APPLICABILITY

According to the first, third or fourth exposure method of the present invention, it is possible to increase the illuminance of the exposure beam on the substrate to be a transfer object.

According to the second exposure method, moreover, in the case in which an exposure beam capable of being easily absorbed by various materials such as a vacuum ultraviolet light is to be used, it is possible to increase the illuminance of the exposure beam on the substrate to be the transfer object without complicating the mechanism of the whole apparatus or greatly increasing the running cost.

According to the present invention, the absorption substance can be relieved or eliminated such that the concentration is equal to or lower than an allowable concentration set for each portion and a reduction in the illuminance for each portion can be managed. Consequently, a circuit pattern can be stuck more reliably, and furthermore, the throughput of the process for manufacturing an electronic device or the like can be enhanced. By independently managing the concentration (amount) of the absorption substance in each portion, moreover, each portion can be designed more easily, the manufacturing cost of the apparatus can be reduced and the maintenance property of each portion can be enhanced.

Furthermore, according to the exposure apparatus according to the present invention, the exposure method according to the present invention can be carried out, and according to the device manufacturing method according to the present invention, there is an advantage of capable of mass-producing various devices with high throughput.

The invention claimed is:

1. An exposure method which transfers a predetermined pattern onto a substrate by using an exposure beam from an exposure light source, comprising:

dividing an optical path of the exposure beam from the exposure light source to the substrate into a plurality of partial optical paths having lengths different from one another;

respectively setting allowable concentrations of absorption substance, which absorbs the exposure beam, in the plurality of partial optical paths depending on a length of each of the partial optical paths; and managing concentrations of the absorption substance in the plurality of the partial optical paths independently of each other in order for the concentrations of the absorption substance in the plurality of the partial optical paths to be respectively equal to or lower than the set allowable concentrations of the absorption substance in the plurality of the partial optical paths.

2. An exposure method as recited in claim 1, wherein a gas which is transparent with respect to the exposure beam is supplied to at least a part of the plurality of the partial optical paths for the exposure beam.

3. An exposure method as recited in claim 1, wherein the exposure beam is a light in a vacuum ultraviolet region, and the absorption substance is oxygen, water or carbon dioxide.

4. A method of manufacturing a device, comprising transferring a predetermined pattern onto the substrate in a state that an illuminance of an exposure beam is managed on the substrate by using the exposure method as recited in claim 1.

5. An exposure method as recited in claim 1, wherein the set allowable concentrations of the absorption substance are different from each other for every partial optical path.

6. An exposure method as recited in claim 5, wherein when the concentration of the absorption substance in at least one of the plurality of the partial optical paths is equal to or more than the set allowable concentration thereof, the transfer operation is stopped.

7. An exposure method as recited in claim 1, wherein gases which are transparent with respect to the exposure beam are respectively supplied to the plurality of the partial optical paths, and kinds of the gases are different from one another depending on lengths of the partial optical paths.

8. An exposure method as recited in claim 7, wherein a helium gas is supplied to a space of the partial optical path having a long length and a nitrogen gas is supplied to a space of the partial optical path having a short length.

9. An exposure method as recited in claim 1, wherein the optical path of the exposure beam includes an optical path of an illuminating system which illuminates a mask on which the predetermined pattern is formed, an optical path of a projecting optical system which transfers the predetermined pattern onto the substrate, an optical path between the illuminating system and the projecting optical system and an optical path between the projecting optical system and the substrate.

10. An exposure method as recited in claim 9, wherein the optical path between the illuminating system and the projecting optical system is shorter than the optical path of the illuminating system.

11. An exposure method as recited in claim 10, wherein outside air flows into the optical path between the illuminating system and the projecting optical system more easily than the optical path of the illuminating system.

12. An exposure method as recited in claim 9, wherein the optical path between the projecting optical system and the substrate is shorter than the optical path of the projecting optical system.

13. An exposure method as recited in claim 12, wherein outside air flows into the optical path between the projecting optical system and the substrate more easily than the optical path of the projecting optical system.

14. An exposure method as recited in claim 1, wherein the allowable concentrations of the absorption substance is set in order for allowable absorptances of the exposure beam in the plurality of the partial optical paths to be constant.

15. An exposure method as recited in claim 1, wherein a gas which is transparent with respect to the exposure beam is supplied to each of the plurality of the partial optical paths, and the concentrations of the absorption substance are managed by exhausting the absorption substance outside the partial optical paths together with the transparent gas.

16. An exposure method which irradiates an exposure beam from an exposure light source onto a mask through an illumination system and transfers a patter of the mask onto a substrate through a projecting optical system, comprising:
dividing an optical path of the exposure beam from the exposure light source to the substrate into a plurality of partial optical paths including an illumination system portion in the illumination system, a mask operating portion provided around the mask, a projecting optical system portion including at least a part of the projecting optical system and a substrate operating portion including an upper portion of the substrate;
respectively setting allowable concentrations of absorption substance, which absorbs the exposure beam, in the plurality of the partial optical paths depending on a length of each of the partial optical paths; and
managing concentrations of the absorption substance in the plurality of the partial optical paths independently of each other in order for the concentrations of the absorption substance in the plurality of the partial optical paths to be respectively equal to or lower than the set allowable concentrations of the absorption substance in the plurality of the partial optical paths.

17. An exposure method as recited in claim 16, wherein there is provided a delivery space which delivers the mask from a mask library to the mask operating portion, and in the delivery space, a concentration of the absorption substance is managed independently of the concentrations of the absorption substance of the partial optical paths including the mask operating portion.

18. An exposure method as recited in claim 17, wherein in the space of the mask library, a concentration of the absorption substance is managed independently from that of the delivery space.

19. An exposure method as recited in claim 16, wherein a gas which is transparent with respect to the exposure beam is supplied from the projecting optical system side to between the projecting optical system and the substrate, and the gas is discharged from the substrate side.

20. An exposure method as recited in claim 19, wherein a ratio of the supply of the gas is smaller than that of discharge of the gas.

21. An exposure method which transfers a predetermined pattern onto a substrate by using an exposure beam from an exposure light source, comprising:
dividing an optical path of the exposure beam from the exposure light source to the substrate into a plurality of partial optical paths having lengths different from one another;
respectively setting allowable absorptances of the exposure beam depending on a length of each of the partial optical paths; and
managing concentrations of an absorption substance, which absorbs the exposure beam, in the plurality of the partial optical paths independently of each other in order for absorbance of the exposure beam in the plurality of the partial optical paths to be the set allowable absorptances of the exposure beam in the plurality of the partial optical paths.

22. An exposure method which transfers a predetermined pattern onto a substrate by using an exposure beam from an exposure light source, comprising:
dividing an optical path of the exposure beam from the exposure light source to the substrate into a plurality of partial optical paths, said plurality of partial optical paths respectively including absorption substance therein, which absorbs the exposure beam;
respectively supplying a gas which is transparent with respect to the exposure beam to each of the plurality of the partial optical paths;
respectively setting concentrations of the gas in the plurality of the partial optical paths depending on a length of each of the partial optical paths; and
managing concentrations of the absorption substance in the plurality of the partial optical paths independently of each other in order for concentrations of the gas in the plurality of the partial optical paths to be set concentrations of the gas in the plurality of the partial optical paths.

23. An exposure method as recited in claim 22, wherein the optical path of the exposure beam includes an optical path of an illuminating system which illuminates a mask on which the predetermined pattern is formed, an optical path of a projecting optical system which transfers the predetermined pattern onto the substrate, an optical path between the illuminating system and the projecting optical system and an optical path between the projecting optical system and the substrate.

24. An exposure method as recited in claim 23, wherein the optical path between the illuminating system and the projecting optical system is shorter than the optical path of the illuminating system.

25. An exposure method as recited in claim 24, wherein outside air flows into the optical path between the illuminating system and the projecting optical system more easily than the optical path of the illuminating system.

26. An exposure method as recited in claim 23, wherein the optical path between the projecting optical system and the substrate is shorter than the optical path of the projecting optical system.

27. An exposure method as recited in claim 26, wherein outside air flows into the optical path between the projecting optical system and the substrate more easily than the optical path of the projecting optical system.

28. An exposure method as recited in claim 22, wherein the concentrations of the absorption substance are managed by exhausting the absorption substance outside the partial optical paths together with the transparent gas.

29. An exposure apparatus which transfers a predetermined pattern onto a substrate by using an exposure beam from an exposure light source, comprising:
a plurality of chambers which divide an optical path of the exposure beam from the exposure light source to the substrate into a plurality of partial optical paths having lengths different from one another and which covers the plurality of the partial optical paths to substantially isolate the plurality of the partial optical paths from outside air, respectively; and
a controller which is connected to the plurality of chambers and which manages concentrations of an absorption substance, which absorbs the exposure beam, in the plurality of the chambers independently of each other in order for concentrations of the absorption substance in the plurality of the partial optical paths to be respectively equal to or lower than set allowable concentrations of the absorption substance in the plurality of the partial optical paths.

30. An exposure apparatus as recited in claim 29, further comprising:
concentration sensors which are disposed in the plurality of the chambers and which measure the concentrations of the absorption substance in the plurality of the chambers; and
an eliminator which is connected to the controller and which eliminates the absorption substance in the plurality of the chambers according to the result of measurement of the concentration sensors.

31. An exposure apparatus as recited in claim 30, wherein the controller stops the transfer operation when the concentration of the absorption substance in at least one of the plurality of the chambers is equal to or higher than a predetermined allowable concentration.

32. An exposure apparatus as recited in claim 29, wherein:
the predetermined pattern is a pattern formed on a mask;
the pattern of the mask is transferred onto the substrate through a projecting optical system; and
the plurality of the chambers include a first chamber which covers an illuminating system portion in an illuminating system for the exposure beam, a second chamber which covers a mask operating portion around the mask, a third chamber which covers a projecting optical system portion including at least a part of the projecting optical system, and a fourth chamber which covers a substrate operating portion including an upper portion of the substrate.

33. An exposure apparatus as recited in claim 29, further comprising a supply device which is connected to the plurality of the chambers and which respectively supplies gases which are transparent with respect to the exposure beam to the plurality of the partial optical paths.

34. An exposure apparatus as recited in claim 29, further comprising a mask library which accommodates a mask, wherein the controller manages a concentration of an absorption substance in a delivery space between the mask library and the second chamber.

35. An exposure apparatus as recited in claim 34, wherein the controller manages a concentration of an absorption substance in a space of the mask library.

36. An exposure apparatus as recited in claim 29, wherein the controller sets allowable concentrations of the absorption substance in order for allowable absorptances of the exposure beam in the plurality of the partial optical paths to be constant.

37. An exposure apparatus which transfers a predetermined pattern onto a substrate by using an exposure beam from an exposure light source, comprising:
a plurality of chambers which divide an optical path of the exposure beam from the exposure light source to the substrate into a plurality of partial optical paths having lengths different from one another and which cover the plurality of partial optical paths to substantially isolate the plurality of the partial optical paths from outside air, respectively;
a supply device which is connected to the plurality of the chambers and which supplies a gas which is transparent with respect to the exposure beam to each of the plurality of the chambers; and
a controller which is connected to the plurality of the chambers and which managed concentrations of absorption substance, which absorbs the exposure beam, in the plurality of the chambers independently of each other in order for concentrations of the gas in the plurality of the partial optical paths to be concentrations of the gas in the plurality of the partial optical paths which have set depending on a length of each of the partial optical paths.

38. An exposure apparatus as recited in claim 37, further comprising:
concentration sensors which are disposed in the plurality of chambers and which measure the concentrations of the absorption substance in the chambers, and
an eliminator which is connected to the controller and which eliminates the absorption substance in the plurality of the chambers according to the measurement result of the concentration sensors.

39. An exposure apparatus as recited in claim 37, wherein:
the predetermined pattern is a pattern formed on a mask;
a pattern of the mask is transferred onto the substrate through a projecting optical system; and
the plurality of the chambers include a first chamber which covers an illuminating system portion in an illuminating system for the exposure beam, a second chamber which covers a mask operating portion around the mask, a third chamber which covers a projecting optical system portion including at least a part of the projecting optical system, and a fourth chamber which covers a substrate operating portion including an upper portion of the substrate.

40. An exposure apparatus as recited in claim 37, wherein the controller stops the transfer operation when the concentrations of the absorption substance included in the transparent gas becomes equal to or larger than a predetermined value in at least one chamber of the polarity of the chambers.

41. An exposure method, comprising transferring a predetermined pattern onto a substrate by using an exposure beam from an exposure light source, wherein:

an optical path of the exposure beam from the exposure light source to the substrate is divided into a plurality of partial optical paths having lengths different from one another;

allowable concentrations of absorption substance, which absorbs the exposure beam, in the plurality of the partial optical paths are respectively set depending on a length of each of the partial optical paths; and concentrations of the absorption substance in the plurality of the partial optical paths are managed independently of each other, in order for the concentrations of the absorption substance in the plurality of the partial optical paths to be respectively equal to or lower than the set allowable concentrations of the absorption substance in the plurality of the partial optical paths.

42. An exposure method, comprising irradiating an exposure beam from an exposure light source onto a mask through an illumination system so as to transfer a pattern of the mask onto a substrate through a projecting optical system, wherein:

an optical path of the exposure beam from the exposure light source to the substrate is divided into a plurality of partial optical paths including an illumination system portion in the illumination system, a mask operating portion provided around the mask, a projecting optical system portion including at least a part of the projecting optical system and a substrate operating portion including an upper portion of the substrate;

allowable concentrations of absorption substance, which absorbs the exposure beam, in the plurality of the partial optical paths are respectively set depending on a length of each of the partial optical paths; and concentrations of the absorption substance in the plurality of the partial optical paths are managed independently of each other in order for the concentrations of the absorption substance in the plurality of the partial optical paths to be respectively equal to or lower than the set allowable concentrations of the absorption substance in the plurality of the partial optical paths.

43. An exposure method, comprising transferring a predetermined pattern onto a substrate by using an exposure beam from an exposure light source, wherein:

an optical path of the exposure beam from the exposure light source to the substrate is divided into a plurality of partial optical paths having lengths different from one another;

allowable absorptances of the exposure beam are respectively set depending on a length of each of the partial optical paths; and concentrations of an absorption substance, which absorbs the exposure beam, in the plurality of the partial optical paths are managed independently of each other in order for absorptances of the exposure beam in the plurality of the partial optical paths to be the set allowable absorptances of the exposure beam in the plurality of the partial optical paths.

44. An exposure method, comprising transferring a predetermined pattern onto a substrate by using an exposure beam from an exposure light source, wherein:

an optical path of the exposure beam from the exposure light source to the substrate is divided into a plurality of partial optical paths, said plurality of partial optical paths respectively including absorption substance therein, which absorbs the exposure beam;

a gas which is transparent with respect to the exposure beam is supplied to each of the plurality of the partial optical paths;

concentrations of the gas in the plurality of the partial optical paths are respectively set depending on a length of each of the partial optical paths; and concentrations of the absorption substance in the plurality of the partial optical paths are managed independently of each other in order for concentrations of the gas in the plurality of the partial optical paths to be the set concentrations of the gas in the plurality of the partial optical paths.

* * * * *